United States Patent [19]
Dosaka et al.

[11] Patent Number: 5,680,363
[45] Date of Patent: Oct. 21, 1997

[54] SEMICONDUCTOR MEMORY CAPABLE OF TRANSFERRING DATA AT A HIGH SPEED BETWEEN AN SRAM AND A DRAM ARRAY

[75] Inventors: Katsumi Dosaka; Masaki Kumanoya, both of Hyogo, Japan

[73] Assignee: Mitsubishi Denki Kabushiki Kaisha, Tokyo, Japan

[21] Appl. No.: 632,279

[22] Filed: Apr. 15, 1996

Related U.S. Application Data

[63] Continuation of Ser. No. 121,490, Sep. 16, 1993, abandoned.

[30] Foreign Application Priority Data

Sep. 17, 1992 [JP] Japan ................................. 4-247535

[51] Int. Cl.$^6$ ...................................................... G11C 7/00
[52] U.S. Cl. .................. 365/230.03; 365/49; 365/230.05
[58] Field of Search ........................ 365/230.03, 230.05, 365/230.01, 189.04, 49, 189.07

[56] References Cited

U.S. PATENT DOCUMENTS 5,014,195  5/1991  Farrell ..................... 365/230.01
5,226,009  7/1993  Arimoto ................... 365/189.04
5,226,147  7/1993  Fujishima ................. 365/230.03
5,343,437  8/1994  Johnson ................... 365/230.03
5,353,427  10/1994 Fujishima ................. 365/230.03

FOREIGN PATENT DOCUMENTS 62-38590   2/1987  Japan .
1-146187   6/1989  Japan .
2-87392    3/1990  Japan .

*Primary Examiner*—David C. Nelms
*Assistant Examiner*—Son Mai
*Attorney, Agent, or Firm*—Lowe, Price, LeBlanc & Becker

[57] ABSTRACT

In an operation of transferring data between a DRAM array and an SRAM array through a bidirectional transfer gate circuit, data blocks on a selected one in the DRAM array are sequentially selected in a high speed mode, word lines are sequentially selected in the SRAM array, so that data is transferred in a time division multiplexing manner between the DRAM array and the SRAM array in units of data block. A cache block size in a semiconductor memory device containing a cache can be externally changed depending on the application with the internal configuration maintained unchangedly.

18 Claims, 28 Drawing Sheets

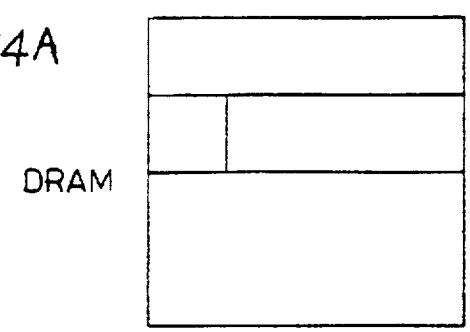
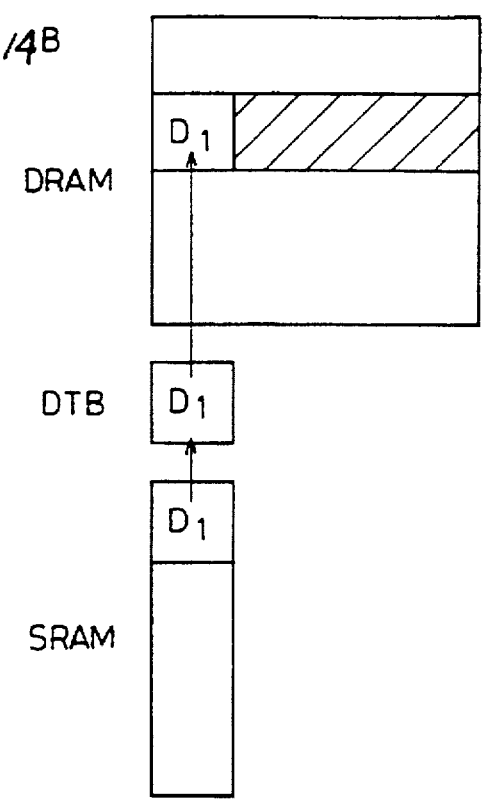
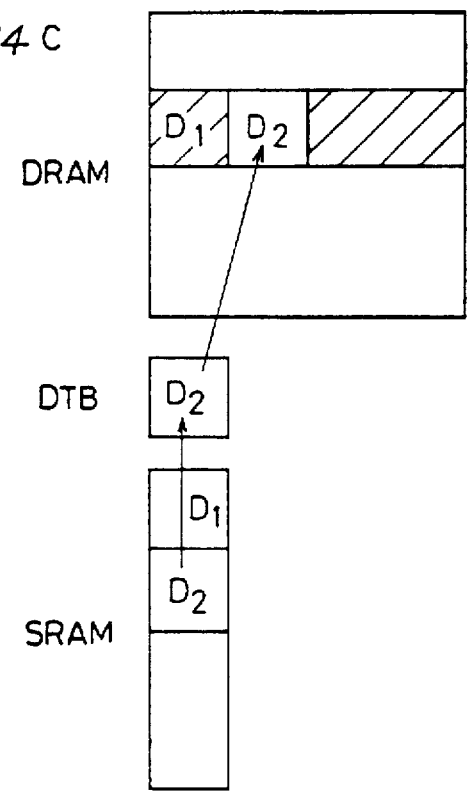
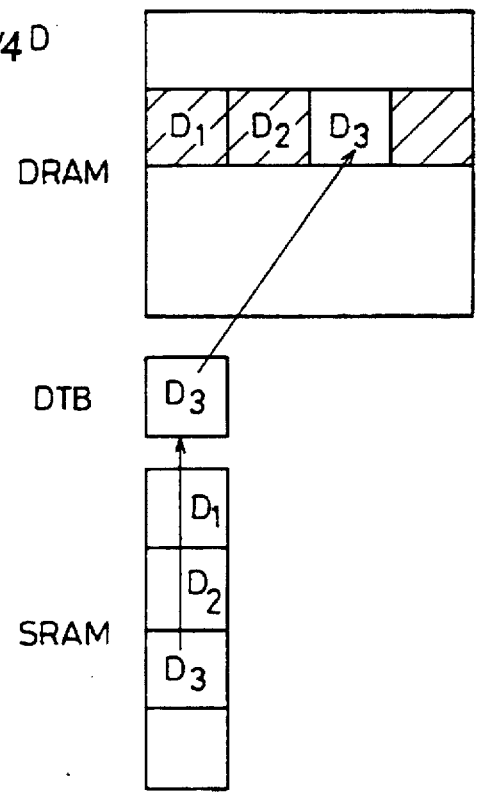

FIG. 18

| OPERATION MODE | E# | CH# | CI# | CR# | W# | REF# |
|---|---|---|---|---|---|---|
| STANDBY | H | X | X | X | X | H |
| ARRAY REFRESH | H | X | X | X | X | L |
| CPU←CACHE | L | L | H | H | H | H |
| CPU←CACHE | L | L | H | H | L | H |
| CPU←CACHE & ARRAY REFRESH | L | L | H | H | H | L |
| CPU→CACHE & ARRAY REFRESH | L | L | H | H | L | L |
| CPU←ARRAY | L | X | L | H | H | H |
| CPU→ARRAY | L | X | L | H | L | H |
| CACHE←ARRAY I | L | H | H | H | H | H |
| CACHE→ARRAY I | L | H | H | H | L | H |
| CACHE←ARRAY II | L | H | L | L | H | H |
| CACHE→ARRAY II | L | H | L | L | L | H |
| CPU↔COMMAND REGISTER | L | H | H | L | H/L | H |
| CPU↔COMMAND REGISTER & ARRAY REFRESH | L | H | H | L | H/L | L |

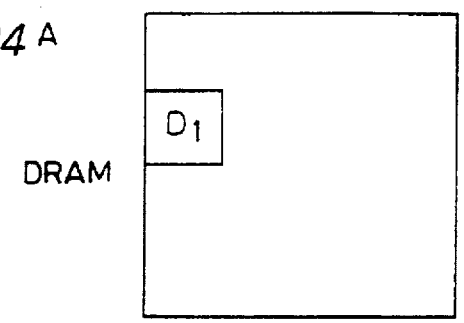
Fig. 24 A
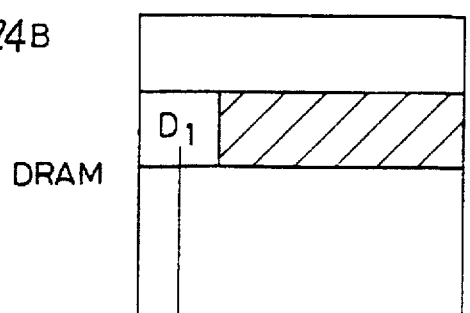
Fig. 24 B
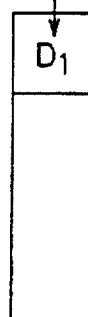
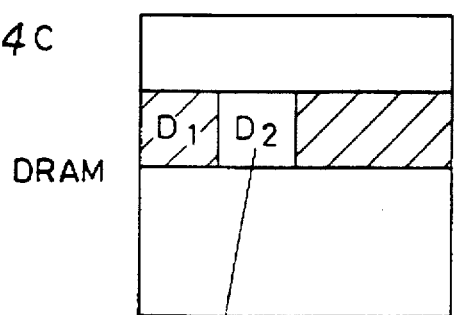
Fig. 24 C
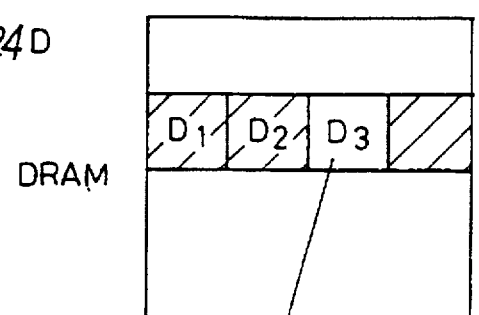
Fig. 24 D
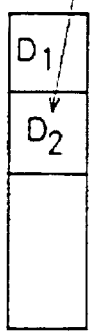
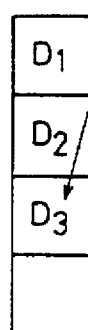

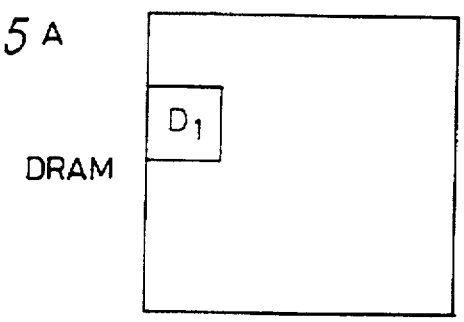
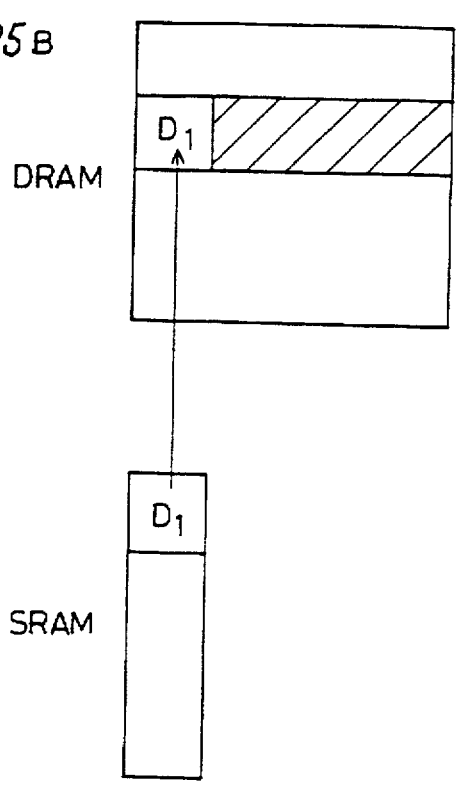
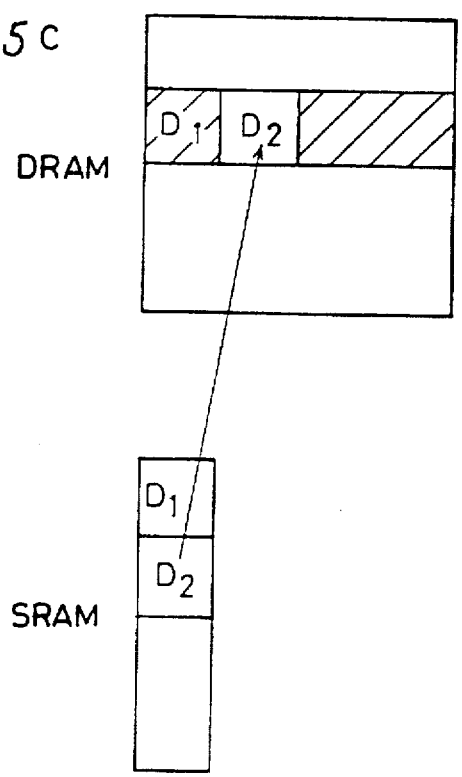
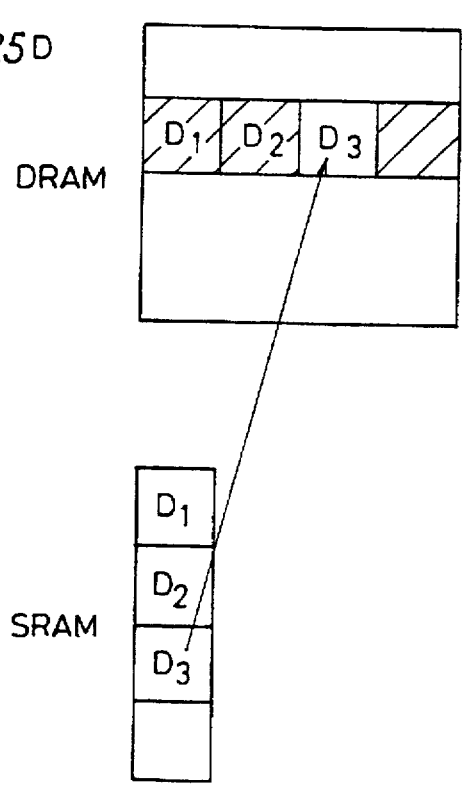

SEMICONDUCTOR MEMORY CAPABLE OF TRANSFERRING DATA AT A HIGH SPEED BETWEEN AN SRAM AND A DRAM ARRAY

This application is a continuation of application Ser. No. 08/121,490 filed Sep. 16, 1993 now abandoned.

BACKGROUND OF THE INVENTION

1. Field of the Invention

The present invention relates to a semiconductor memory device, and in particular, to a semiconductor memory device including different types of memories integrated therein. More particularly, the present invention relates to a semiconductor memory device including a memory allowing high speed access and a memory of a large storage capacity, and more specifically, relates to a structure for transferring data between the high speed memory and the large capacity memory.

2. Description of the Related Art

An operation clock frequency of current 16-bit or 32-bit micro processing units (MPUs) has been significantly increased to a value of 25 MHz or more. In data processing systems, standard DRAMs (dynamic random access memories) have been used as main memories of a large storage capacity because of their low cost per bit. Although the standard DRAMs have been improved to reduce an access time, the operating speed of MPUs has been increased to an extent exceeding that of the standard DRAM. Therefore, a certain disadvantage such as increase of a wait state is inevitable in the data processing systems which use the standard DRAMs as main memories. The gap between the operation speeds of the MPU and standard DRAM is an essential problem caused by the following features of the standard DRAM.

(1) A row address signal and a column address signal are multiplexed in a time division manner and are applied to common address pin terminals. The row address signal is taken into a device at a falling edge of a row address strobe signal /RAS. The column address signal is taken into a device at a falling edge of a column address strobe signal /CAS. The row address strobe signal /RAS prescribes start of a memory cycle and activates row selecting circuitry. The column address strobe signal /CAS activates column selecting circuitry. A predetermined time period which is referred to as a "RAS-CAS delay time (tRCD)" is required from the activation of signal /RAS to the activation of signal /CAS. Therefore, the access time can be reduced only to a certain extent due to limitation by the address multiplexing.

(2) In the case where the row address strobe signal /RAS is once raised to set DRAM at a standby state, this row address strobe signal /RAS can be lowered to "L" only after elapsing of a time period referred to as an RAS precharge time (tRP). The RAS precharge time tRP is required for ensuring the precharge of various signal lines of DRAM to predetermined potentials. Due to this RAS precharge time tRP, the cycle time of DRAM cannot be reduced sufficiently. Further, reduction of the cycle time of DRAM increases the number of times of charge/discharge of signal lines, resulting in increase of power consumption.

(3) The operation speed of DRAM can be increased by improvement of the circuit and process technologies, e.g., high integration of circuits and improvement of a layout as well as by contrivance and improvement concerning application, e.g., improvement of a drive scheme. The speed of MPU, however, has been increased to an extent higher than that of DRAM. The semiconductor memories can be hierarchically classified in view of the operation speed into high speed bipolar RAMs such as ECLRAMs (emitter coupled RAMs) and static RAMs using bipolar transistors, and DRAMs of a relatively low speed using MOS transistors (insulated gate field effect transistors). It is very difficult to expect a speed (cycle time) of several tens nanoseconds in a standard DRAM formed of MOS transistors.

In order to compensate for the speed gap (difference of operation speed) between the MPU and standard DRAM, various improvements have been performed from the view point of the application. Main improvements are as follows:

(1) To use a high speed mode of DRAM and interleaving method.

(2) To provide an external high speed cache memory (SRAM).

In the above expediency (1), the high speed mode such as a static column mode or a page mode is employed, or the high speed operation mode and the interleaving method are combined. In the static column mode, after a word line (one row) is selected, only column addresses are sequentially changed so that the memory cells in this one row are sequentially accessed. In the page mode, after a word line is selected, the signal /CAS is toggled and the column address signal is sequentially taken in for sequentially accessing memory cells connected to the selected word line. In either mode, the memory cells can be accessed without toggling the signal /RAS, and the access speed can be higher than a normal access using both the signals /RAS and /CAS.

In the expediency utilizing the interleaving, a plurality of memory devices are coupled in parallel to a data bus, and are accessed alternately or sequentially for effectively reducing the access time. The method using the high speed mode of DRAM as well as the method using combination of the high speed mode and the interleaving have been known as methods in which the standard DRAM can be used easily and relatively efficiently as a high speed memory. The above method (2) has been widely used in main frames. The high speed cache memory is expensive. However, some of personal computers which are inexpensive but require a high performance are obliged to use the high speed cache memories for improving the operation speed even with a certain increase of prices. The high speed cache memory may be provided in accordance with following three possible positions or manners.

(a) To internally provide the same in MPU itself (b) To provide the same externally to MPU (c) Without providing an independent high speed cache memory, a high speed mode provided in the standard DRAM is used as a cache (pseudo-use of the high speed mode as the cache memory). Thus, at the time of cache-hit, the standard DRAM is accessed in the high speed mode, and, at the time of cache-miss, the standard DRAM is accessed in a normal mode.

All of the three manners (a)–(c) described above have been employed in data processing systems in certain forms. In view of costs, however, many MPU systems include memories having bank structures and employ a method in which interleaving is executed for the respective memory banks, in order to prevent the RAS precharge time (tRP), which is inevitable in the DRAM, from effectively appearing. According to these methods, the practical cycle time of DRAM can be substantially half the specification value.

The interleaving, however, is effective only in the case where the memory devices are sequentially accessed. In other words, the effect cannot be obtained in the case where the same memory bank is continuously accessed. Also, this method cannot effectively reduce the access time of DRAM itself. Further, a minimum unit of memories must be at least two banks.

In the case of using the high speed mode such as the page mode or static column mode, the access time can be effectively reduced only when the MPU continuously accesses a certain page (data in a designated one row). This method can achieve some effect if the banks are relative large in number (i.e., 2 to 4), because different rows can be accessed for the respective banks. The case where data of memory required by the MPU is not present in a given page is referred to as "cache-miss". In general, one group of data is stored in neighboring addresses or sequentially adjacent addresses. In the high speed mode, "cache-miss" generates at a high probability because the row address forming the half of the address is already designated.

If the number of banks is of a large value of 30 to 40, the "cache-miss" probability significantly decreases because data of different pages can be stored in the respective banks. However, the data processing system cannot be realistically assumed to employ 30 to 40 banks. Further, if "cache-miss" generates, it is necessary to raise the signal /RAS for returning to the precharge cycle of DRAM in order to newly select a row address, and thus the performance of bank structure would be degraded.

In the method (2) described above, the high speed cache memory is provided between the MPU and standard DRAM. In this structure, the standard DRAM of a relatively low speed can be employed. Meanwhile, standard DRAMs of a large storage capacity such as 4 Mbits or 16 Mbits are now available. In a small-scale system such as a personal computer, a main memory can be formed of one or several chips of standard DRAMs. If the high speed cache memory is externally provided, the intended effect cannot be achieved in the small scale system of which main memory can be formed, e.g., of one standard DRAM. If the standard DRAM is used as the main memory, a data transmission speed between the high speed cache memory and the main memory is restricted by the number of data I/O terminals of the standard DRAM, forming a bottleneck to the speed of system.

In the case of pseudo-formation of the cache memory by the high speed mode, the operation speed thereof is lower than that of the cache memory, so that it is difficult to achieve an intended system performance.

It may be possible to provide a high speed cache memory (SRAM) in the DRAM in order to avoid the degradation of system performance, which is caused by the interleaving or high speed operation mode described above, and to construct a relative inexpensive small-scale system. More specifically, one-chip memory having such a hierarchical structure may be used that includes a DRAM as a main memory and an SRAM as a cache memory. The one-chip memory having such hierarchical structure is referred to as a cache DRAM (CDRAM). The CDRAM will be described below.

FIG. 26 shows a main portion of a general 1-Mbit DRAM in the prior art. Referring to FIG. 26, the DRAM includes a memory cell array 500 which includes a plurality of memory cells MC arranged in a matrix form, i.e., in rows and columns. The memory cells in one row is connected to one word line WL. The memory cells in one column is connected to one column line CL. The column line CL is usually formed of a pair of bit lines. A memory cell located at the crossing of a selected word line WL and one of the paired bit lines is brought into a selected state. In the 1-Mbit DRAM, the memory cells MC are arranged in the matrix form of 1024 rows and 1024 columns. Thus, the memory cell array 500 includes 1024 word lines WL and 1024 column lines CL (1024 bit line pairs).

The DRAM further includes a row decoder 502 which decodes an externally applied row address signal (not shown) to select a corresponding row in the memory cell array 500, sense amplifiers which sense and amplify data of the memory cells connected to the word line selected by the row decoder 502, and a column decoder which decodes an externally applied column address signal (not shown) to select a corresponding column in the memory cell array 500. In FIG. 26, the sense amplifiers and column decoder are shown as one block 504. The sense amplifiers included in the block 504 are provided corresponding to the respective columns in the memory cell array 500.

Practically, there is provided an address buffer, which receives externally applied row address signal and column address signal and generates an internal row address signal and an internal column address signal for applying them to the row decoder 502 and column decoder (block 504), respectively. This address buffer is not shown.

If the DRAM has a x1-hit structure carrying out input/output of data in units of a bit, the column decoder in block 504 selects one column line (one bit line pair) CL. If the DRAM has a x4-bit structure carrying out input/output of data in units of 4 bits, the column decoder simultaneously selects four column lines CL. These structures are merely examples, and there may be employed such a structure where the four columns are simultaneously selected and further one of these four columns is selected.

When accessing the memory for writing data into a memory cell MC in DRAM or reading data from a memory cell MC, operations are carried out as follows. First, the row address signal (precisely, complementary internal row address signals) is applied to the row decoder 502. The row decoder 502 decodes the applied row address signal, and raises the potential of one word line WL in the memory cell array 500 to "H" in accordance with the result of decoding.

Data in the memory cells MC of 1024 bits connected to the selected word line WL is transferred onto the corresponding column line CL. The data on the column lines CL are sensed and amplified by the sense amplifiers included in the block 504. Selection of a memory cell for writing or reading data among the memory cells connected to the selected word line WL is executed according to a column selecting signal sent from the column decoder included in the block 504.

The column decoder decodes the column address signal (precisely, complementary internal column address signals) and generates the column selecting signal for selecting the corresponding column in the memory cell array 500. In response to this column selecting signal, an I/O gate (not shown) becomes conductive, and the selected column is connected to the data I/O circuit through an internal data transmission line. In this manner, the selected memory cell is accessed.

In the high speed operation described above, the column decoder included in the block 504 sequentially receives the column address signals. In the static column mode operation, the column decoder decodes an address signal applied after elapsing of a predetermined time as a new column address signal, and selects the corresponding memory cell among the memory cells MC connected to the selected word line WL through the column line CL.

In the page mode, the column decoder receives a new column address signal upon each toggle of the signal /CAS. The column decoder decodes the applied column address signal in response to the signal /CAS for selecting the corresponding column line. In this manner, one word line WL is maintained in the selected state, and only the column addresses are changed, whereby the memory cells MC in one row connected to the selected word line WL can be accessed at a high speed.

FIG. 27 shows a general structure of an 1-Mbit CDRAM in the prior art. In FIG. 27, the conventional CDRAM includes the structure of the standard DRAM shown in FIG. 26, an additionally includes an SRAM array 506 and transfer gates 508 for transferring data between one row in the memory cell array 500 of DRAM and the SRAM array (cache registers). The SRAM array (cache registers) 506 includes cache registers which are provided corresponding to the respective column lines CL in the memory cell array 500 for simultaneously storing the data of one row in the DRAM memory cell array 500. Thus, the SRAM array 506 is provided with 1024 cache registers. The cache registers are generally formed of static memory cells (SRAM cells).

In the structure of CDRAM shown in FIG. 27, when a signal indicative of cache-hit is externally applied thereto, the SRAM array 506 is accessed, and the memory cells are accessed at a high speed. In the case of cache-miss, the DRAM is accessed. CDRAM in which the DRAM of a large storage capacity and the high speed SRAM are integrated on the same chip is disclosed, for example, in Japanese Patent Laying-Open No. 62-38590.

In the structure of the conventional CDRAM described above, the column lines (bit line pairs) CL of the DRAM memory cell array 500 and the column lines (bit line pairs) of the SRAM array (cache registers) 506 are connected together through the transfer gates 508 in one-to-one relationship. More specifically, the conventional CDRAM shown in FIG. 27 employs the structure which carries out simultaneous and bidirectional transfer of data between the memory cells connected to one word line WL in the DRAM memory cell array 500 and the SRAM cells which in turn are equal in number to that of the rows in memory cell array 500, through the transfer gates 508. In this structure, a part including the SRAM array 506 is used as the cache memory, and a part including the DRAM array 500 is used as the main memory.

A so-called block size of the cache can be deemed as the number of bits, of which contents are rewritten by one data transfer operation. Therefore, this block size is equal to the number of the memory cells which are physically coupled to one word line WL in the DRAM memory cell array 500. As shown in FIG. 27, in the case where 1024 memory cells are physically coupled to one word line WL, the block size is 1024.

Generally, the hit rate is large if the block size is large. In the case of a constant cache memory size, however, the number of sets is inversely proportional to the block size, and thus the hit rate becomes small. For example, in the case of the constant cache size of 4 Kbits, the set number is 4 if the block size is 1024, but the set number is 128 if the block size is 32. Therefore, the structure of the CDRAM shown in FIG. 27 has such a problem that the block size is unnecessarily large, and thus the cache-hit rate cannot be sufficiently improved.

A structure for appropriately reducing the block size is disclosed, for example, in Japanese Patent Laying-Open No. 1-146187. In this prior art, the column lines (bit line pairs) of the DRAM array and SRAM array are arranged in one-to-one relationship, but are divided into a plurality of blocks in the column direction. Selection of the block is carried out by a block decoder. In cache-miss, the block decoder selects one block. The data is transferred only between the selected DRAM block and the selected SRAM block. According to this structure, the block size of the cache memory can be reduced to an appropriate value. However, the following problem have not been solved.

FIG. 28 shows a practical standard array structure of an 1-Mbit DRAM array. In FIG. 28, the DRAM array is divided into eight memory blocks DMB1–DMB8. The row decoder 502, which is common to the memory blocks DMB1–DMB8, is arranged at one of longer sides of the memory array. Blocks (sense amplifiers and column decoders) 504-1–504-8 are provided corresponding to the memory blocks DMB1–DMB8.

Each of the memory block DMB1–DMB8 has a storage capacity of 128 Kbits. In an example shown in FIG. 28, each memory block DMB includes memory cells arranged in 128 rows and 1024 columns. Each column line CL is formed of a pair of bit lines BL and /BL.

As shown in FIG. 28, the DRAM memory cell array is divided into a plurality of blocks, so that each column line CL (bit lines BL and/or /BL) is short. When a word line is selected for reading or writing of data, electric charges accumulated in a capacitor in the memory cell (i.e., memory cell capacitor) are transferred to the corresponding bit line BL (or /BL). In this operation, the potential generating in the bit line BL (or /BL) varies proportionally to the ratio between the capacitance Cs of memory cell capacitor and the capacitance Cd of bit line BL (or /BL). As the length of bit line BL (or /BL) decreases, the bit line capacitance Cb deceases. Therefore, the potential variation appearing on the bit line can be large, and the read voltage on the bit line can be sensed and amplified by the sense amplifier without error.

In operation, the sensing operation is carried out on the memory block (e.g., memory block DMB2 in FIG. 28) including the word line WL selected by the row decoder 502, and the remaining memory blocks are maintained in the standby state. This reduces power consumption which may be caused by charging and discharging the bit lines in the sensing operation.

In the DRAM in FIG. 28 including the CDRAM structure of the partial activation scheme described above, it is necessary to provide the SRAM cache registers and the block decoder for each of the memory blocks DMB1–DMB8. This significantly increases a chip area.

Further, in such structure, only the SRAM cache registers for the selected memory block operates, so that a utilizing efficiency of the SRAM cache registers is low.

As already described, the bit lines of the DRAM array and SRAM array are in the one-to-one relationship. If a direct mapping method is employed for the memory mapping between the main memory and cache memory, the SRAM array 506 is formed of the cache registers arranged in 1 row and 1024 columns, as shown in FIG. 27. In this case, the SRAM cache has the storage capacity of 1 Kbits. If 4-way set associative method is employed for the mapping, the SRAM array 506 includes cache register blocks 506a–506d in 4 rows, each including 1024 cache registers. Among the cache register blocks 506a–506d in four rows, one block (one row) is selected by a selector 510 in accordance with a way address. In the structure shown in FIG. 29, the SRAM cache has the storage capacity of 4 Kbits.

As described above, the method of memory mapping between the DRAM array and cache memory directly depends on the internal structure of the chip. If the mapping method is changed, the cache size must also be changed as described above.

In any of the CDRAM structures, since the DRAM array and SRAM array have the bit lines in the one-to-one relationship, the column address of DRAM array is necessarily equal to the column address of SRAM array, so that it is impossible in principle to achieve a full associative method which allows mapping of the memory cells of DRAM array to arbitrary positions in the SRAM array.

Further, as shown in FIGS. 27 and 29, the block size of cache depends only on the internal structure of chip, and does not change even if the size of cache changes, so that the block size cannot be changed.

Another example of the structure of semiconductor memory device in which the DRAM and SRAM are integrated on the same chip is disclosed in Japanese Patent Laying-Open No. 2-87392 (1990). In this prior art, the DRAM array and SRAM array are interconnected through an internal common data bus, which in turn is connected to an I/O buffer for performing external input and output of data. Selected positions of the DRAM array and SRAM array can be designated by different address signals which are independently generated.

In the structure of this prior art, however, data is transferred between the DRAM array and SRAM array through the internal common data bus. The number of bits which can be simultaneously transferred is determined by the number of lines of this internal common data bus, and thus contents of the cache cannot be rewritten at a high speed. Therefore, similarly to the case described above where the SRAM cache is provided externally to the standard DRAM, the speed of data transfer between the DRAM array and SRAM array forms bottleneck, and thus a high speed cache memory system cannot be constructed.

In the structures shown in FIGS. 27 and 29, the cache registers (SRAM cells), which are equal in number to the block size of the cache, are arranged in one row of the SRAM array. In this case, there are provided the transfer gates which are equal in number to the block size of cache. Therefore, in the case where the DRAM has the storage capacity, for example, of 4 Mbits and four DRAM arrays each having the storage capacity of 1 Mbits are arranged in four planes, the SRAM array and the transfer gates occupy a large area, and thus the CDRAM of a small chip area cannot be obtained.

In addition to the CDRAM, a video RAM used for purposes of video signal processing or the like is a kind of memory device in which the DRAM and SRAM are integrated on the same chip. In the video RAM, different numbers of pixel data such as 8×8 pixels and 16×16 pixels may be required depending on the contents of processing. In this case, it is preferable for the high speed processing to allow the transfer of data of different block sizes from the DRAM array to the SRAM array, as required. However, the conventional video RAM includes the structure similar to those shown in FIGS. 27 and 29, and the amount of transferred data is always fixed.

SUMMARY OF THE INVENTION

An object of the invention is to provide a semiconductor memory device allowing change of an amount of data transferred between memories.

Another object of the invention is to provide a CDRAM allowing easy change of a block size of a cache.

Still another object of the invention is to provide a semiconductor memory device allowing high speed transfer of data between two memories of different types.

In brief, a semiconductor memory device according to the invention is constructed to transfer data between memories of different types in accordance with a high speed mode such as a page mode.

More specifically, a semiconductor memory device according to a first aspect of the invention includes a first memory cell array including a plurality of first memory cells arranged in rows and columns, a second memory cell array including a plurality of second memory cells arranged in rows and columns, and a first row selector for selecting a row in the first memory cell array. The row selected by the first selector includes a plurality of data blocks each having a plurality of columns.

The semiconductor memory device further includes a first column selector for selecting the data block in the first memory cell array. The first column selector includes a circuit for sequentially selecting a plurality of data blocks in the row selected by the first row selector in a first operation mode.

The semiconductor memory device also includes a second row selector for selecting a row in the second memory cell array. The second row selector includes a circuit for sequentially selecting a plurality of rows in the first operation mode.

The semiconductor memory device further includes a data transferring unit for transferring data between the data block selected by the first column selector and the row selected by the second row selector. The data transferring unit includes a circuit for sequentially transferring data between a plurality of data blocks and a plurality of rows in the first operation mode.

A semiconductor memory device according to a second aspect of the invention includes a memory of a large storage capacity to be accessed at the time of cache-miss, a high speed memory to be accessed at the time of cache-hit, a data transferring unit for transferring data between the memory of the large storage capacity and the high speed memory at the time of cache-miss, and a controller for activating the data transferring unit at the time of cache-miss. The controller includes a unit for determining an amount of the data to be transferred by the data transferring unit in one cache-miss cycle in accordance with an externally applied signal.

In the invention according to the first aspect, the data is transferred between a plurality of data blocks of the first memory array and a plurality of rows of the second memory cell array in the first operation mode. By controlling a duration of the first operation mode, the amount of the data which is transferred between the first and second memory cell arrays in the first operation mode can be controlled. Thereby, the data in the intended row can be transferred at a high speed between the first and second memory cell arrays.

In the invention according to the second aspect, the externally applied control signal determines the amount of the transferred data in the data transferring operation between the memory of the large storage capacity and the high speed memory at the time of cache-miss. Thereby, the cache block size can be easily determined at an intended value without varying the internal structure of the memory.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 14A-14D schematically show an operation for transferring data from the SRAM array to the DRAM array in the embodiment of the invention;

FIG. 18 is a table showing correlation between combination of internal control signals and internal operations executed thereby in the semiconductor memory device shown in FIG. 16;

FIGS. 24A-24D schematically shows a data transferring operation in the third embodiment of the invention;

FIGS. 25A-25D schematically show an operation for transferring data from an SRAM array to a DRAM array in the third embodiment of the invention;

DESCRIPTION OF THE PREFERRED EMBODIMENT

"Embodiment 1"

Figure 1:
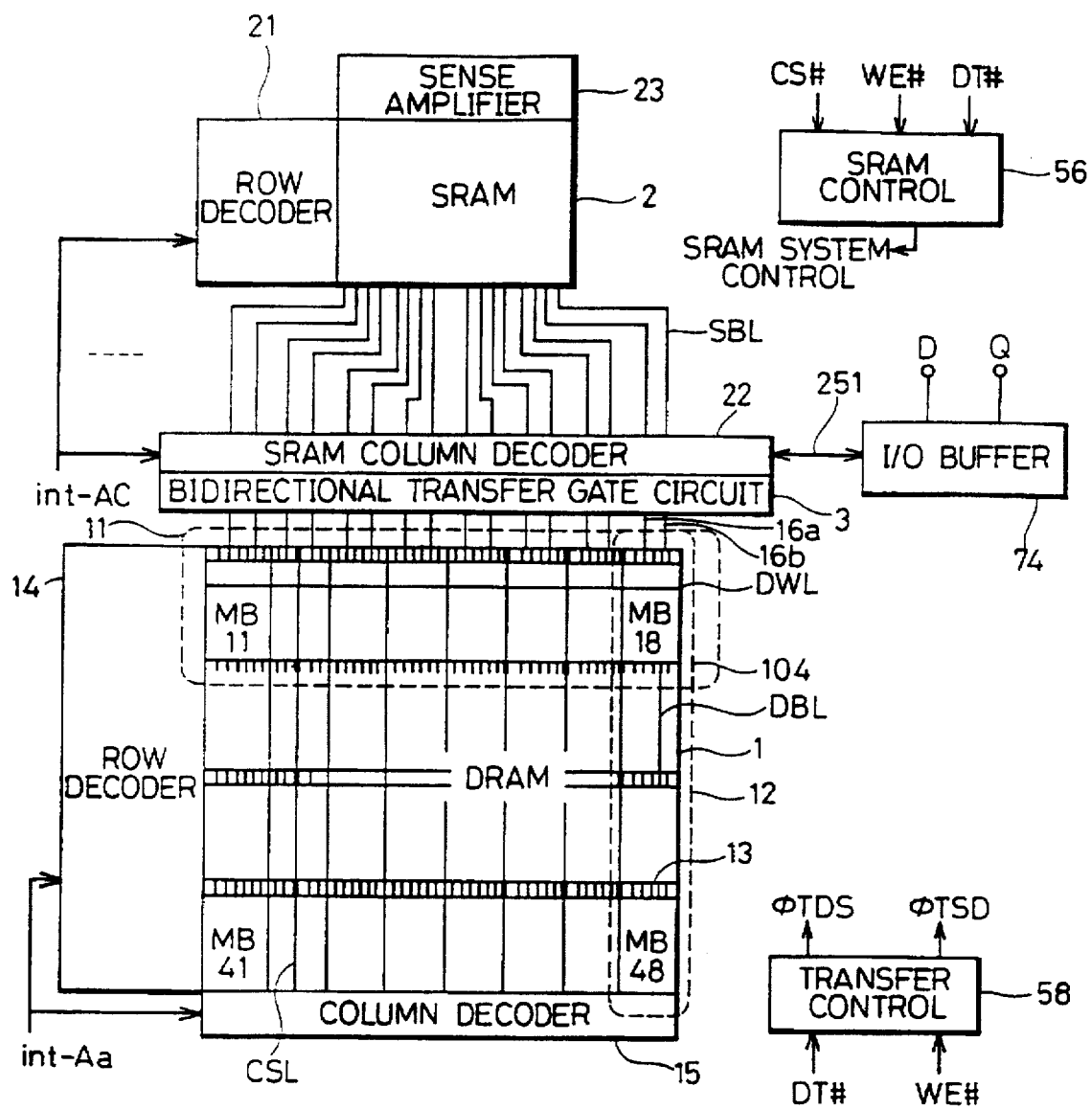
FIG. 1 shows a whole structure of a semiconductor memory device according to a first embodiment of the invention.

FIG. 1 shows a whole structure of a semiconductor memory device according to a first embodiment of the invention. Referring to FIG. 1, a semiconductor memory device includes a DRAM array 1 including dynamic memory cells arranged in a matrix form, i.e., in rows and columns, an SRAM array 2 including static memory cells arrange in a matrix form, i.e., in rows and columns, and a bidirectional transfer gate circuit 3 for transferring data between the DRAM array 1 and SRAM array 2.

The DRAM array 1, which has a storage capacity, e.g., of 1 Mbits, includes 1024 word lines DWL and 1024 pairs of bit lines BL and /BL. In FIG. 1, the DRAM bit line pair is indicated by a reference character "DBL". The DRAM array 1 is formed of a plurality of blocks divided in row and column directions. In FIG. 1, the DRAM array 1 is divided into eight blocks MBi1-MBi8 (i=1, 2, 3, 4) with respect to the column direction, i.e., a longitudinal direction of the DRAM word line DWL, and is divided into four blocks MB1j-MB4j (j=1,2 ... 8) with respect to the row direction. Thus, it is divided into 32 memory blocks MBij in the example in FIG. 1.

Each group of the eight blocks MBi1-MBi8 divided in the column direction form one row block 11. Each group of the four blocks MB1i-MB4i divided in the row direction form one column block 12. The memory blocks MBi1-MBi8 included in one row block 11 commonly share one DRAM word line DWL. The memory blocks MB1j-MB4j included in the same column block 12 commonly share a column selecting line CSL. Sense amplifier and I/O blocks 13, i.e., (sense amplifier)+I/O blocks having structures which will be described later are provided for the memory blocks MB11-MB48, respectively. Each column selecting line CSL for transmitting a column selecting signal from a column decoder 15 simultaneously selects two columns (two bit line pairs). The column decoder 15 sets one of the column selecting lines CSL in each column block 12 at a selected state in accordance with an internal address int-Aa. A row decoder 14 sets one of the DRAM word lines DWL only in one of the row blocks 11 at a selected state in response to the internal address signal int-Aa.

The semiconductor memory device further includes mutually independent I/O lines 16a and 16b for connecting the column blocks 12 to a bidirectional transfer gate circuit 3. The I/O lines 16a and 16b are provided for the respective column blocks 12. In the structure shown in FIG. 1, therefore, 16 columns (2×8 columns) are simultaneously selected in the DRAM array 1 and are connected to the bidirectional transfer gate circuit 3 through the I/O lines 16a and 16b.

Although not shown in the figure, the SRAM array 2 includes 16 pairs of bit lines SBL which are connected to the 16 pairs of I/O lines (16a and 16b) through the bidirectional transfer gate 3, respectively. The SRAM array 2, which has the storage capacity, e.g., of 4 Kbits, includes the 16 bit line pairs and 256 SRAM word lines. Thus, in the SRAM array 2, one row corresponds to 16 bits. In one data transferring operation, one row is selected in the SRAM array 2, and data is transferred between the selected row and 16 columns selected in the DRAM array 1.

For the SRAM array 2, there are also provided an SRAM decoder 21 which decodes an internal address signal int-Ac for selecting one row in the SRAM array 2, an SRAM column decoder 22 which decodes the internal address signal int-Ac for selecting a corresponding column in the SRAM array 2, and a sense amplifier circuit 23 for amplifying data of the memory cells selected by the SRAM row decoder 21 and SRAM column decoder 22 in the data read operation. The sense amplifier circuit 23 includes sense amplifiers which are provided for the SRAM bit line pairs SBL, respectively, as will be described later.

The SRAM bit line pair SBL selected by the SRAM column decoder 22 is connected to an I/O buffer 74 through a common data bus 251. The memory cell in the DRAM array 1 is selected in accordance with an output of the SRAM column decoder 22 and is connected to the internal data bus 251. A path for this data input and output will also be described later.

The address int-Aa applied to the DRAM row decoder 14 and DRAM column decoder 15 is independent from the address int-Ac applied to the SRAM row decoder 21 and SRAM column decoder 22. The internal addresses int-Ac and int-Aa are generated by an address buffer 72, which receives a DRAM address As and an SRAM address Ac through different address pin terminals, respectively. The address buffer 72 generates internal address signals int-Aa and int-Ac in accordance with internal control signals RAS and CS. The signal RAS activates DRAM circuits, and the signal CS activates the SRAM circuit.

The semiconductor memory device further includes peripheral control circuits, i.e., a DRAM control circuit 54 which receives externally applied control signals RAS#, CAS#, WE# and DT# to generate signals for controlling the memory cell selecting operation of the DRAM array, an SRAM control circuit 56 which receives signals CS#, WE# and DT# to generate signals for controlling operation of circuits related to the SRAM array, and a transfer control circuit 58 which responds to the signals DT# and WE# to generate signals ØTDS and ØTSD for controlling the transfer operation of bidirectional transfer gate circuit 3.

The signal RAS# determines the row selecting operation and the memory cycle period in the DRAM. The signal CAS# controls the column selecting operation in the DRAM array. The signal WE# determines the data access mode, i.e., the data write mode or data read mode. The signal DT# designates whether data is to be transferred between the SRAM array 2 and DRAM array 1 or not. The signal CS# activates the SRAM part and decides the memory cycle of SRAM.

The data transfer is designated if the signal DT# attains "L" prior to falling of the signals CAS# and CS#, and the control signal ØTDS or ØTSD is generated in response to the rise of this signal DT#. Which of signal ØTDS or ØTSD is generated depends on the state, i.e., "H" or "L" of the signal WE#. In the case where the signal #DT is already at "L" when the signal CS# attains "L", the operation of SRAM column decoder 22 is prohibited. The DRAM control circuit 54 prohibits the operation for connecting a selected column in the DRAM array 1 to the internal data line 251 if the signal DT# is already at "L" when the signal CAS# falls to "L". The address buffer 72 also receives the signal CAS from the DRAM control circuit 54 to take in the DRAM address Aa as a column address signal. Then, the data transfer operation of the semiconductor memory device shown in FIG. 1 will be schematically described below.

First, an operation of the DRAM part will be described below. The address buffer 72 takes in an external address signal in accordance with the signal RAS to apply the internal row address signal to the row decoder 14. The DRAM row decoder 14 performs the decoding operation in response to the signal RAS and raises one of the DRAM word lines DWLs to "H". Data is read from the memory cells, which are connected to the selected one DRAM word line DWL, to the corresponding 1024 bit lines BLs (or /BLs).

Then, all the sense amplifiers provided in the block 13 and included in the row block 11 which includes the selected word line DWL are simultaneously activated to differentially amplify the potentials in the respective DRAM bit line pairs DBLs. As described above, only one among the four row blocks is activated, to reduce power consumption caused by charging and discharging of the bit lines in this sensing operation (an operation method in which only the row block including the selected row is activated is referred to as a partial activation scheme).

Then, the signal CAS is generated from the DRAM control circuit 54 in response to the signal CAS#, and the address buffer 72 generates the internal column address signal from the external address Aa. The column decoder 15 also responds to the signal CAS by decoding the applied internal column address signal for selecting one of the column selecting lines CSL in each of the eight column blocks 12. The one column selecting line CSL selects two pairs of bit lines. The two pairs of bit lines selected by this column selecting line CSL are connected to the I/O lines 16a and 16b provided for the respective column blocks 12 through the I/O gates included in the block 13. Thereby, data of multiple bits (16 bits in this embodiment) is read from the DRAM array onto the plurality of I/O line pairs 16a and 16b.

Now, an operation of the SRAM part will be described below. When the signal CS# becomes active, the SRAM control circuit 56 generates the signal CS, so that the SRAM becomes active. The address buffer 72 responds to the signal CS by taking in the external address signal Ac and generating the internal address signal int-Ac. In the data transferring operation, when the signal CS# becomes active, i.e., when it attains "L", the signal DT# is already at "L". In this case, the SRAM column decoder 22 is inactive. Only the SRAM row decoder 21 is active, and one row in the SRAM array 2 is in the selected state. Each SRAM word line is connected to the static memory cells of 16 bits, as described above. Therefore, in accordance with the operation of selecting the one word line, the 16 static memory cells (SRAM cells) are connected to 16 pairs of the SRAM bit lines SBLs.

In the data transferring operation, the signal DT# is at "L". The transfer control circuit 58 generates the control signal ØTDS or ØTSD in response to the signals DT# and WE#. The signal ØTDS is used for transferring data from the DRAM array 1 to the SRAM array 2. The signal ØTSD is used for transferring data from the SRAM array 2 to the DRAM array 1. The signal WE# determines which signal is to be selected.

Upon generation of the signal ØTDS or ØTSD, the bidirectional transfer gate circuit 3 is activated, and the data is transferred between 16 pairs of the SRAM array bit lines and 16 pairs of the I/O lines 16a and 16b. When the signal ØTDS is generated, the DRAM memory cell data which have been transmitted onto 16 pairs of the I/O lines 16a and 16b are written into the memory cells of 16 bits which have been selected in the SRAM array 2, respectively.

Upon completion of one operation of transferring data from the DRAM array 1 to the SRAM array 2, the signal CS# becomes inactive, and all the word lines in the SRAM array 2 attain the nonselected state. In the DRAM array 1, it is assumed that the signal RAS# is still in the active state of "L". The signal CAS# is toggled to rise to "H" and subsequently fall to "L". That is; a high speed mode operation which is referred to as a page mode is executed. In this case, the DRAM word line DWL which has already been selected is in the selected state, and the address buffer 72 applies a new internal column address signal to the DRAM column decoder 15 in response to the fall of signal CAS#, and the column decoder 15 performs the column selecting operation again in accordance with the signal CAS.

If the signal DT# falls to "L" at a timing earlier than falling of the signals CS# and CAS#, the data transfer is instructed again. In this case, different memory cells are selected in the already selected DRAM word line DWL, and data of the selected memory cells are transmitted to the 16 pairs of I/O lines 16a and 16b. Therefore, in the case where another row is selected again in the SRAM array 2 in response to the signal CS#, the data are transferred between the memory cells of 16 bits connected to the newly selected SRAM word line and the newly selected memory cells of 16 bits. Every time the signals CAS# and DT# are toggled, the DRAM array 1 is accessed in the page mode for sequentially selecting the memory cells of 16 bits. Also, when the signal CS# is toggled, rows are sequentially selected in the SRAM array 2. In this manner, the data can be transferred in minimum units of 16 bits.

The signal DT# can decide whether the data transfer is to be carried out or not. Termination of the data transfer can be designated by deactivating both the signals CS# and RAS#. Therefore, it is possible to arbitrarily set the number of memory cells which participate in the data transfer between the DRAM array 1 and SRAM array 2. If the semiconductor memory device shown in FIG. 1 is a cache memory, such a structure may be employed that the signal RAS# falls to "L" to activate the DRAM when the cache-miss generates, in which case the amount of data transmitted from the DRAM array 1 to the SRAM array 2 can be set at a desired value. As a result, the block size of cache can be easily and externally set at a desired value.

The transfer of data from the SRAM array 2 to the DRAM array 1 is executed in a manner similar to that of the data transfer operation described above, but the transfer control circuit 58 generates the signal ∅TSD instead of the signal ∅TDS.

In the structures described above, such a structure may be employed that the bidirectional transfer gate circuit 3 is formed of a single transmission gate circuit, and the SRAM sense amplifier 23 is provided to each SRAM bit line pair SBL in the SRAM array 2. Further, in this structure, the SRAM sense amplifier circuit 23 is deactivated when the data is to be transferred from the DRAM array 1 to the SRAM array 2, and the SRAM sense amplifier circuit 23 is activated when the data is to be transferred from the SRAM array 2 to the DRAM array 1. A driving power of the SRAM sense amplifier circuit 23 is set larger than a driving power of the DRAM sense amplifier, which enables unidirectional data transfer through bidirectional transfer gate circuits. In this case, activation and deactivation of the SRAM sense amplifier circuit 23 are determined by the signals DT# and WE# applied to the transfer control circuit 58. However, in the following description, it is assumed that the bidirectional transfer gate circuit 3 includes buffer circuits each transferring data in one direction.

The address Ac for selecting an SRAM cell in the SRAM array 2 can be set completely independently from the address Aa for selecting a dynamic memory cell (DRAM cell) in the DRAM array 1. Therefore, the memory cells of 16 bits selected in the DRAM array 1 can transmit data to and from the memory cells at an arbitrary position (row) in the SRAM array 2. Any of the direct mapping method, set associative method and full associative method can be achieved without changing the internal arrangement and structure.

The amount of data, which is transferred in the data transfer operation between the SRAM array 2 and DRAM array 1, e.g., in the case of cache-miss, can be controlled in accordance with the number of generation of the signal DT#, and the block size of cache can be set at a desired value in accordance with the application and use.

Then, the internal structures and operations of the semiconductor memory device according to the invention will be described more in detail below.

(I/O Circuit): Connection of the DRAM array and SRAM array to the internal data lines.

Figure 2:
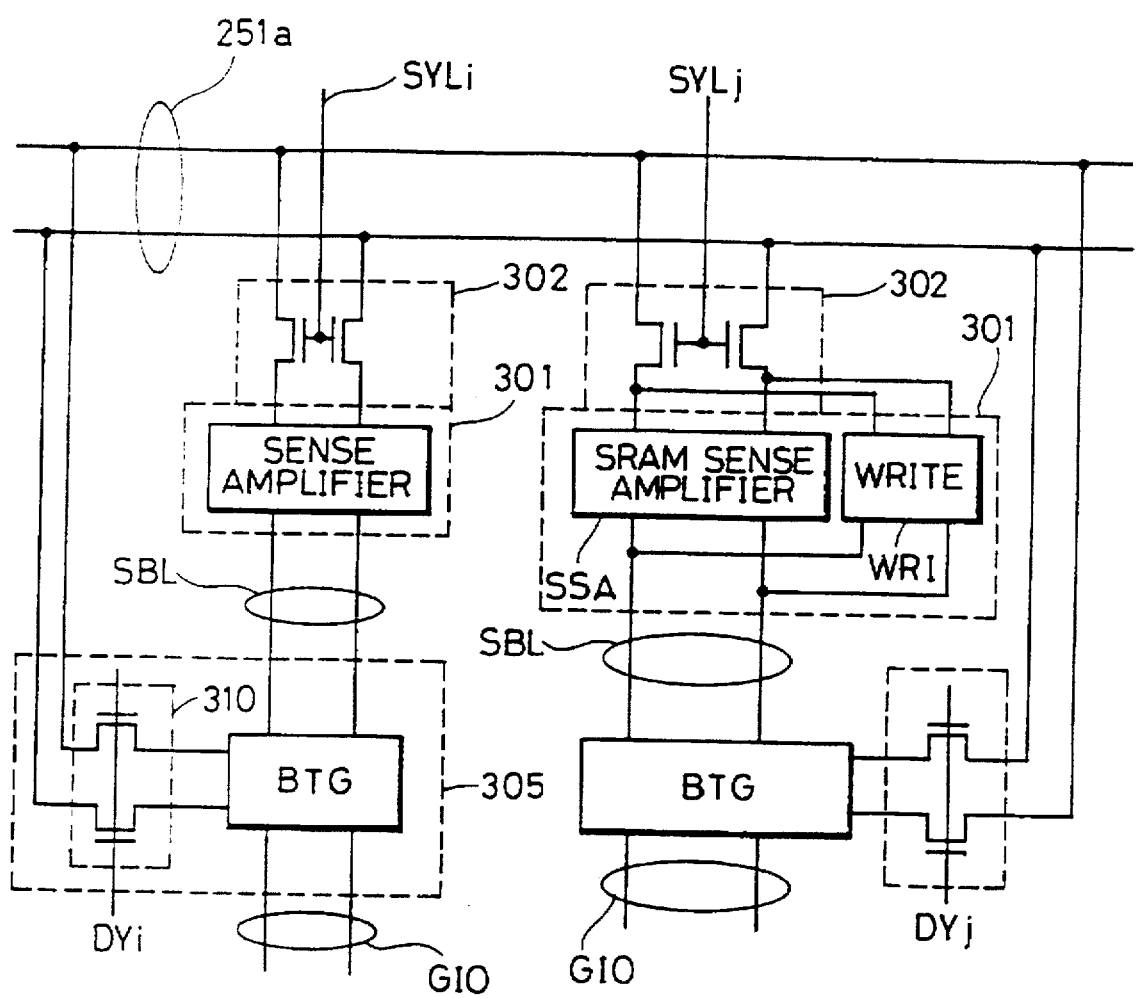
FIG. 2 shows an example of connection between internal data lines and an SRAM array in the semiconductor memory device shown in FIG. 1.

FIG. 2 shows an example of a manner of connection between the bidirectional transfer gate circuit 3 and the internal common data line 251 shown in FIG. 1. In FIG. 2, each SRAM bit line pair SBL is provided with an SRAM I/O gate 301 including an SRAM sense amplifier SSA. The SRAM I/O gate 301 also includes a write circuit WRI which is activated when data is to be written into the SRAM array and serves to transmit the data on internal data lines 251a (corresponding to the internal data line 251 in FIG. 1) onto the corresponding SRAM bit line pair SBL. The SRAM bit line pair SBL is connected to the internal data lines 251a through the SRAM I/O gate 301 and an SRAM column selecting gate 302. The SRAM column selecting gate 302 receives an SRAM column selecting signal SYL from the SRAM column decoder 22. In response to this SRAM column selecting signal SYL, the SRAM column selecting gate 302 becomes conductive, and only one SRAM bit line pair SBL is connected to the internal data lines 251a. The internal data line 251 shown in FIG. 1 transfers the data of 4 bits, and thus the semiconductor memory device shown in FIG. 1 has a x4 bit structure (in which memory cells of 4 bits are selected from the memory cells of 16 bits). Only the internal data lines corresponding to 1 bit is shown in FIG. 2 as the signal lines 251a.

In order to allow access to the DRAM array, the semiconductor memory device in FIG. 2 further includes an access switching circuit 310 for connecting a global I/O line pair GIO to the internal data lines 251a in response to a final column selecting signal DY from the DRAM column decoder, which is included in the column decoder 15 in FIG. 1, serves to select a column selecting line CSL and includes a decoder portion for selecting one bit in the DRAM memory cells of 16 bits selected by the eight column selecting lines CSLs. The access switching circuit 310 and the bidirectional transfer gate BTG are included in a transfer gate block 305. The transfer gate block 305 is included in the bidirectional transfer gate circuit 3 shown in FIG. 1. The global I/O line pair GIO corresponds to one I/O line 16a or 16b shown in FIG. 1.

The final column selecting signal DT of DRAM is generated, for example, by decoding lower four bits of the DRAM column address. Thus, as already stated, there are provided 16 pairs of the I/O lines 16a and 16b (i.e., 16 global I/O line pair GIO) for one DRAM memory mat (storage capacity: 1 Mbits, DRAM array 1 shown in FIG. 1). In order to access the DRAM array 1, only one pair among these 16 global I/O line pairs GIO (I/O line pairs 16a and 16b). Therefore, the column addresses of lower 4 bits for DRAM are decoded to generate the final column selecting signal DY.

The access switching circuit 310 serves merely to connect the global I/O line pair GIO to the internal data lines 251a. The bidirectional transfer gate BTG performs the connection to a corresponding signal line. The access to the DRAM array may be achieved, without providing such access switching circuit 310, by employing a structure in which the internal data lines 251a and the global I/O line pair GIO are interconnected through the SRAM column selecting gate 302 and SRAM I/O gate 301. In this structure, the column selecting signal applied to the SRAM column selecting gate 302 is a selecting signal which depends on the column address applied for the DRAM, as will be described later. This can be identified by a circuit which multiplexes the column selecting signal in accordance with the signals CS# and CAS#. Such multiplexing circuit applies the column selecting signal for DRAM to the SRAM selecting gate 302, for example, when the signal CAS# is active and the signal CS# is inactive.

In the SRAM part, SRAM sense amplifiers SSA are provided corresponding to the SRAM bit line pairs SBLs, respectively. These may be utilized for transferring data without using the buffer circuit in the bidirectional transfer gate circuit 3, as described before, and are employed also for purposes of ensuring high speed output of SRAM memory cell data. Similarly to the DRAM sense amplifier, the SRAM sense amplifier SSA may be formed of cross-coupled transistors and may have a function for differentially amplifying and latching the applied data, in which case it is not necessary to provide the write circuit WRI.

Figure 3A:
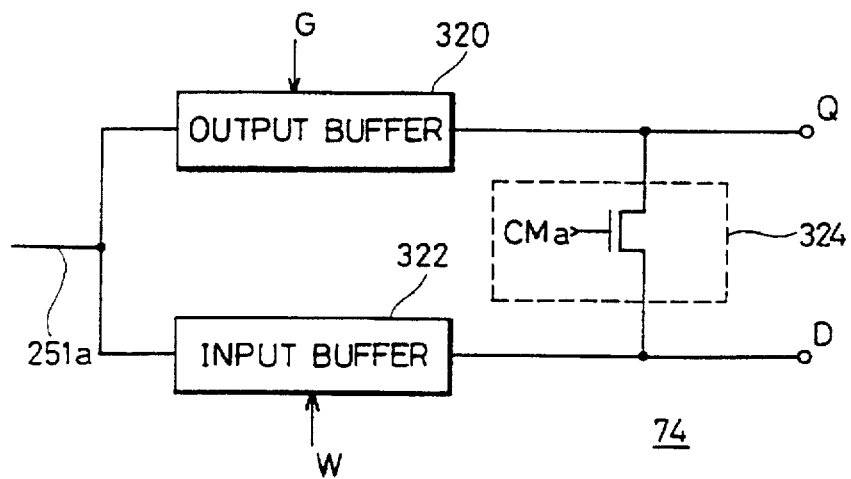
FIGS. 3A and 3B show structures of a data I/O circuit of the semiconductor memory device shown in FIG. 1.

FIG. 3A shows a structure for implementing D/Q separation in the I/O buffer 74 shown in FIG. 1. In the figure, the D/Q separation indicates the structure in which a data input pin D and a data output pin Q are provided independently and separatedly for the I/O buffer 74. In FIG. 3A, the I/O buffer 74 includes an output buffer 320 which is activated in response to an internal output enable signal G to produce output data Q from data on the internal data lines 251a, an input buffer 322 which is activated in response to an internal write instructing signal W to produce internal write data from the external write data D and transmit the same onto the internal data lines 251a, and a switch circuit 324 which short-circuits the output of output buffer 320 and the input of input buffer 322 together in response to a signal CMa. The signal CMa may be set at a D/Q separating state as a default, or may be set at "H" or "L" with a mask when manufactured. In the D/Q separating state, the switch circuit 324 is in the nonconductive state.

The internal output enable signal G to be applied to the output buffer 320 is generated by OR operation on the output control signals applied from the SRAM control circuit 56 and DRAM control circuit 54. Similarly, the internal write enable signal W to be applied to the input buffer 322 is generated by OR operation on the write instructing signals applied from the SRAM control circuit 56 and DRAM control circuit 54. An external access to the SRAM array 2 and DRAM array 1 can be achieved by such OR operation.

Figure 3B:
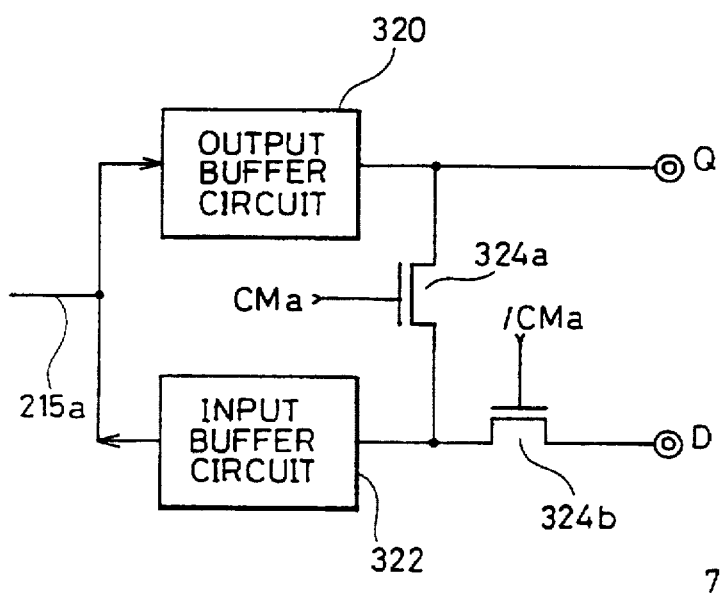

FIG. 3B shows another example of the structure of the I/O buffer. In FIG. 3, there are provided a switching transistor 324a formed of an n-channel MOS transistor which connects the output of output buffer circuit 320 and the input of input buffer circuit 322 in response to a signal CMa, and a switching transistor 324b formed of an n-channel MOS transistor which connects the input of input buffer circuit 322 and the data input pin terminal D in response to a signal /CMa. The signals CMa and /CMa are complementary with each other, and thus one of the switching transistors 324a and 324b is in the conductive state. When the switching transistor 324a is in the conductive state, the input and output of data are carried out through the pin terminal Q. When the switching transistor 324b is in the conductive state, the input and output of data are carried out through the pin terminals D and Q, respectively. In this manner, the D/Q separated arrangement and D/Q common arrangement can be achieved using the complementary signals CMa and /CMa.

"Address Generating System"

Figure 4A:
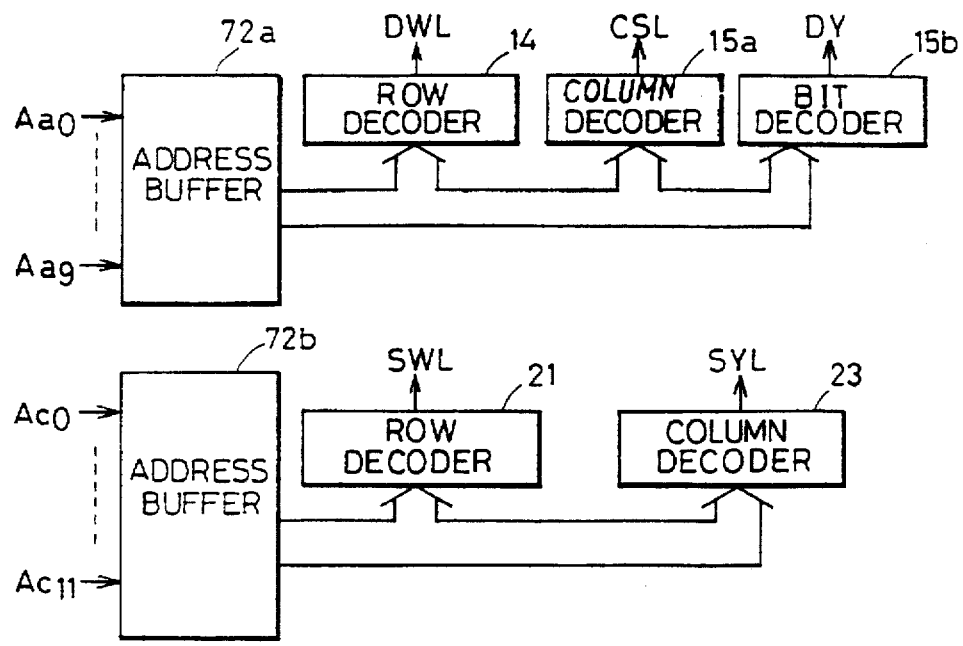
FIGS. 4A and 4B show distribution manner of internal addresses of the semiconductor memory device shown in FIG. 1.

FIG. 4A shows an address distribution manner for allowing the DRAM part and SRAM part to perform completely independent selection of the row and column. The structure of I/O system shown in FIG. 2 is applied to this structure. In FIG. 4A, the part related to the DRAM includes an address buffer 72a receiving row and column address signals Aa0–As9 in a time division multiplexed manner, the DRAM row decoder 14 which decodes the internal row address signal from the address buffer 72a and generates a row selecting signal (word line drive signal) DWL, a column decoder 15a which decodes the internal column address signal sent from the address buffer 72a and generates the column selecting signal CSL, and a bit decoder 15b which decodes the internal column address signal from the address buffer 72a and generates a bit selecting signal DY for selecting one bit in the memory cells of 16 bits.

The part for SRAM includes an address buffer 72b receiving address signals Ac0–Ac11, the SRAM row decoder 21 which decodes the internal row address signal from the address buffer 72b and generates a signal SWL for selecting an SRAM word line, and a column decoder 23 which decodes the internal column address signal from the address buffer 72b and generates an SRAM column selecting signal SYL. The address buffer 72b for SRAM simultaneously receives the row and column address signals. The address buffers 72a and 72b correspond to the address buffer 72 shown in FIG. 1. The DRAM address buffer 72a is responsive to the signals RAS and CAS to generate internal row address signal and internal column address signal, respectively. The address buffer 72b simultaneously generates internal row and column address signals in response to the signal CS.

According to the structure shown in FIG. 4A, address designation for the SRAM and DRAM parts can be executed completely independently.

Figure 4B:
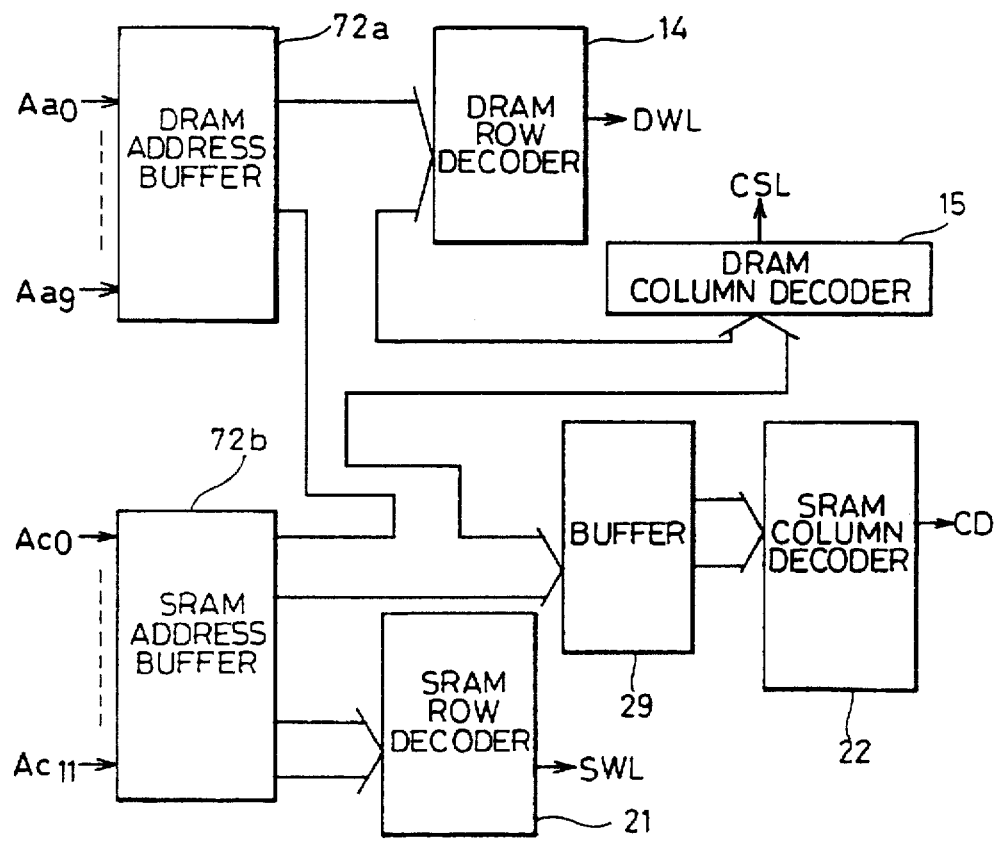

In the address distribution shown in FIG. 4B, the bidirectional transfer gate circuit 305 does not include the access switching circuit 310 shown in FIG. 2, and data is written into the DRAM array through the SRAM bit line pair SBL and bidirectional transfer gate BTG as well as the global I/O line pair GIO.

In FIG. 4B, the column selecting signal CD sent from the SRAM column decoder 22 has both the functions as the bit selecting signal in the DRAM array and the column selecting signal in the SRAM array.

In FIG. 4B, the DRAM address buffer 72a receives external DRAM address signals Aa0–Aa9 to generate the internal row address signal and internal column address signal. The DRAM row decoder 14 decodes the internal row address signal applied from the address buffer 72a and generates the word line drive signal DWL for selecting one word line in the DRAM array. The DRAM column decoder 15 receives a part of the internal column address signal sent from the DRAM address buffer 72a and generates the signal for selecting the column selecting line in the DRAM.

The remaining part of the internal column address signal from the DRAM address buffer 72a is applied to a buffer 29.

The buffer 29 also receives the internal column address signal from the SRAM address buffer 72b and transmits the same to the SRAM column decoder 22. In the case where the semiconductor memory device is used as a semiconductor memory device a cache, the SRAM array is accessed at the time of cache-hit, and the DRAM array is accessed at the time of cache-miss. Generally, external access to the SRAM array and DRAM array is not simultaneously carried out in a cache system. Therefore, the buffer 29 can applies the DRAM address signal and SRAM column address signal to the SRAM column decoder 22 without causing conflict with each other. The SRAM row decoder 21 receives the internal row address signal from the SRAM address buffer and generates the word line drive signal SWL for selecting a word line in the SRAM array. In the structure shown in FIG. 4B, the column selecting signal CD from the SRAM column decoder 22 corresponds to the column selecting signal SYL in FIG. 2.

If the structure in FIG. 4B utilizes the access switching circuit (see FIG. 2), such a structure is employed that the signal DY is replaced with a logical AND signal of the column selecting signal CD from the SRAM column decoder 22 and the control signal CAS for DRAM. Whichever the structure may be employed, the access to the SRAM array and DRAM array can be surely and independently controlled.

Figure 5:
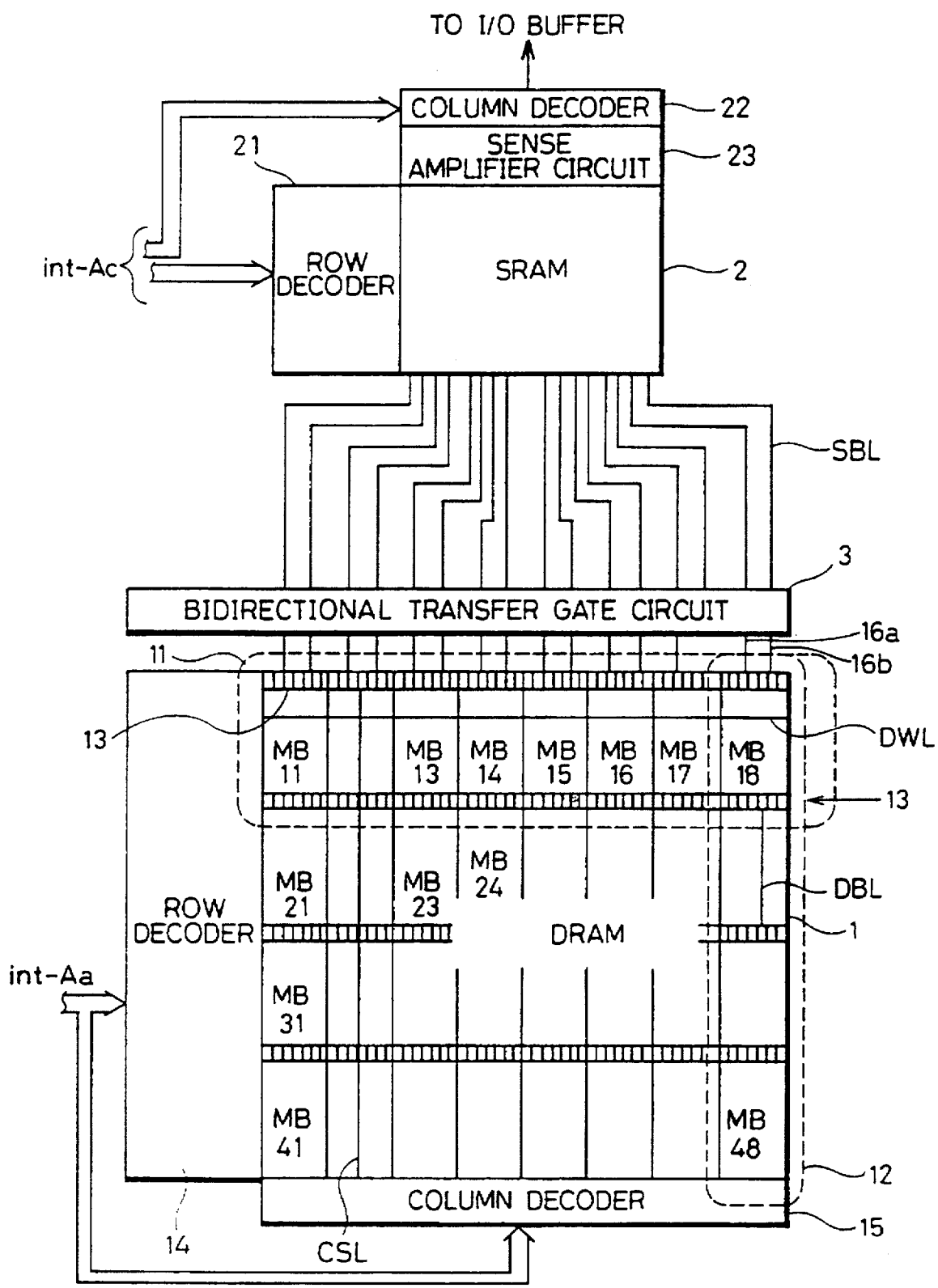
FIG. 5 shows a modification of the semiconductor memory device shown in FIG. 1.

FIG. 5 shows another example of the array arrangement of the semiconductor memory device. In the structure shown in FIG. 5, the bidirectional transfer gate circuit 3 is arranged at one side of the SRAM array 2, and the column decoder 22 is arranged at the other side of the SRAM array 2. The column decoder 22 connects a column selected in the SRAM array 2 to the I/O buffer through a column selecting gate (not shown clearly). In the structure shown in FIG. 5, the input and output of data to and from the DRAM array are executed through the SRAM array 2. This structure corresponds to the structure of the I/O circuit shown in FIG. 2 except for that the access switching circuit is not provided, and utilizes the structure shown in FIG. 4B as the address distribution arrangement. If this semiconductor memory device is used as a cache memory, the ordinary cache-hit rate is 90% or more, and the SRAM array 2 is access in almost all the cases. The frequency of access to the DRAM array is extremely low. Therefore, in spite of the above structure, the cache memory system can be formed without impairing its operation performance.

Also in the array arrangement shown in FIG. 5, the sense amplifier circuit 23 for SRAM includes the sense amplifiers provided corresponding to the respective columns of the SRAM array 2. Alternatively, one sense amplifier may be used commonly to all the columns of the SRAM array 2.

Figure 6:
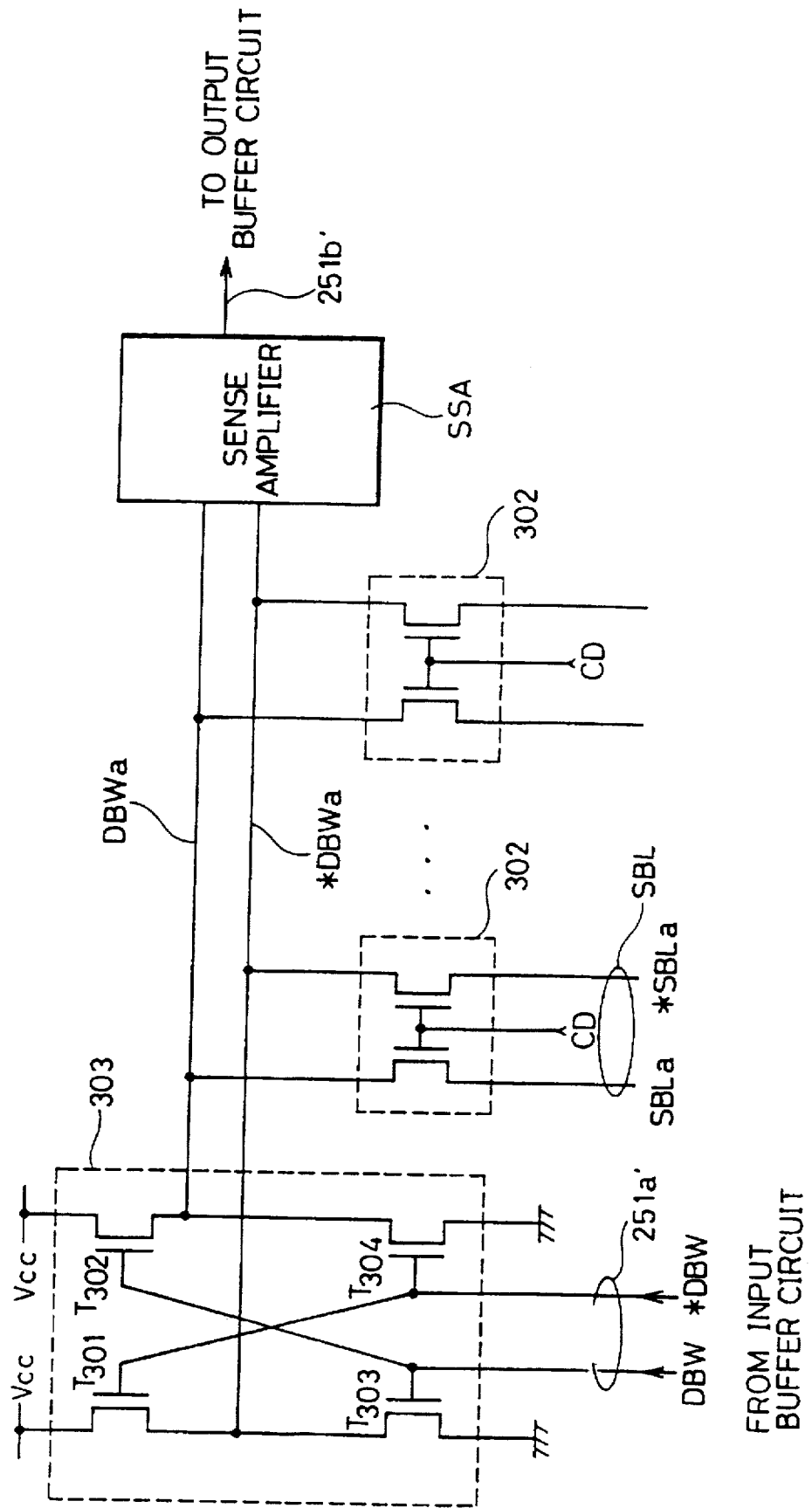
FIG. 6 shows a modification of the data I/O circuit in the semiconductor memory device shown in FIG. 1.

FIG. 6 shows a structure of the I/O part of SRAM part shown in FIG. 5. Referring to FIG. 6, one SRAM sense amplifier SSA is provided for a plurality of the SRAM bit line pairs SBL (SBLa and *SBLa). The column selecting gate 302 is provided for each SRAM bit line pair SBL. The column selecting gate 302 receives the column selecting signal CD. This column selecting signal CD is applied from the SRAM column decoder 22 shown in FIG. 4B.

The internal data line 251 includes an internal write data line pair 251a' for transmitting write data and a read data transmitting line 251b' for transmitting read data to the output buffer. The read data transmitting line 251b' may be formed of paired signal lines.

The internal write data transmitting line pair 251a' includes complementary data line pair DBW and *DBW which transmit complementary data. The internal write data line pair 251a' is connected to a write circuit 303. The write circuit 303 amplifies the internal write data from the internal write data line pair 251a', and transmits the amplified data to internal data lines DBWa and *DBWa. The write circuit 303 includes cross-coupled n-channel MOS transistors T301, T302, T303 and T304. Gates of the transistors T302 and T303 are connected to the internal write data line DBW, and gates of the transistors T301 and T304 are connected to the internal write data line *DBW. A connection between the transistors T302 and T304 is connected to the internal data line DBWa, and a connection between the transistors T301 and T303 is connected to the internal data line *DBWa.

The transistors T301 and T302 in the conductive state transmit the operation power supply potential Vcc. The transistors T303 and T304 in the conductive state transmit the ground potential Vss.

As an example, it is assumed that data of "H" is transmitted onto the internal write data line DBW. In this case, data of "L" is transmitted onto the internal write data line *DBW. The transistors T302 and T303 attains the conductive state. Therefore, the write circuit 303 transmits the data of "H" to the internal data line DBWa through the transistor T302, and also transmits the data of "L" to the other internal data line *DBWa through the transistor T303.

In the data reading operation, the input buffer circuit transmits the data of "L" to both the internal write data lines DBW and *DBW. Thereby, the output of write circuit 303 attains a high impedance state. The SRAM sense amplifier SSA is activated. The data, which is transmitted to the internal data lines DBWa and *DBWa through a selected column selecting gate circuit 302, is amplified by the sense amplifier SSA and then is transmitted to the output buffer circuit through the internal read data transmitting line 251b'.

Owing to the provision of the internal data line 251 including the write data transmitting line 251a and the read data transmitting line 251b' which are independent from each other, as shown in FIG. 6, the I/O circuit can be designed easily compared with the structure in which data is written and read through a common internal data bus.

Figure 7:
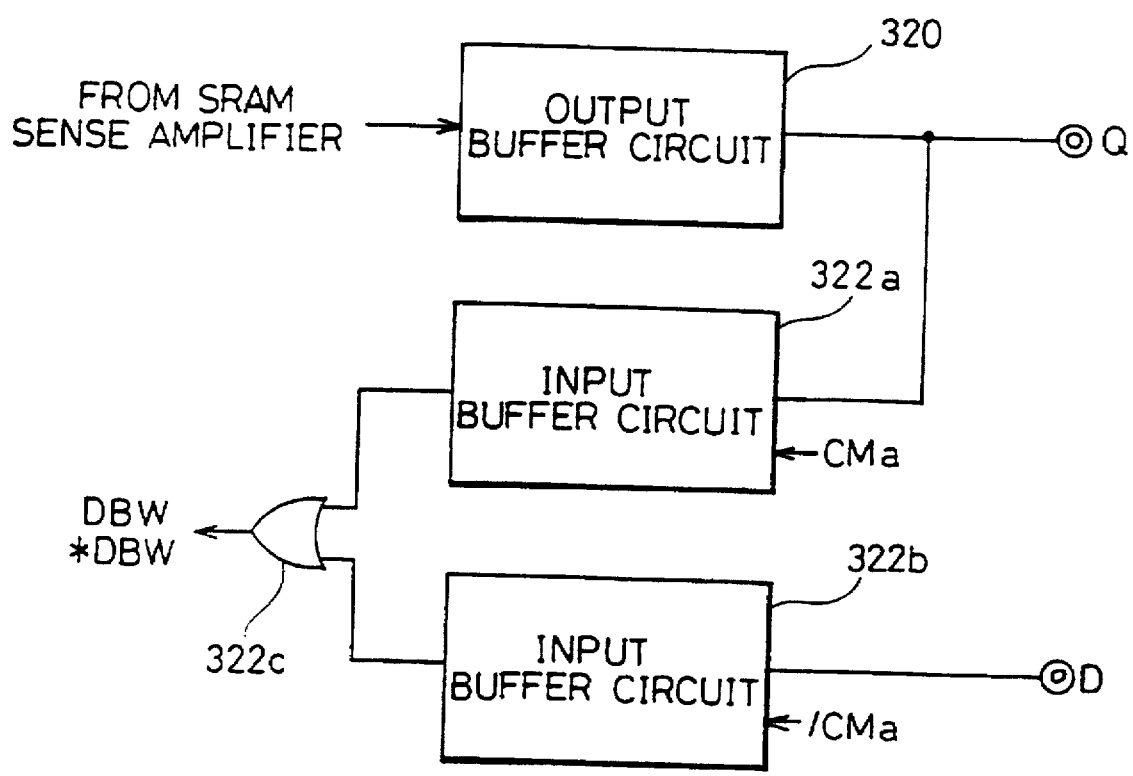
FIG. 7 shows a structure of an I/O circuit used in a data I/O part shown in FIG. 6.

FIG. 7 shows a structure of the I/O buffer circuit for the structure shown in FIG. 6 in which the internal write data transmitting line and read data transmitting line are provided independently and separately. In FIG. 7, the I/O buffer circuit 74 includes an output buffer circuit 320 receiving internal read data from the SRAM sense amplifier (indicated by "SSA" in FIG. 6), an input buffer circuit 322a receiving data applied to the pin terminal Q and producing an internal write data, an input buffer circuit 322b producing the internal write data from data applied to the pin terminal D, and an OR gate circuit 322c carrying out the logical OR between the outputs of input buffer circuits 322a and 322b.

The input buffer circuits 322a and 322b are activated by the signals CMa and /CMa, respectively. In the FIG. 7, there are not shown control signals for determining data input/output timings in the output buffer circuit 320 and the input buffer circuits 322a and 322b. The OR gate circuit 322c transmits the internal write data onto the internal write data transmitting lines DBW and *DBW. In the case where the input buffer circuits 322a and 322b supply the data which are complementary with each other, the OR gate circuit 322c carries out the logical OR between the complementary data. In the case where both the input buffer circuits 322a and 322b perform only the amplifying operation, there are provided the OR gate circuit 322b as well as an inverter circuit receiving the output of OR gate circuit 322c. The output of inverter circuit and the output of OR gate circuit 322c are transmitted as complementary internal write data to the write data transmitting lines *DBW and DBW.

"Array Structure"

Figure 8:
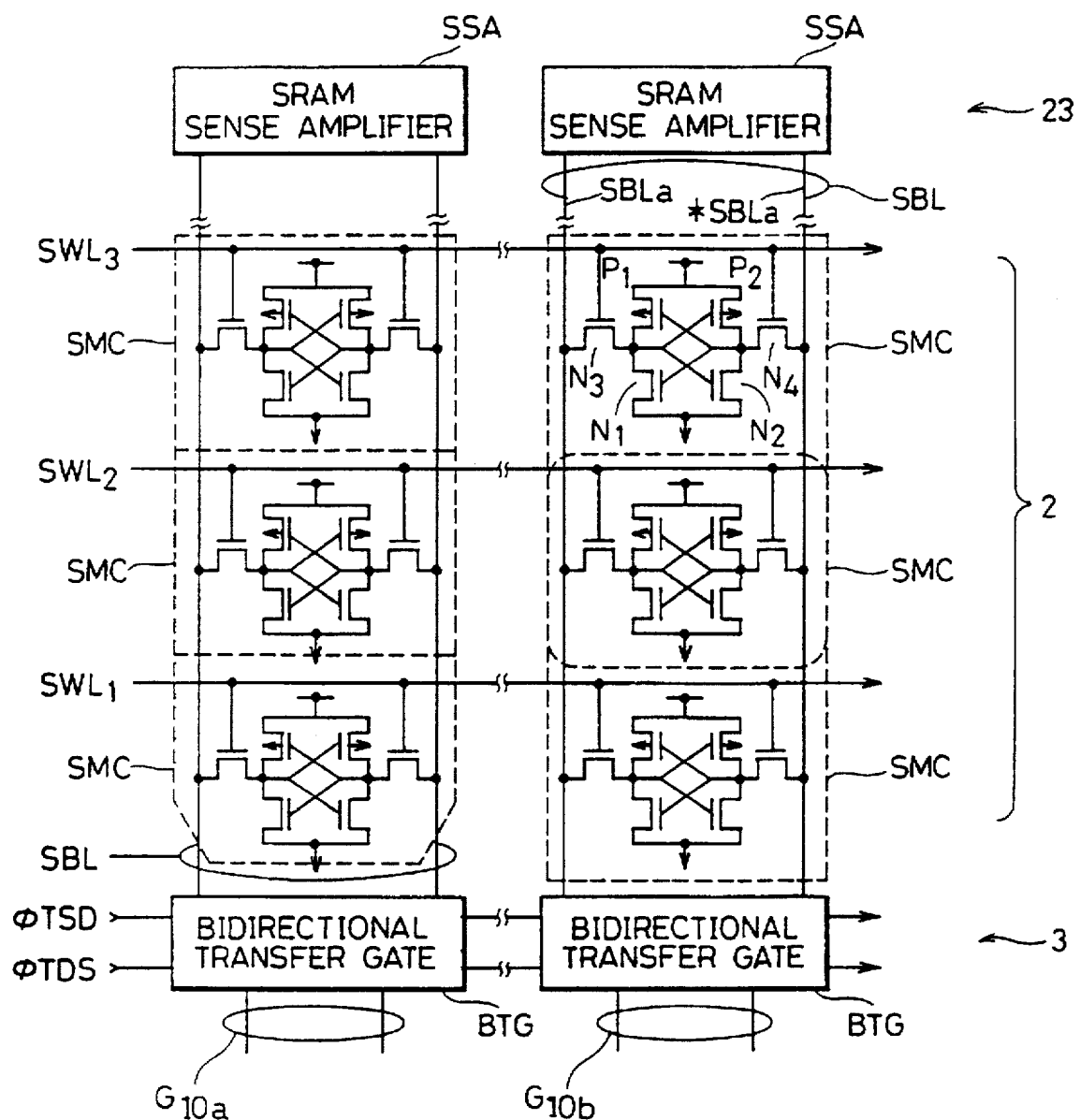
FIG. 8 shows a structure of the SRAM array in the semiconductor memory device shown in FIGS. 1 and 5.

FIG. 8 shows a structure of the SRAM array. In FIG. 8, the SRAM array 2 includes static memory cells SMC arranged in a matrix of rows and columns. Static memory cells SMC in one row are connected to one SRAM word line SWL, and the static memory cells SMC arranged in one column are connected to one SRAM bit line pair SBL. In FIG. 8, there are representatively shown three SRAM word lines SWL1–SWL3.

The static memory cell SMC includes cross-coupled p-channel MOS transistors P1 and P2 as well as cross-coupled n-channel MOS transistors N1 and N2. The transistors P1 and N1 form a first inverter, and the transistors P2 and N2 form a second inverter. Inputs and outputs of the first and second inverters are cross-coupled to form an inverter latch circuit. The static memory cell SMC includes an n-channel MOS transistor N3 which connects a connection node between the transistors P1 and N1 to the SRAM bit line SBLa in response to a signal potential on the word line SWL, and an n-channel MOS transistor N4 which connects a connection node between the transistors P2 and N2 onto the SRAM bit line SBLa in response to a signal potential on the SRAM word line SWL.

For each of the SRAM bit line pair SBL, there is provided the SRAM sense amplifier SSA and is also provided the bidirectional transfer gate BTG. The bidirectional transfer gate BTG is connected to the global I/O line pair GIOa or GIOb extending from the DRAM array which will be described later, and receives the transfer control signals øTSD and øTDS.

In the structure shown in FIG. 8, each of the SRAM word lines SW1–SW3 is connected to the memory cells which are equal in number to the bits to be transferred between the DRAM array and SRAM array by one data transferring operation. In the array arrangement shown in FIGS. 1 and 5, the SRAM word line SWL (representatively indicating SWL1–SWL3) are connected to the static memory cells of 16 bits.

Figure 9:
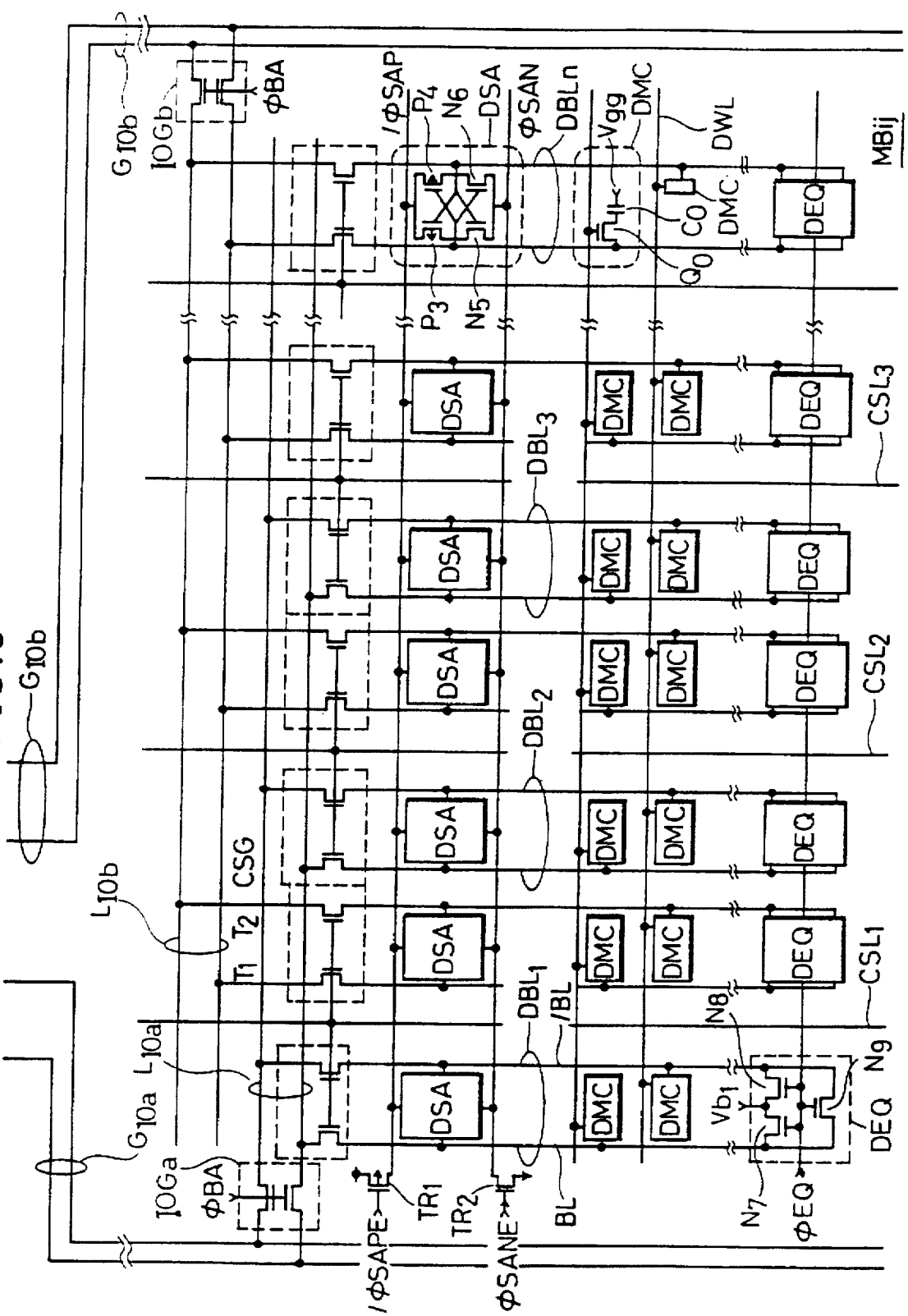
FIG. 9 shows a structure of a DRAM array in the semiconductor memory device shown in FIG. 1.

FIG. 9 shows an arrangement of the DRAM array. In FIG. 9, there is shown only one memory block MBij in the DRAM array shown in FIGS. 1 and 5. In FIG. 9, the DRAM memory block MBij includes a plurality of dynamic memory cells DMC arranged in rows and columns. The dynamic memory cell DMC includes one memory transistor Q0 and one memory capacitor C0. The memory capacitor C0 receives at its one electrode (cell plate) a constant potential Vgg.

The memory block MBij further includes DRAM word lines DWL each connected to the DRAM cells (dynamic memory cell) DMC in one row, and DRAM bit line pairs DBL each connected to the DRAM cells DMC in one column. DRAM bit line pair DBL is formed of complementary bit lines BL and /BL. The DRAM cells DMC are arranged at crossings between the DRAM word lines DWL and DRAM bit line pairs DBL.

For each DRAM bit line pair DBL, there is provided a DRAM sense amplifier DSA for sensing and amplifying a potential difference on the corresponding bit line pair. The DRAM sense amplifier DSA includes a p-channel sense amplifier part formed of cross-coupled p-channel MOS transistors P3 and P4, and an n-channel sense amplifier part formed of cross-coupled n-channel MOS transistors N5 and N6. An operation of the DRAM sense amplifier DSA is controlled by sense amplifier drive signals /øSAP and øSAN which are generated by the p-channel MOS transistor TR1 and n-channel MOS transistor TR2 in response to sense amplifier activating signals /øSAPE and øSANE, respectively.

The p-channel sense amplifier part is responsive to the sense amplifier drive signal /øSAP by increasing a potential of the bit line having a higher potential to the operation power potential Vcc level. The n-channel sense amplifier part is responsive to the sense amplifier drive signal øSAN by discharging a potential of the bit line having a lower potential to the potential Vss of the ground potential level.

The p-channel MOS transistor TR1 generates the sense amplifier drive signal /øSAP at the operation power potential Vcc and transmits the same to one power supply node of the DRAM sense amplifier DSA when the sense amplifier activating signal /øSAPE attains "L". The n-channel MOS transistor TR1 transmits the sense amplifier drive signal /øSAN at the ground potential Vss level to the other power supply node of the DRAM sense amplifier when the sense amplifier activating signal /øSANE attains "H".

The drive signal lines for transmitting the sense amplifier drive signals øSAN and /øSAP are precharged to an intermediate potential Vcc/2 in a standby state. For simplicity,. a circuit for precharging the sense amplifier drive signal lines is not shown.

For each of the DRAM bit line pairs DBL, there is provided a precharge/equalize circuit DEQ, which is activated in response to a precharge/equalize signal øEQ and operates to precharge each bit line in the corresponding bit line pair to a predetermined precharge potential Vb1 and to equalize the precharge potentials of the bit lines BL and /BL. The precharge/equalize circuit DEQ includes n-channel MOS transistors N7 and N8 for transmitting the precharge potential Vb1 to the bit lines BL and /BL, respectively, and an n-channel MOS transistor N9 for equalizing the potentials of the bit lines BL and /BL.

The DRAM memory block MBij further includes DRAM column selecting gates CSG which are provided for respectively DRAM bit line pairs DBL, and are responsive to the potentials of signals on the column selecting lines CSL to become conductive and connect the corresponding DRAM bit line pairs DBL to local I/O line pairs LIO. Each column selecting line CSL is provided commonly to two pairs of the DRAM bit lines, and two DRAM bit line pairs DBL are simultaneously selected. The local I/O line pairs LIO are two in number, and specifically, there are provided two pairs LIOa and LIOb for allowing receipt of data from the simultaneously selected two DRAM bit line pairs.

The memory block MBij further includes DRAM I/O gates IOGa and IOGb which are responsive to a block activating signal øBA to connect the local I/O line pairs LIOa and LIOb to the global I/O line pairs GIOa and GIOb, respectively. The column selecting line CSL extends in the row direction through one column block shown in FIGS. 1 and 5, and the global I/O line pairs GIOa and GIOb also extend in the row direction through one column block. The local I/O line pairs LIOa and LIOb extend in the column direction only within one memory block MB.

In the structure shown in FIGS. 1 and 5, only one of the row blocks is selected. Only the DRAM I/O gates IOGa and IOGb for the selected row block become conductive. The signal øBA for controlling conduction/nonconduction of the DRAM I/O gates IOGa and IOGb is formed of upper two bits, e.g., of a row address signal used for selecting a DRAM word line. Only one row block among the four can be designated, and only the DRAM I/O gates IOGa and IOGb corresponding the selected row block can attain the conductive state.

Figure 10:
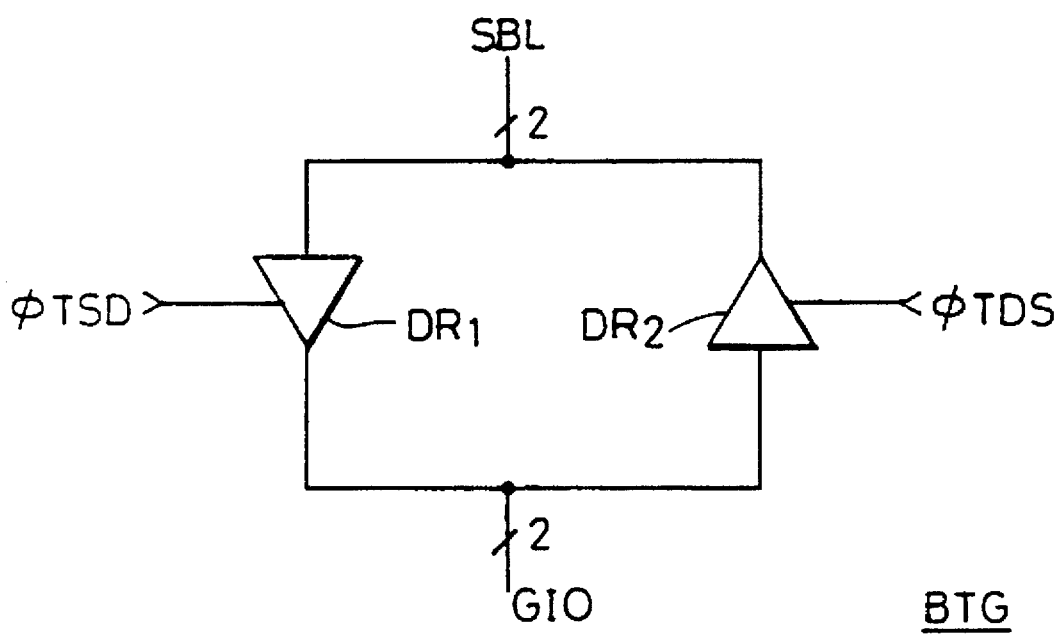
FIG. 10 shows an example of a structure of a bidirectional transfer gate shown in FIG. 8.

FIG. 10 shows a specific structure of the bidirectional transfer gate shown in FIG. 8. Referring to FIG. 10, the bidirectional transfer gate BTG includes a tri-state buffer DR1 which becomes conductive in response to the transfer instructing signal øTSD and transmits data on SRAM bit line pair SBL onto global I/O line pair GIO, and a tri-state buffer DR2 which is activated in response to the transfer instructing signal øTDS and transmits data on global I/O line pair GIO onto SRAM bit line pair SBL. Now, an operation of transferring data between the DRAM array and SRAM array will be described below with reference to FIGS. 8, 9 and 10. First, the operation of transferring data from the DRAM array to the SRAM array will be described with reference to an operation waveform diagram of FIG. 11.

Before time t1, both the SRAM and DRAM arrays are in the standby state.

While the precharge instructing signal øEQ is in the active state of "H", the DRAM precharge/equalize circuits DEQ are activated and precharge the DRAM bit line pairs DBL to the predetermined precharge potential Vb1 (generally, at the level of Vcc/2). The activated DRAM precharge/equalize circuits DEQ also equalize the potentials of bit lines BL and /BL. The sense amplifier drive signals øSAN and øSAP have been precharged to the intermediate potential by equalize circuit (not shown). Similarly, the local I/O line pairs LIO and global I/O line pairs GIO are maintained at the precharge potential of Vcc/2 by the precharge/equalize circuits (not shown).

At time t1, the precharge instructing signal øEQ falls to "L", whereby the precharge/equalize circuits DEQ attain the inactive state, and the DRAM bit line pairs DBL attain an electrically floating state at the predetermined precharge potential. Similarly, the signal lines transmitting the sense amplifier drive signals øSAN and /øSAP attain the electrically floating state at the intermediate potential of Vcc/2. Thereafter, the row decoder 14 (see FIG. 1 or 5) performs the row selecting operation in accordance with the address signal applied thereto.

Figure 11:
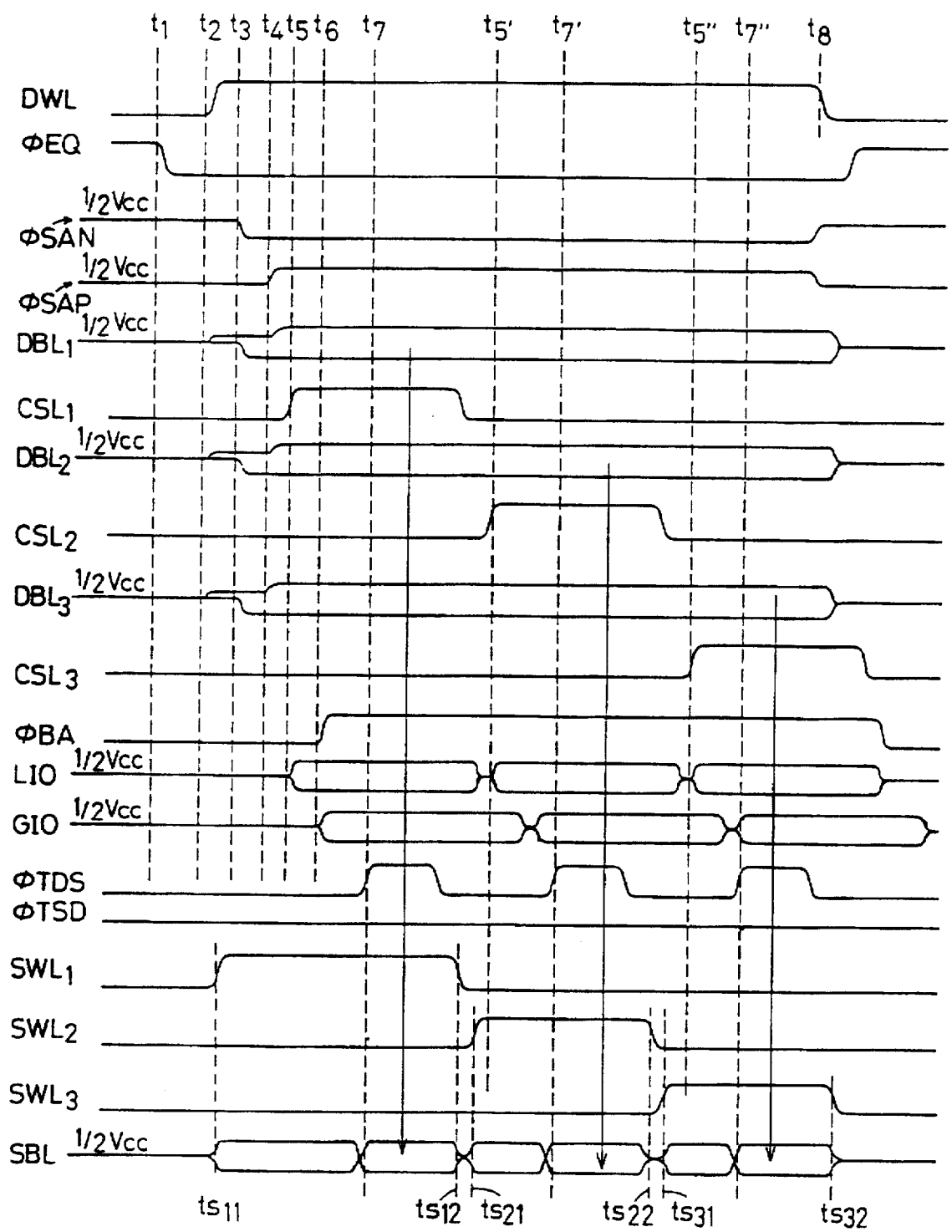
FIG. 11 is a waveform diagram showing a data transferring operation between arrays shown in FIGS. 8 and 9.

At time t2, one of the word lines DWL is selected in the DRAM array 1, and the potential of the selected word line DWL rises to "H". The selected word line is provided commonly to all the memory blocks included in one row block. The memory cells in one row connected to the selected word line DWL are connected to the corresponding DRAM bit line pairs DBL (DRAM bit lines BL or /BL), respectively, (i.e., the memory transistors Q0 becomes conductive), and the potentials of the respective DRAM bit line pairs DBL change in accordance with data of the memory cells connected thereto. In FIG. 11, there is shown a state in which memory cells storing data "1" are selected in three DRAM bit pairs DBL1, DBL2 and DBL3, and the potentials of related bit lines BL (or /BL) are raised.

At time t3, the sense amplifier activating signal øSANE rises to "H", and the sense amplifier drive signal øSAN falls from the intermediate potential Vcc/2 to the ground potential Vss level of "L". Thereby, the n-channel sense amplifier part included in the DRAM sense amplifier DSA is activated, and the potential of the bit line having a lower potential in the DRAM bit line pair DBL lowers to the ground potential Vss level.

At time t4, the sense amplifier activating signal /øSAPE falls to "L", and the sense amplifier drive signal /øSAP rises from the intermediate potential Vcc/2 to the operation power potential Vcc. The p-channel sense amplifier part included in the DRAM sense amplifier DSA is activated, and the bit line having a higher potential in the DRAM bit line pair is raised to the operation power potential Vcc level.

At time t5, one of the column selecting lines CSL (column selecting line CSL1 in FIG. 11) is selected in accordance with the column selecting sent from the DRAM column decoder 15 (see FIG. 1 or 5), and the potential of the selected column selecting line CSL1 rises to "H". Two DRAM bit line pairs DBL are connected to the local I/O line pairs LIOa and LIOb through the DRAM column selecting gates CSG. The potentials of local I/O line pairs LIOa and LIOb (representatively indicated by "LIO" in FIG. 11) change from the precharge potential Vcc/2 in accordance with the information transmitted from the selected DRAM bit line pair.

At time t6, the block activating signal øBA rises to "H" only for the selected row block, and the DRAM I/O gates IOG (IOGa and IOGb) become conductive. The signal potentials on the local I/O line pairs (LIOa and LIOb) are transmitted onto the global I/O line pairs GIO (GIOa and GIOb). Here, the selected row block means a row block including the selected DRAM word line DWL. The selected row block is designated by decoding the higher 2 bits of the row address signal used for selecting the DRAM word line (in the case where the row blocks are four in number). In the remaining nonselected row blocks, the sensing operation is not executed, and the precharge state is maintained. Owing to the partial activation described above, the current consumption can be reduced.

In the operation described above, only one memory block MB in each column block is connected to the bidirectional transfer gate circuit 3 through the global I/O line pair GIO.

In the SRAM, the SRAM row decoder 21 (shown in FIGS. 1 and 5) performs the row selecting operation at time ts11, and one of the SRAM word lines SWL is selected in the SRAM array 2. The potential of the selected SRAM word line SWL (i.e., SRAM word line SWL1 in FIG. 11) rises to "H". The row selecting operation in the DRAM part and the row selecting operation in the SRAM part are executed asynchronously. The data of SRAM cells connected to the SRAM word line SWL are transmitted onto the corresponding SRAM bit line pairs SBL. The potentials of SRAM bit line pairs SBL change from the precharge potential (or equalize potentials) Vcc/2 in accordance with the information stored in the corresponding SRAM cells. Here, a circuit structure for equalizing the potentials of SRAM bit line pairs SBL is not shown in FIG. 8. Generally in the SRAM, the point of transition of the address is detected, and one-shot pulse is generated in response to the detected address transition, whereby SRAM bit line pairs SBL are equalized.

At time t7, the data transfer instructing signal øTDS is raised to and maintained at "H" for a predetermined time period. The data of DRAM cells have already been transferred onto the global I/O line pairs GIO, and the SRAM bit line pairs SBL are connected to the SRAM cells. In response to the data transfer instructing signal øTDS, the bidirectional transfer gates BTG are activated (i.e., tri-state buffer DR2 shown in FIG. 10 is activated), and the signal potentials on global I/O line pairs GIO are transferred onto the SRAM bit line pairs SBL. Thereby, the data are transferred from the DRAM cells to the SRAM cells. As already stated, the memory cells of 2 bits are selected in one memory block MBij, and one row block includes eight memory blocks. Therefore, data of DRAM cells of 16 bits in total are simultaneously transferred to SRAM cells.

As long as such a relationship is satisfied that the time t7 of activation of the data transfer instructing signal øTDS is preceded by both the time t6 of rise of the block activating signal øBA and time ts11 of selection of the SRAM word line SWL, the time relationship of the time ts11 with respect to the times t1–t6 may be arbitrary. The signal øTSD instructing the transfer of data from the SRAM array to the DRAM array is maintained at the inactive state of "L" in this cycle.

At time ts12, the word line selecting operation is completed in the SRAM array 2. Thereby, the transfer of data of memory cells of 16 bits is completed. Thereafter, the SRAM word line SWL2 is selected in the SRAM array at time ts21.

Meanwhile, in the DRAM array, the column selecting line CSL1 is deselected while the DRAM word line DWL is maintained in the selected state, and then the column selecting line CSL2 is selected at time t5'. This operation utilizes a known high speed mode such as a conventional page mode or static column mode. By the selection of the new column selecting line CSL2 at time t5', the potentials of local I/O line pair LIO change in accordance with the data of the memory cell selected by the column selecting line CSL2. Here, such a structure may be employed that the potentials of the local I/O line pairs LIO and global I/O line pairs GIO are once restored to the precharge state when the column selecting line CSL changes to the nonselected state. During this, the block selecting signal øBA similarly maintains the state of "H". The data transmitted onto the local I/O line pairs LIO are transmitted onto the global I/O line pairs GIO.

At time t7', the data transfer instructing signal øTDS is generated again. At this time t7', the potentials of global I/O line pairs GIO are already stable, and, in the SRAM array, the data of memory cells connected to the newly selected word line SWL2 are already transmitted to the respective SRAM bit line pairs SBL and are stable. The data of 16 bits on the global I/O line pairs GIO are simultaneously transferred through the bidirectional transfer gates BTG (tri-state buffers DR2) to the memory cells of 16 bits connected to the SRAM word line SWL2.

At time ts22, the operation for maintaining the word line SWL2 in the selected state is completed, and then, the new SRAM word line SWL3 is selected at time ts31. Selection and deselection of the word lines SWL in SRAM array are executed in accordance with the signal CS. The SRAM can operates at a high speed, and specifically at a speed higher than that in the high speed mode of the DRAM.

In the DRAM array, the new column selecting line CSL3 is selected at time t5", and the potentials on the local I/O line pairs LIO and global I/O line pairs GIO change. At time t7", the data transfer instructing signal øTDS is generated, and the data on the DRAM bit line pair DBL3 is transferred onto the SRAM bit line pair SBL.

At time t8, the DRAM word line DSL is deselected, the data transfer cycle is completed, and the DRAM array is restored to the standby state.

In the SRAM array, the potential of SRAM word line SWL3 falls to "L" at time ts32, and the potentials of SRAM bit line pair SBL are restored to the precharge potential. Here, there is shown a state in which the potentials of SRAM bit line pair SBL are precharged to the intermediate potential in the standby state.

As described above, the DRAM column decoder 15 (FIGS. 1 and 5) has selected one column selecting line CSL in each column block 12. The one column selecting line CSL selects two DRAM bit line pairs DBL. The transfer of data from the DRAM array to the SRAM array are performed in parallel in the respective column blocks. Therefore, in the structure shown in FIGS. 1 and 5, the data of 16 bits are simultaneously transferred. By repeating the data transfer several times, the amount of transferred data can be increased from 16 bits to 32 bits, 48 bits and so on.

Therefore, the semiconductor memory device described above can be used as a cache memory for easily setting an appropriate block size. In this case, even if the block size is large, a total width of bidirectional transfer gates is determined in accordance with the minimum unit (i.e., amount of data transferred by one data transfer operation), and the width thereof does not increase, so that the chip occupying area does not increase.

The data of 16 bits are simultaneously transferred as described above owing to such a structure that the DRAM array includes eight column blocks and two DRAM bit line pairs are selected in each column block. The number of bits of data which are simultaneously transferred depends on the number of DRAM column blocks or the number of DRAM bit line pairs to be simultaneously selected.

As shown in FIG. 11, the drive signal of the DRAM word line DWL is deactivated nearly at time t8, and the data transfer instructing signal øTDS falls to "L". At the point of time t8, the local I/O line pairs LIO are disconnected from the SRAM bit line pairs SBL, so that the DRAM array and SRAM array are electrically isolated from each other. The DRAM part and SRAM part can perform independent operations. Therefore, the DRAM part cannot be accessed during a period from the time t8 to the end of the RAS precharge period, but the SRAM array part can be externally accessed after the time ts32. Thereby, a large amount of data can be transferred at a high speed from the DRAM array to the SRAM array, and the data thus transferred can be externally accessed at a high speed. Therefore, the data transferred, e.g., at the time of cache-miss can be read from the SRAM array immediately after the completion of data transfer.

The amount of data transferred in a data transfer cycle from the DRAM to the SRAM depends on the times of access to the DRAM array in a high speed operation mode. The total amount of data to be transferred can be externally controlled.

More specifically, by changing column addresses (DRAM column address) for a selected one row, a multiple data of blocks can be transferred from the DRAM array to the SRAM array, and equivalently, the block size can be variable.

FIGS. 12A–12D schematically show the operation of transferring data from the DRAM array to the SRAM array. The data transfer operation will be described below with reference to FIGS. 12A–12D.

Figure 12A:
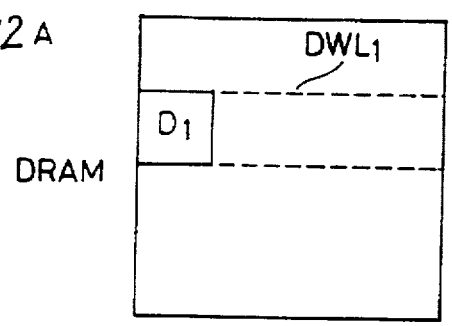
FIGS. 12A-12D schematically show the data transferring operation executed in accordance with the operation waveform diagram of FIG. 11.

In FIG. 12A, the DRAM word line DWL1 is first selected in the DRAM array. A data block D1 includes the memory cells of multiple bits (i.e., 16 bits in the above embodiment) to be transferred in one transfer operation. Simultaneously with this, an SRAM word line may be selected in the SRAM array. It is necessary only to complete this selection before the transfer operation from the DRAM array to the SRAM array.

Figure 12B:
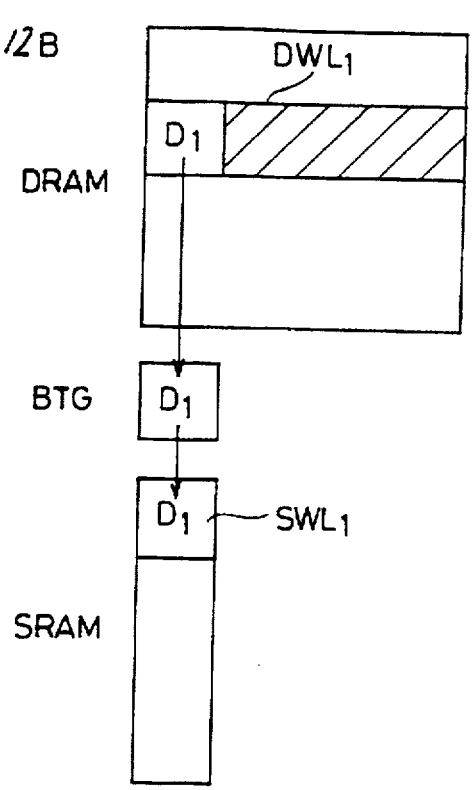

In FIG. 12B, the data block D1 included in the DRAM word line DWL1 in the DRAM array is transferred to the memory cells of the SRAM word line SWL1 in SRAM array through the bidirectional transfer gate BTG.

Figure 12C:
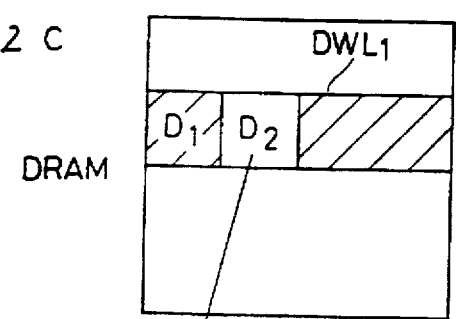

In FIG. 12C, the data block D1 is deselected, and the next word line SWL2 is selected in the SRAM array. In this state, the next data block D2 on the DRAM word line DWL1 selected in the high speed mode is transferred through the bidirectional transfer gate BTG to the memory cells of the SRAM word line SWL2. Thereafter, the data block D2 is deselected, and the SRAM word line SWL2 is deselected.

Figure 12D:
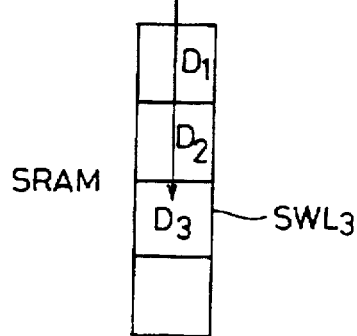

In FIG. 12D, the next data block D3 on the DRAM word line DWL1 is selected also in the high speed mode, and concurrently with this, another SRAM word line SWL3 is selected in the SRAM array. The data block D3 is transferred through the bidirectional transfer gate BTG to the memory cells of the SRAM word line SWL3.

As described above, a large amount of data can be transferred at a high speed to the SRAM using the high speed mode of DRAM. By utilizing this structure, the cache memory can have an increased block size to increase the cache-hit rate, and thereby an efficient cache memory can be implemented. Owing to the high speed transfer of a large amount of data from the DRAM to the SRAM, required data can be always stored in the SRAM which can be accessed at a high speed, so that this semiconductor memory device can be utilized as a memory for image processing in an art field such as a graphic processing field requiring a high speed operational processing.

Figure 13:
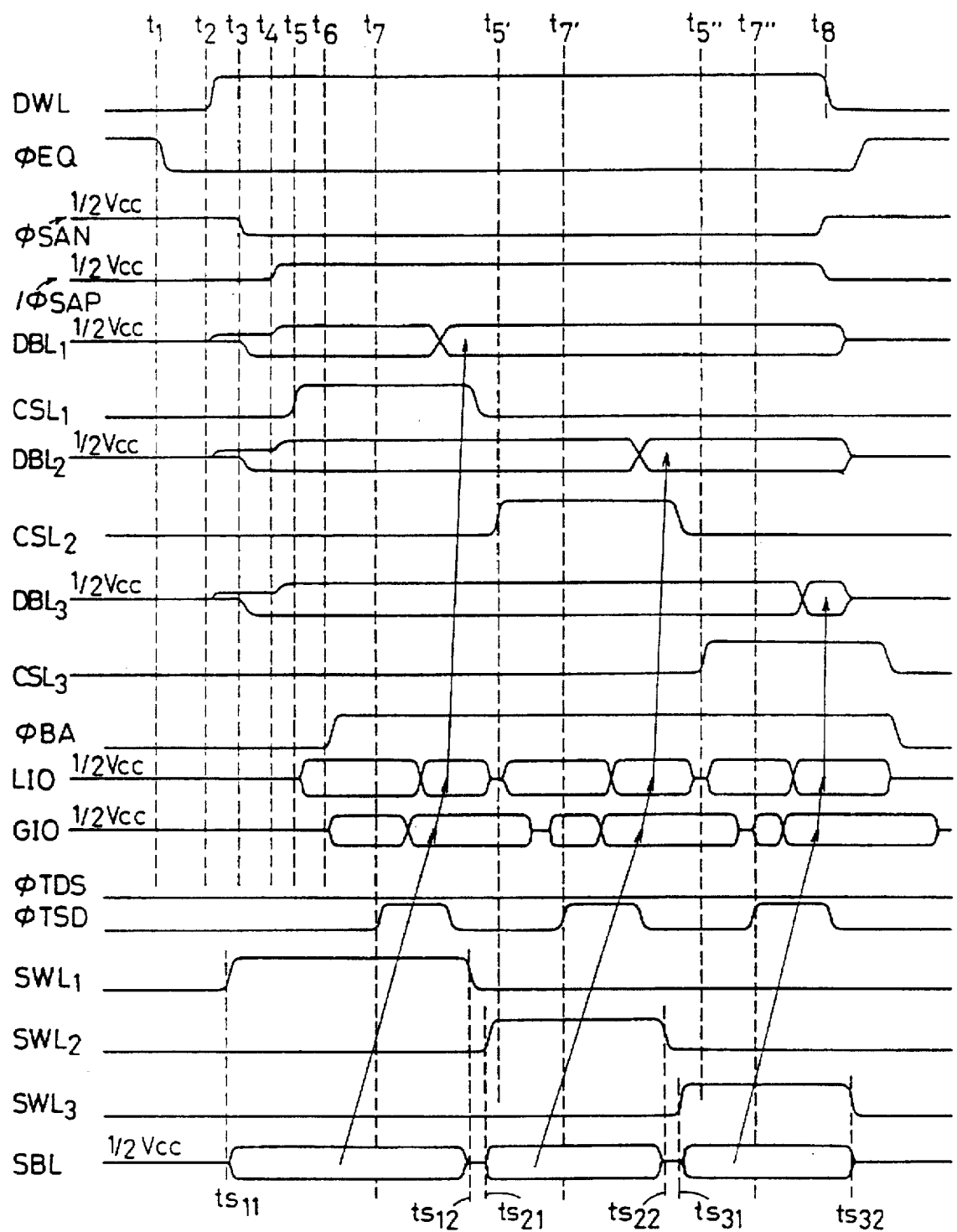
FIG. 13 is a signal waveform diagram showing an operation for transferring data from the SRAM array to the DRAM array in an embodiment of the invention.

FIG. 13 is a signal waveform diagram showing an operation for transferring data from the SRAM array to the DRAM array. The operation waveform diagram of FIG. 13 is similar to the operation waveform diagram of FIG. 11 except for that the data transfer instructing signal $\phi$TSD is generated instead of the data transfer instructing signal $\phi$TDS, and that the data is transferred from the SRAM array to the DRAM array and thus the potentials of DRAM bit line pair DBL vary in accordance with the data transferred from the SRAM array. Therefore, similar operations are carried out, and a plurality of data blocks can be transmitted from the SRAM array to the DRAM array using the high speed mode of DRAM. Transfer of data from the SRAM array to the DRAM array is carried out, for example, in the copy back operation which is required in the cache memory at the time of cache-miss. Even if the block size is large, the data can be transferred at a high speed from the SRAM array to the DRAM array.

FIGS. 14A–14D schematically show the data transfer operation from the SRAM array to the DRAM array. In the data transfer operation shown in FIGS. 14A–14D, which is similar to that shown in FIG. 12 except for the direction of data flow, data of memory cells connected to the selected word line in the SRAM array are handled as one block and data blocks are sequentially transmitted to the block selected at the high speed mode in the DRAM array.

It is assumed that the block size is equal to the number of memory cells in one row of the DRAM array. In the conventional structure, the number of memory cells connected to one row of the SRAM array is equal to the number of memory cells connected to one row of the DRAM array. According to the structure of the invention, however, the memory cells connected to a plurality of rows of the SRAM array can correspond to the memory cells in one row of the DRAM array. Therefore, even in the case where a layout of the DRAM array is changed in accordance with a configuration of a package accommodating this semiconductor memory device, the configuration of the SRAM array can be easily adjusted, and thus the layout on the chip can be easily determined. In the structure for applying data of one block size over multiple rows of the SRAM array, even if the block size is large, the region required for the data transfer is not large, and thus the chip occupying area can be small.

Figure 15:
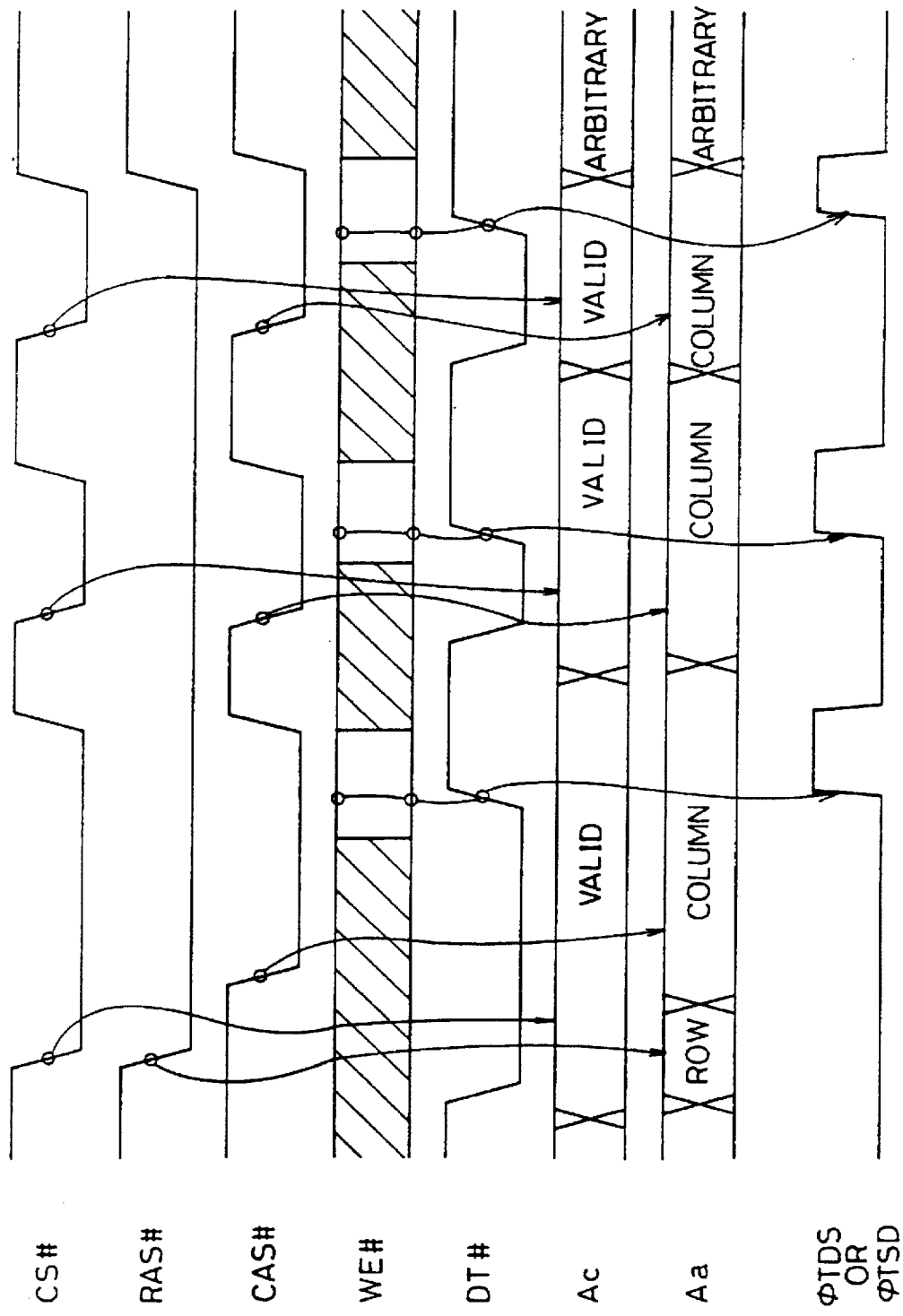
FIG. 15 shows combination of external control signals for performing the data transferring operation in an embodiment of the invention.

FIG. 15 shows states of the external control signals for performing the data transfer. The external control signals shown in FIG. 15 are similar to those shown in FIG. 1 or 5. The signal CS# determines enable/disable of the SRAM array. The signal RAS# determines enable/disable of the DRAM array. The transfer control signal DT# determines whether the data transfer is to be executed or not. The data transfer between the DRAM and SRAM arrays is instructed when the signal DT# falls to "L" prior to the fall of signal CS#, and similarly, the signal DT# is at "L" when the signal CAS# falls. In this case, the operation of SRAM column decoder is prohibited, and the operation of bit decoder (FIG. 4) for finally selecting one-bit memory cell is prohibited in the DRAM. In the data transfer operation, the signal $\phi$TDS and $\phi$TSD is internally generated in response to the rise of transfer control signal DT#. The write control signal WE# determines which data transfer instructing signal $\phi$TDS or $\phi$TSD is to be generated. A relationship is arbitrarily determined between the logical levels of write enable signal WE# and the data transfer instructing signals $\phi$TDS and $\phi$TSD designated thereby.

In the SRAM array part, an external address signal Ac becomes valid and an internal address signal is generated in response to the fall of signal CS#. In the DRAM array part, the address signal Aa is taken in a row address signal and an internal row address signal is generated upon fall of the signal RAS#. Similarly, in the DRAM part, the address signal Aa is taken in a column address signal and an internal column address signal is generated in response to the fall of signal CAS#. Therefore, the signals CS# and CAS# may be fallen to "L" and toggled at the substantially same timing in the data transfer operation, whereby the column selecting operation according to the high speed mode such as a page mode in the DRAM array can be executed concurrently with the word line selecting operation in the SRAM array. In this data transfer operation, the signal RAS# is maintained at the active state of "L". The data transfer cycle can be terminated by raising the signal #RAS to "H" or by setting the transfer instructing signal DT# at "H" when the signals CS# and CAS# fall. If the signal DT# is maintained at "H", the SRAM array or DRAM array is accessed in accordance with the signals CS#, RAS#, CAS# and WE#.

Owing to the conditions of the external control signals set as described above, it is possible to externally set the amount of data to be transferred in one transfer cycle.

"Embodiment 2"

The semiconductor memory device in the embodiment 1 receives external signals CS#, RAS#, CAS# and WE#. If skew or the like generates in a signal, the conditions for timing margin may become severe. For this reason, such structure can be contemplated that external control signals are taken in accordance with a clock signal for performing various internal operations.

Figure 16:
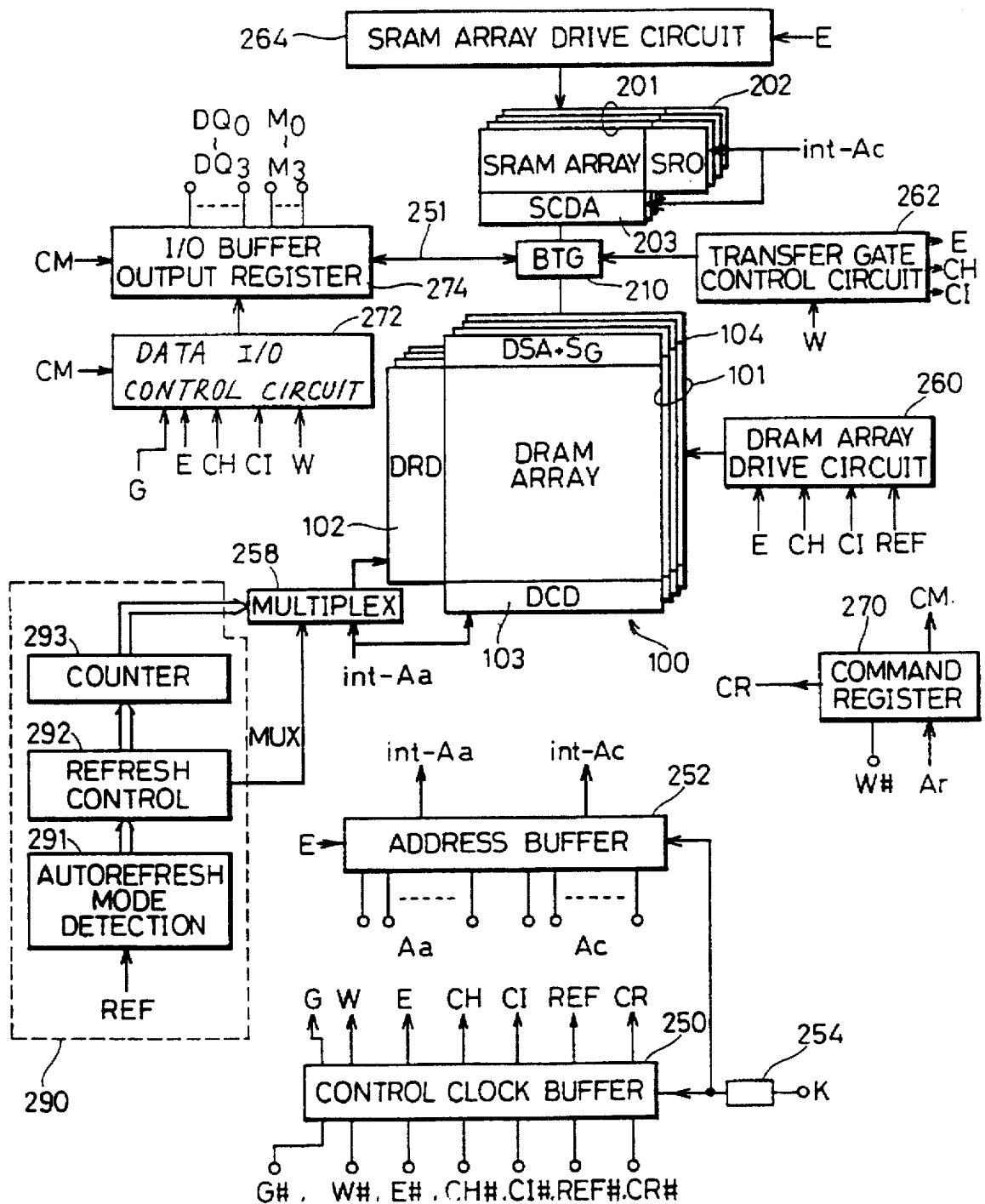
FIG. 16 shows a whole structure of a semiconductor memory device of a second embodiment of the invention.

FIG. 16 shows a whole structure of the semiconductor memory device of the second embodiment of the invention. Referring to FIG. 16, the semiconductor memory device includes a DRAM part 100 and an SRAM part 200. The DRAM part 100 includes a DRAM array 101 of 4 Mbits, a DRAM row decoder block 102 which decodes an applied DRAM internal row address signal to select four rows in the DRAM array 101, a DRAM column decoder block 103 which decodes an applied DRAM internal column address and selects one column in each of the selected four rows in a normal operation mode (i.e., when accessing the DRAM array), DRAM sense amplifiers DSA which sense and amplify the data of memory cells connected to the selected DRAM rows, and selecting gates SG which select 16 bits in a selected row from the DRAM array 101 in the data transfer mode in response to the column selecting signal from the DRAM column decoder block 103 and select the memory cells of 4 bits in the selected rows of the DRAM array 101 in the array access mode (i.e., when accessing the DRAM array). The DRAM sense amplifiers DSA and DRAM selecting gates SG are shown as one block 104. The DRAM array 101 includes four DRAM memory planes each having a storage capacity of 1 Mbits.

The SRAM part 200 includes an SRAM array 201 having a capacity of 16 Kbits, an SRAM row decoder block 202 which decodes an SRAM internal row address signal to select four rows in the SRAM array 201, an SRAM column decoder block which decodes an SRAM internal column address signal to select and connect one bit in each of the selected four rows to the internal data bus 251, and SRAM sense amplifiers which sense and amplify information of the selected SRAM cells in the data reading operation. The SRAM column decoders and SRAM sense amplifiers are shown as one block 203. The SRAM array 201 includes four memory planes each having a capacity of 4 Kbits. One row is selected in each memory plane. This structure is similar to that of the DRAM array 101.

A bidirectional transfer gate circuit 210 is provided between the DRAM part 100 and SRAM part 200. In the operation of directly accessing the DRAM array, the input and output of data to and from the DRAM part 100 are executed through the internal common data bus 251. For this reason, the common data bus 251 shown in the FIG. 16 is coupled to the bidirectional transfer gate circuit 210.

The semiconductor memory device further includes a control clock buffer 250 which receives externally applied control signals G#, W#, E#, CH#, CI#, REF# and CR# and generates internal control signals G, W, E, CH, CI, REF and CR, an address buffer 252 for generating an address signal int-Aa for DRAM and an internal address signal int-Ac for SRAM, and a clock buffer 254 for performing buffer processing on an externally applied clock signal K.

The control clock buffer 250 takes in applied control signals and generates the internal control signals in response to the rise of the internal clock from the clock buffer 254. The clock buffer 254 applies the internal clock also to the address buffer 252. The address buffer 252 takes in the applied address signals Aa and Ac and generates the internal address signals int-Aa and int-Ac when the internal chip enable signal E is active at the rising edge of internal clock K.

The signal CI# is a cache inhibiting signal indicative of inhibition of access to the SRAM array. When the cache inhibiting signal CI# is set at "L", the access to the SRAM array is inhibited, and direct access to the DRAM array (i.e., array access) is allowed. The signal W# indicates the data write mode. The signal E# is a chip select signal indicating that the semiconductor memory device is selected. The signal CR# is a command register instructing signal indicative of a special mode optionally provided in the semiconductor memory device. When the command register instructing signal CR# is at "L", data is written into a command register 270 for setting the special mode (selection of the register).

The signal CH# indicates cache-hit. If the cache-hit signal CH# is at "L", the SRAM array (cache) can be accessed. The signal G# indicates the data output mode, and is applied asynchronously with the clock signal K.

The signal REF# is a signal instructing refresh in the DRAM array 101. When the refresh instructing signal REF# attains "L", auto-refresh of the DRAM array 101 is internally executed in the same cycle.

The semiconductor memory device further includes a refresh circuit 290 for refreshing the memory cells of DRAM array 101. The refresh circuit 290 includes a counter circuit 293 which is activated in response to the internal refresh instructing signal REF to generate a refresh address of the DRAM array 101, a refresh control circuit 292 which is activated in response to the internal refresh instructing signal REF, and an address multiplex circuit 258 which applies one of the refresh address from the counter circuit 253 and the internal row address signal from the address buffer 252 to the DRAM row decoder block 102 in response to a switching signal MUX from the refresh control circuit 292. The refresh circuit 290 further includes an auto refresh mode detecting circuit 291 which detects that the refresh is instructed in response to the refresh instructing signal REF, and applies a refresh request to the refresh control circuit 292.

The semiconductor memory device further includes a DRAM array drive circuit 260 which is responsive to the internal control signals E, CH, CI and REF to generate various control signals required for driving the DRAM part 100, a transfer gate control circuit 262 which is responsive to the internal control signals E, CH and CI to generate signals for controlling the transfer operation of the bidirectional transfer gate control circuit 210, and an SRAM array drive circuit 264 which is responsive to the internal chip select signal E to generate various control signals required for driving the SRAM part 200.

The semiconductor memory device further includes a command register 270 which is activated in response to the internal control signal CR and is responsive to the externally applied write enable signal W# and command address Ar to store a command CM for designating the operation mode of the semiconductor memory device, a data I/O control circuit 272 for controlling input and output of data in accordance with the internal control signals G, E, CH, CI and W as well as the special mode command CM, and an I/O circuit 274 including an I/O buffer and an output register for performing input and output of data to and from the common data bus 251 under the control by the data I/O control circuit 272. The purpose of provision of the output register in the I/O circuit 272 is to implement the special modes such as a latched output mode and a registered output mode of this semiconductor memory device to change data output timing depending on the application.

The command register 270 also determines arrangement of data I/O pins. In FIG. 16, there is shown an arrangement in which the input and output of data are executed through the common pin terminals. Remaining data I/O pins M0–M3 receive signals for masking input data. When one of the mask pins M0–M3 is activated, the mask is set in the write of data through corresponding one of data I/O terminals DQ0–DQ3.

Although the SRAM array 201 and DRAM array 101 each include four memory planes, each memory plane has the same structure as that already described in the embodiment 1. The bidirectional transfer gate circuit also has the same structure. The semiconductor memory device shown in FIG. 16 differs from the structures of the embodiment 1 in that the generation timings of the internal control signals are determined by the external clock signal K. The operations are executed similarly to the embodiment 1 except for that the DRAM array drive circuit 260, transfer gate control circuit 262 and SRAM array drive circuit 264 receive the control signals which are different from those described above, and correspondingly, different circuit structures are employed for decoding received control signals.

In connection with the refresh circuit 290, the multiplex circuit 258 selects the refresh address from the counter circuit 293 and applies the same to the DRAM row decoder block 102 in response to the switching control signal MUX from the refresh control circuit 292. The internal refresh instructing signal REF, is also applied to the DRAM array drive circuit 260. The DRAM array drive circuit 260 is activated and perform the operation related to the row selection in the DRAM array 100 (during the refresh operation) when it receives the internal refresh instructing signal.

Every time the refresh control circuit 292 receives the refresh instructing signal REF, it increments the count of the counter circuit 293 by one upon completion of the refresh. The refresh control circuit 292 inactivates the switching control signal MUX when the refresh is completed. Thereby, the multiplex circuit 258 selects the DRAM internal address signal int-Aa from the address buffer circuit 252 and transmits the same to the DRAM row decoder 102.

Figure 17:
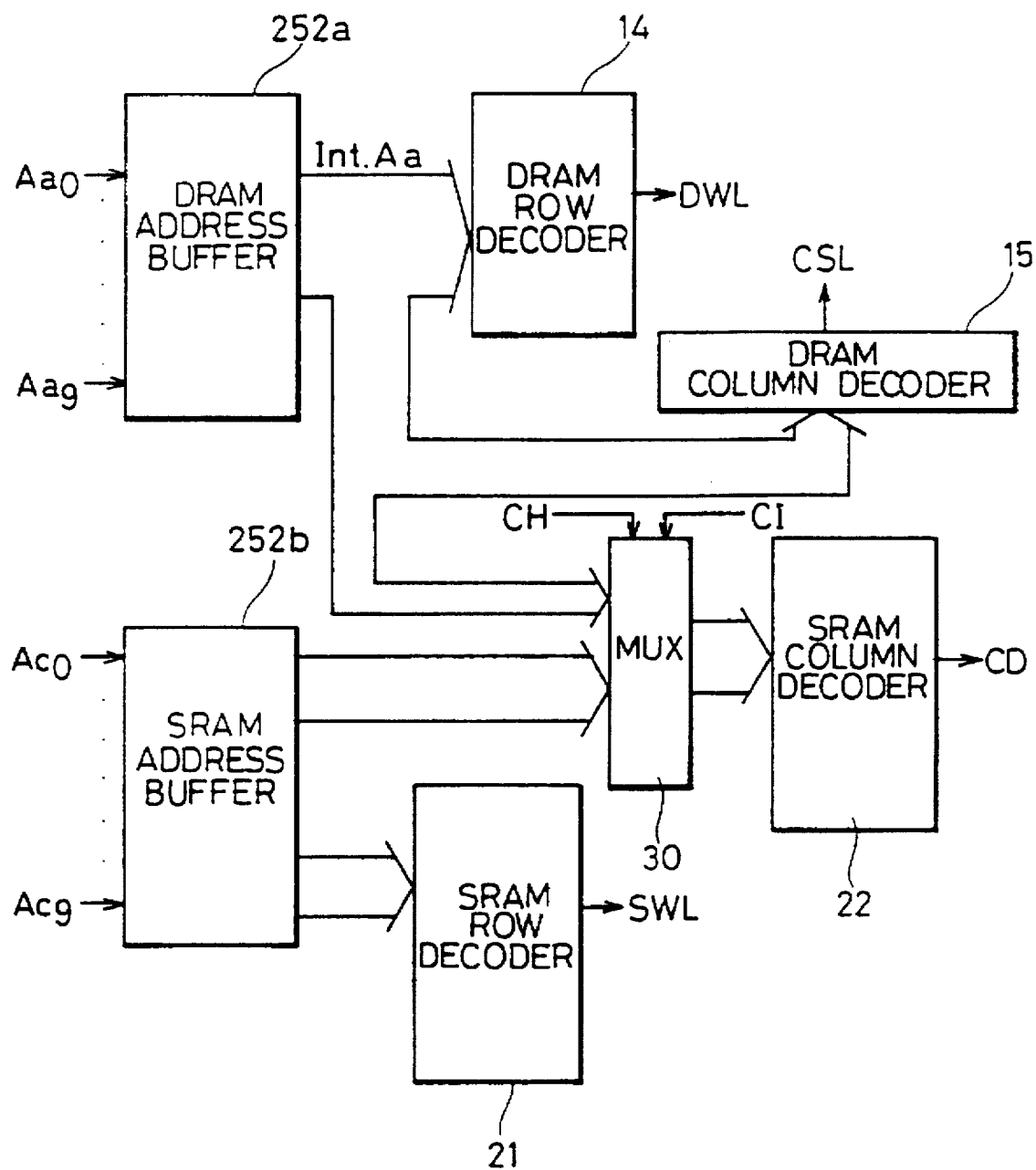
FIG. 17 shows a distribution manner of internal addresses in the semiconductor memory device shown in FIG. 16.

FIG. 17 shows an address distribution scheme. In the structure shown in FIG. 17, the SRAM column decoder 22 is also utilized for selecting a memory bit in the DRAM access operation. The access to the DRAM array is executed through the bit line pairs SBL in the SRAM array or the bidirectional transfer gate circuit 210.

In FIG. 17, a DRAM address buffer 252a receives externally applied DRAM address signals Aa0–Aa9 to generate the internal address signal int.As. The DRAM row decoder 14 decodes the internal row address signal in the internal address signal int.Aa to generate the word line drive signal DWL for selecting a word line in the DRAM array.

The DRAM column decoder 15 receives a part of the external column address signal from the DRAM address buffer 252a and generates the signal CSL for selecting a column selecting line in the DRAM array. The remaining part of the internal column address signal from the DRAM address buffer 252a is applied to the multiplexer 30. The multiplexer 30 passes either a part of the internal column address from the DRAM address buffer 252a or the internal column address signal from the SRAM address buffer 252b in response to the cache-hit instructing signal CH and the DRAM array access instructing signal CI. As will be described later, when the cache-hit instructing signal CH is generated, the access to the SRAM array is allowed, and the access to the DRAM array for writing and reading external data is prohibited. When the DRAM array access instructing signal (cache inhibiting signal) CI is generated, the external access to the DRAM array, i.e., write and read of external data are allowed.

The output of multiplexer 30 is applied to the SRAM column decoder 22. The internal row address signal of the SRAM address buffer 252b is applied to the SRAM row decoder 21. The SRAM row decoder 21 decodes the applied row address signal to generate the SRAM word line drive signal SWL for selecting a word line in the SRAM array. The SRAM column decoder 22 generates the column selecting signal CD, which has a function as the column selecting signal for the SRAM array as well as a function of selecting memory cells in the DRAM array.

The multiplexer 30 selects and transmits the internal column address signal from the SRAM address buffer 252b to the SRAM column decoder 22 when the signal CH is generated. When the DRAM array access instructing signal (cache inhibiting signal) CI is generated, the multiplexer 30 selects and transmits the internal address signal from the DRAM address buffer 252a to the SRAM column decoder 22.

FIG. 18 shows in a table form the correlation between the states of external control signals of the semiconductor memory device shown in FIG. 16 and the operations executed thereby. The operation modes of the semiconductor memory device are determined by the combination of states of the external control signals E#, CH#, CI#, CR#, W# and REF# at the time of rise of the external clock signal K. In FIG. 18, "H" indicates the signal potential at the high level, "L" indicates the signal potential at the low level, and "X" indicates an arbitrary state (don't care state). As shown in FIG. 18, there are several operation modes of the semiconductor memory device, i.e., a standby mode for maintaining the semiconductor memory device in the standby state, an array refresh mode for auto-refreshing the DRAM array, a transfer mode for transferring data between CPU (central processing unit) and cache (SRAM), a transfer mode for transferring data between CPU and array, block transferring modes I and II for transferring data between the cache (SRAM) and array (DRAM), and a mode for setting a special mode in a command register (this setting of special mode is executed by CPU). The write enable signal W# is shown as "H"/"L" during the transfer of data between CPU and a command register by the reason that, in this mode, the write enable signal W# is set at "H" or "L" and both the states of "H" and "L" are used for designating a certain special mode.

Among the operation modes shown in FIG. 18, the modes I and II for transferring data between the cache and array are used in this embodiment.

In the invention, the block transfer of data between the SRAM array and DRAM array is carried out. The data transfer mode is classified into two types in which (i) only one data block is transferred (ii) and a plurality of data blocks are transferred. The data transfer between the SRAM array and DRAM array is designated by setting the signals # E and CH# at "L" and "H", respectively.

More specifically, transfer of one data block from the DRAM array to the SRAM array (cache) is executed by setting the signal #E at "L" and setting all the signals CH#, CI#, CR#, W# and REF# at "H". If the signals E# and W# are set at "L" and the signals CH#, CI#, CR# and REF# are set at "H", data of one block is transferred from the SRAM (cache) to the DRAM array (array). In this state, the row and column addresses are internally taken in a time division multiplexing manner and the operation of selecting the rows and columns is executed in the DRAM part.

In the case of sequentially selecting a plurality of blocks, the signals E#, CI# and CR# are set at "L", and the signals CH#, W# and REF# are set at "H". In this state, a word line is newly selected in the SRAM array, and, in the DRAM array part, a column address signal is taken in for executing the new column selecting operation, so that the data is transferred from the DRAM array to the SRAM array. When the signals E#, CI#, CR# and W# are set at "L", and the signals CH# and REF# are set at "H", only the column address signal is taken in the DRAM array, another data block connected to the selected row is selected, and the data is transferred from the SRAM array to the DRAM array. Thus, in the table shown in FIG. 18, the cache-array II is used so as to execute such operations that, after the execution of cache-array I, only the column address signal is taken in the DRAM and a word line is newly selected in the SRAM array.

Figure 19:
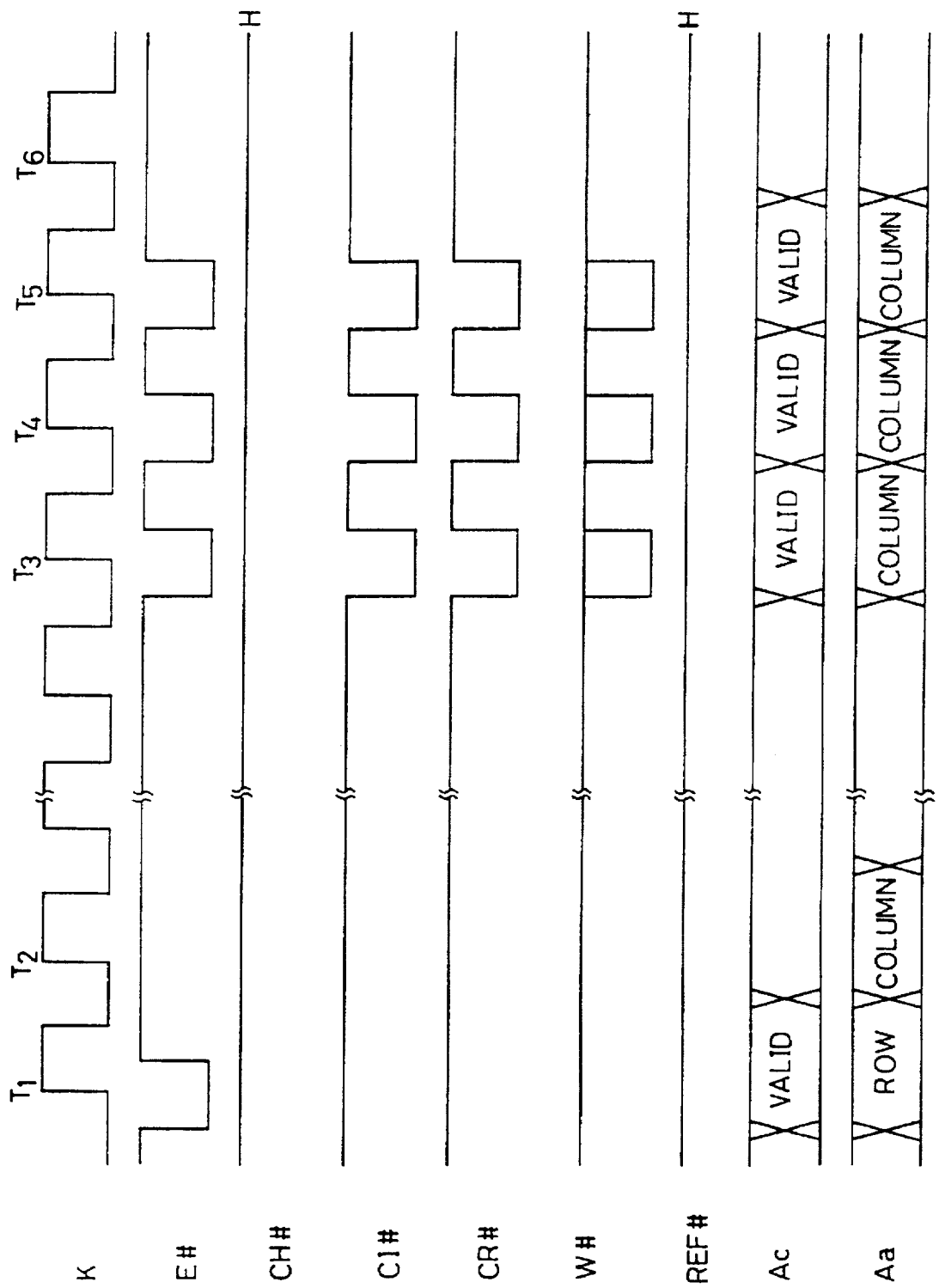
FIG. 19 shows states of the external control signals for performing the data transferring operation in a second embodiment of the invention.

FIG. 19 is a signal waveform diagram showing states of the external control signals during transfer of data between the SRAM array and DRAM array. Now, control of the data transferring operation by the external control signals will be described below with reference to FIG. 19.

At time T1 of rise of the external clock signal K, the signal E# is set at "L", and the signals CH#, CI# and CR# are set at "H". This designates the data transfer between the SRAM array and DRAM array. The direction of the data transfer depends on the set state i.e., "L" or "H" of the signal W#. If the signal W# is at "H", the data is transferred from the DRAM array to the SRAM array. If the signal W# is at "L", the data is transferred from the SRAM array (cache) to the DRAM array (array).

In accordance with the combination of signal states at time T1, the address buffer for SRAM takes in the SRAM address signal Ac as a valid signal, so that row selecting operation is executed in the SRAM array. During this operation, the operation of SRAM column decoder is prohibited. Meanwhile, in the DRAM, the internal row address signal is generated from the external address signal Aa in response to the rise of clock signal K at time T1, and thereafter the internal column address signal is generated from the address signal Aa at time T2. Thereby, the selections of the row and column line are executed in the DRAM array.

In this state, the signals E#, CI# and CR# are set at "L" again and the signals CH# and REF# are set at "H" at time T3 after the elapsing of a predetermined time period. Responsively, the row selecting operation is executed again in accordance with the external address signal Ac in the SRAM part, and, in the DRAM array part, the applied address signal is taken in as the column address signal and the operation of selecting a column selecting line is executed. In this operation, the direction of the data transfer between the SRAM array and DRAM array depends on the signal W#. Thereafter, predetermined signal states are set at times T4 and T5, i.e., at points of rise of the clock signal K, so that the row selecting operation is executed in the SRAM array part, and, in the DRAM array, the new operation of selecting a column selecting line is executed as long as the row is in the selected state.

At time T6, i.e., at a point of rise of the clock signal K, all the signals are set at "H", whereby the semiconductor memory device completes the data transfer and returns to the standby state. The time T3 must be delayed from the time T1 by a time period which is required for completing the row and column selecting operations in the DRAM array and completing the data transfer. The SRAM array operates at a high speed and can be accessed in each cycle of the clock signal K, while the DRAM array requires the precharge operation and other, and cannot be accessed at a high speed. By this reason, the above time period is required.

Figure 20:
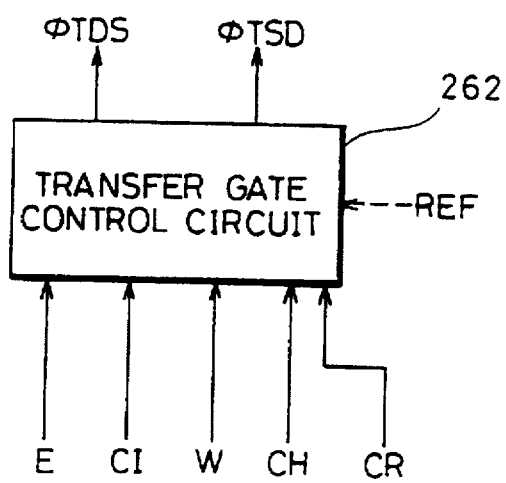
FIG. 20 functionally shows a circuit structure for generating transfer gate control signals in the second embodiment of the invention.

FIG. 20 functionally shows the transfer gate control circuit 262. In FIG. 20, the transfer gate control circuit 262 is responsive to the internal control signals E, CI, W, CH and CR to generate the signals øTDS and øTSD for controlling the transfer operation of the bidirectional transfer gate circuit 210 (reference number 3 in FIGS. 1 and 5, and reference characters BTG in FIG. 8). The transfer control circuit 262 does not generate the transfer control signals øTDS and øTSD if the cache-hit signal CH is in the active state of "L". When the chip enable signal E is active and the cache-hit signal CH is in the inactive state of "H", the transfer gate control circuit 262 generates the transfer control signal øTDS or øTSD at a predetermined timing in accordance with the combination of states of the remaining control signals.

Such a structure may be additionally provided that the internal refresh instructing signal REF is applied to the transfer gate control circuit 262 and that the transfer gate control circuit 262 is deactivated when the internal refresh instructing signal REF is applied thereto. Since the refresh instructing signal REF# is externally applied, it is not particularly necessary to receive the refresh instructing signal REF provided that an external specification is determined to prevent generation of the array access instructing signal (cache inhibiting signal) CI during refreshing. In the case where the refresh has been executed in the DRAM array, however, it is necessary to ensure electrical isolation of the SRAM array from the DRAM array. Therefore, by providing the structure in which the transfer gate control circuit 262 is disabled in response to the internal refresh instructing signal REF, the SRAM array and DRAM array are electrically isolated from each other in the refresh operation reliably, and the SRAM array can be externally accessed without malfunction.

Such structure of the transfer gate control circuit 262 may be achieved by a structure in which the transfer gate control circuit 262 is disabled if either of the cache-hit signal CH or refresh instructing signal REF is active. Preferably, such structure may be achieved by provision of a gate circuit in which the transfer gate control circuit 262 is disabled when the chip enable signal E is inactive or either the cache-hit signal CH or the refresh instructing signal REF is active. In the cases other than the above, the data transfer instructing signals øTDS and øTSD are generated at a predetermined timing in accordance with the control signals CI, CR and W.

Figure 21:
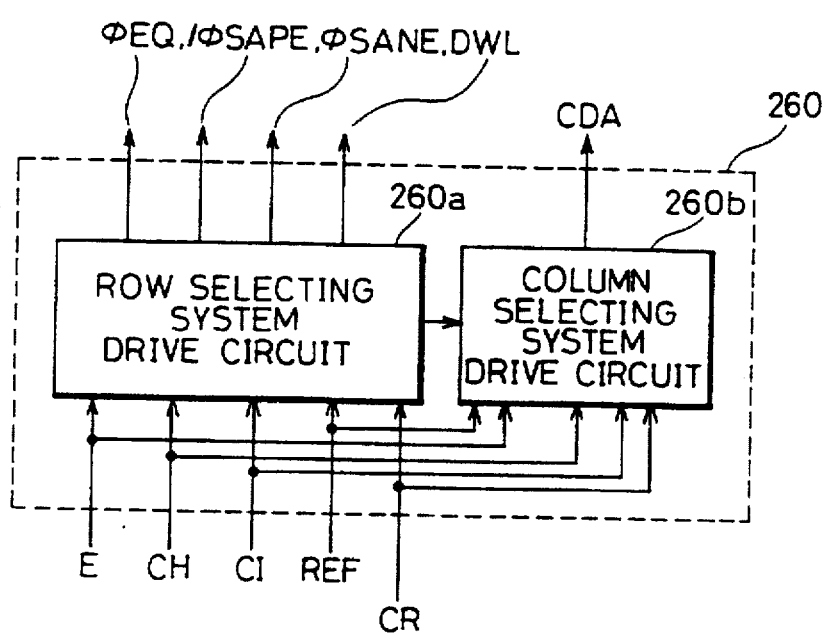
FIG. 21 functionally shows a circuit structure for driving a DRAM array in the second embodiment of the invention.

FIG. 21 functionally shows a structure of the DRAM array drive circuit shown in FIG. 16. In FIG. 21, the DRAM array drive circuit 260 includes a row selecting system drive circuit 260a which drives circuits related to the row selection in the DRAM array, and a column selecting system drive circuit 260b which drives circuits related to the column selection of the DRAM array 101. The row selecting system drive circuit 260a is responsive to the internal control signals E, CH, CI, CR and REF to generate various control signals øEQ, /øSAPE, øSANE and DWL at respectively predetermined timings. In this operation, an internal control signal int.RAS may be generated for the purpose of taking in the row address signal for DRAM. The column selecting system drive circuit 260b generates a signal CDA (corresponding to the internal control signal int.CAS) for driving the DRAM column decoder 15 at a predetermined timing in response to the control signals E, CH, CI, CR and REF.

The column selecting system drive circuit 260b generates the signal CDA for activating the column decoder at a predetermined timing when the row selecting system drive circuit 260a is active and the refresh instructing signal REF is inactive. The column selecting system drive circuit 260b is disabled when the row selecting system drive circuit 260a is deactivated and the refresh instructing signal REF is activated. In this state, the column selecting operation is prohibited in the DRAM array. The row selecting system drive circuit 260a is active when the signal E is active, the semiconductor memory device is in the selected state and the signal CH is in the inactive state of "H".

If the signal REF is activated, the row selecting system drive circuit 260a is activated. By applying the refresh instructing signal REF to the DRAM array drive circuit 260, the refresh operation in DRAM array is executed independently from the access operation of SRAM array upon activation of the internal refresh instructing signal REF.

Figure 22:
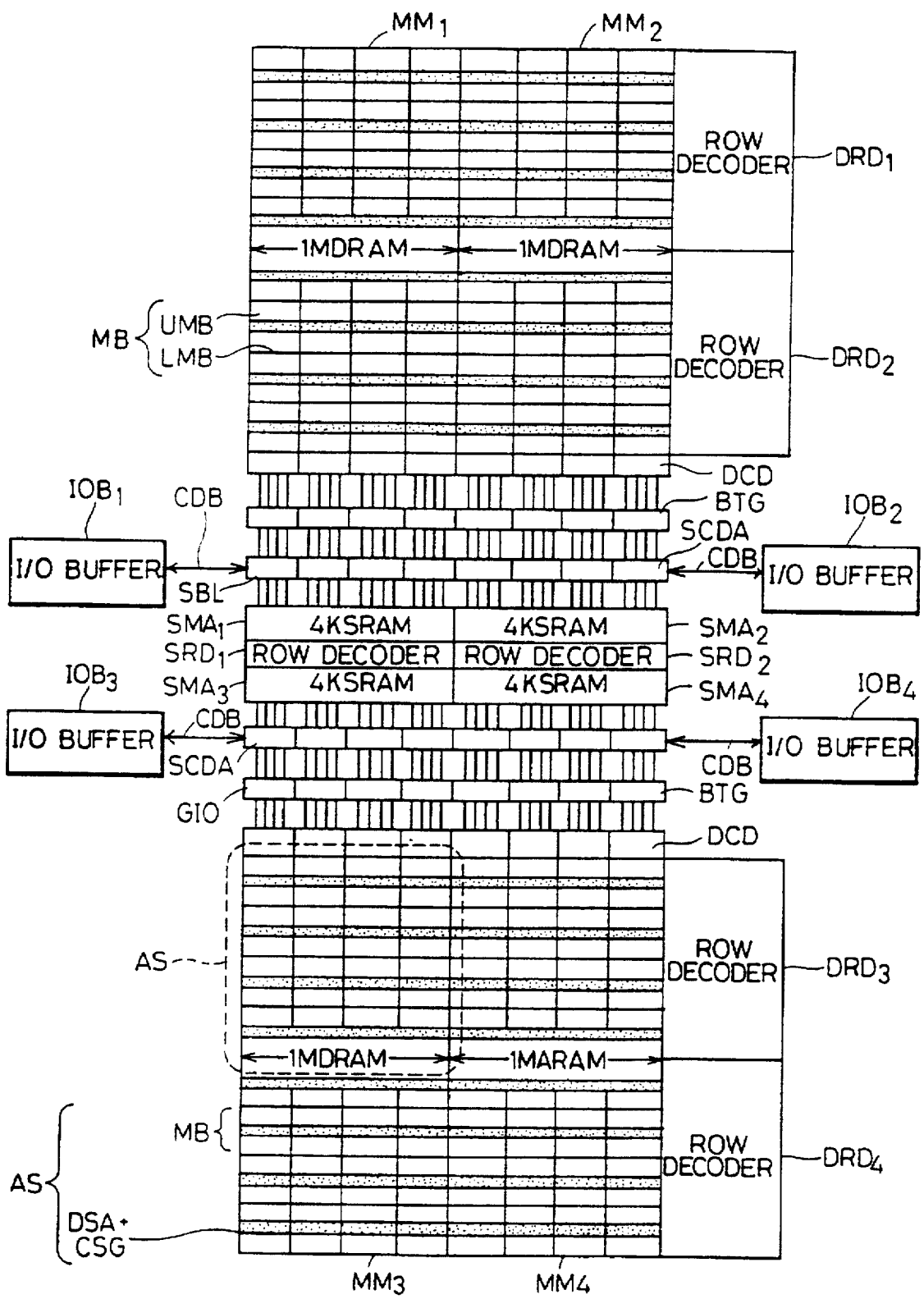
FIG. 22 shows an array arrangement in a modification of the semiconductor memory device of the second embodiment of the invention.

FIG. 22 shows a layout of the semiconductor memory device of another embodiment of the invention. The semiconductor memory device shown in FIG. 22 includes a DRAM array of 4 Mbits and an SRAM array of 16 Kbits. Thus, the semiconductor memory device shown in FIG. 22 includes four planes, each of which is formed of the same semiconductor memory device as that shown in FIG. 1 or 5.

In FIG. 22, the semiconductor memory device includes four memory mats MM1, MM2, MM3 and MM4 each having a memory capacity of 1 Mbit. Each of the DRAM memory mats MM1–MM4 includes memory cells arranged in 1024 rows (word lines) and 512 columns (bit line pairs). Each of the DRAM memory mats MM1–MM4 is divided into 32 memory blocks MB having a structure of 128 columns (bit line pairs) and 256 rows (word lines).

Each memory mat MM ("MM" representatively indicating the memory mats MM1–MM4) is divided into four memory blocks in the row direction, and is divided into eight memory blocks in the column direction. The memory mat of 1 Mbits is divided in a manner different from that of the semiconductor memory device shown in FIGS. 1 and 5, i.e., into eight in the column direction and four in the row direction, as shown in FIG. 22, for the purpose of accommodating the semiconductor memory device in a rectangular package.

Each memory block MB is provided with a DRAM sense amplifier DSA and a column selecting gate CSG correspondingly to the DRAM bit line pairs DBL at a central position in the column direction. The memory block MB is divided into an upper memory block UMB and a lower memory block LMB with the sense amplifier DSA and column selecting gate CSG therebetween. In operation, one of the upper and lower memory blocks UMB and LMB is connected to the sense amplifier DSA and column selecting gate CSG. The address (row address) determines which memory block, i.e., upper memory block UMB or lower memory block LMB is to be connected to the sense amplifier DSA and column selecting gate CSG. The above structure, in which each memory block is divided into the two, i.e., upper and lower memory blocks UMB and LMB and, only one memory block is connected to the sense amplifier DSA and column selecting gate CSG, is usually used in a dynamic random access memory (DRAM) of a shared sense amplifier structure of 4 Mbits or more.

Each memory mat MM includes two activation sections AS. In the activation section AS, one word line is selected. Thus, in the structure shown in FIG. 22, one word line in the structure shown in FIG. 1 is divided into two for respective activation sections. Therefore, selection of one word line in one memory mat MM is equivalent to selection of one word line in each activation section AS.

The semiconductor memory device further includes four DRAM row decoders DRD1, DRD2, DRD3 and DRD4 for selecting one word line in each of the four DRAM memory mats MM1–MM4. The DRAM row decoders DRD1–DRD4 each select one word line in the memory mats MM1–MM4. In the semiconductor memory device shown in FIG. 22, therefore, four word lines are simultaneously selected. The DRAM row decoder DRD1 selects one row in each of the corresponding activation sections in the memory mats MM1 and MM2. The DRAM row decoder DRD2 selects one row in each of the activation sections located in lower portions in FIG. 22 of the memory mats MM1 and MM2. The DRAM row decoders DRD3 and DRD4 each select one row in the activation sections AS in the corresponding portions, i.e., upper and lower portions in FIG. 22, of the DRAM memory mats MM3 and MM4.

The semiconductor memory device further includes DRAM column decoders DCD for selecting two columns (bit line pairs) in each column block in the DRAM memory mats MM1–MM4. The column selecting signal is transmitted from the DRAM column decoder DCD to the column selecting line CSL shown in FIG. 1. The column selecting line CSL extends through one of the memory mats MM so that it is commonly used by the upper and lower activation sections AS. More specifically, in the structure shown in FIG. 22, the column selecting signal from the DRAM column decoder DCD selects four columns in one column block which is formed of eight memory blocks divided in the column direction in the structure shown in FIG. 22.

The column selected by the DRAM column decoder DCD is connected to the corresponding global I/O line pair GIO through the local I/O line pair. Two global I/O line pairs extending in the column direction are provided for each column block in each activation section AS. The global I/O line pair is arranged in a word line shunt region, which is a region for connecting polysilicon word lines to low-resistance metal interconnection layers, e.g., of aluminum upper layer. The word line drive signal is transmitted to the low resistance metal interconnection layer. This suppresses the delay of signal transmission which may be caused if the polysilicon word lines are long.

The global I/O line pair GIO, which is provided for the activation section AS remote from the DRAM column decoder DCD passes through the activation section AS near the same DRAM column decoder DCD without connection. Therefore, four global I/O line pairs are disposed for each column block in the activation section AS near the DRAM column decoder DCD.

The semiconductor memory device further includes SRAM array blocks SMA1–SMA4 each having a storage capacity of 4 Kbits. Each of the SRAM array block SMA1–SMA4 includes SRAM cells arranged in 256 rows and 16 columns. There are provided two SRAM row decoders SRD1 and SRD2, each of which is commonly used by and disposed between two SRAM array blocks. The SRAM row decoder SRD1 is commonly used by the SRAM array blocks SMA1 and SMA3. The SRAM row decoder SRD2 is commonly used by the SRAM array blocks SMA2 and SMA4. In the SRAM array arrangement shown in FIG. 22, the bit lines are arranged perpendicular to the global I/O line pairs GIO. Therefore, bit line lead lines extend perpendicularly to the SRAM bit line pairs from the SRAM bit line pairs to the bidirectional transfer gates BTG.

The semiconductor memory device shown in FIG. 22 performs the input and output of data in units of four bits, and for this purpose, it includes four I/O buffer circuits IOB1, IOB2, IOB3 and IOB4. The I/O buffer circuits IOB1–IOB4 are connected to the SRAM sense amplifier and column decoder blocks SCDA through the common data bus (internal data bus). In the structure shown in FIG. 22, the input and output of data are performed through the SRAM sense amplifier and column decoder blocks SCDA. However, such a structure may be employed that the data is input and output through the part of bidirectional transfer gates BTG.

In operation, one DRAM word line is selected in each activation section AS. Only the row blocks including the selected DRAM word lines are activated. The remaining row blocks maintain the precharge state. In the selected row blocks, only the small blocks UMB (or LMB) including the selected word lines are connected to the DRAM sense amplifiers DAS and column selecting gates CSG, and the other small memory blocks LMB (or UMB) are disconnected from the DRAM sense amplifiers DSA and column selecting gates CSG. Therefore, ⅛ of the bit lines are activated (charged and discharged) as a whole. The above partial activation can reduce the power consumption caused by the charge and discharge of the bit lines. Since each memory block MB is divided into the two small memory blocks UMB and LMB, and the DRAM sense amplifier DSA is arranged therebetween, so that the bit lines can be short and a ratio Cb/Cs between the bit line capacitance Cb and the memory capacitor capacitance Cs can be small. Therefore, a sufficient read voltage can be obtained at a high speed.

In each activation section AS, the sensing operation is executed in the four small blocks UMB (or LMB) in the row direction. In each activation section AS, the column selecting signal from the DRAM column decoder DCD selects two pairs of bit lines in one column block. The global I/O line pair GIO extends in the column direction and is commonly used by the memory blocks of the column block in each activation section AS. In each activation section AS, two pairs of bit lines are selected in each column block and are connected to the corresponding two global I/O line pairs GIO. One bidirectional transfer gate BTG is connected to four global I/O line pairs GIO. Four bidirectional transfer gates BTG are provided for each memory mat MM. Therefore, each memory mat MM includes 16 global I/O line pairs GIO connected to the SRAM bit line pairs SBL of the corresponding SRAM array.

Meanwhile, the SRAM row decoders SRD decode the SRAM row address signal to select one of the 256 SRAM word lines SWL in each SRAM array SMA. The SRAM cells of 16 bits connected to the selected SRAM word line SWL are connected to the corresponding SRAM bit line pairs SBL. The SRAM bit line pairs SBL are connected to the corresponding bidirectional transfer gates BTG, respectively. Thereby, data of 16 bits can be transferred between one DRAM memory mat MM and one SRAM array block SMA.

In the case where the semiconductor memory device having the array arrangement shown in FIG. 22 is used as a memory containing a cache, i.e., in the case where the SRAM is used as a cache and the DRAM is used as a main memory, it is necessary to increase the number of bidirectional transfer gates BTG for increasing the block size of the cache. In this case, the region, in which the bidirectional transfer gates BTG and global I/O line pairs GIO are arranged, projects beyond the region in which the DRAM array and SRAM array are arranged, resulting in a low chip utilizing efficiency.

However, by executing the data transfer between the SRAM array and the DRAM array using the high speed mode of the DRAM as described above, the block size of the cache can be increased without increasing the region in which the bidirectional transfer gates and the global I/O line pairs GIO are disposed.

"Embodiment 3"

In the embodiments 1 and 2 described above, data is transferred between the DRAM array and SRAM array through the buffer circuit. If there is a difference in the drive power between the SRAM sense amplifier, which is provided for each SRAM bit line pair, and the DRAM sense amplifier, the data can be transferred from the DRAM array to the SRAM array or vice versa without using the buffer circuit.

In the above embodiments 1 and 2, the DRAM data and the SRAM data are input and output through the same pin terminal. However, different pin terminals may be provided for the DRAM data and the SRAM data, respectively.

Figure 23:
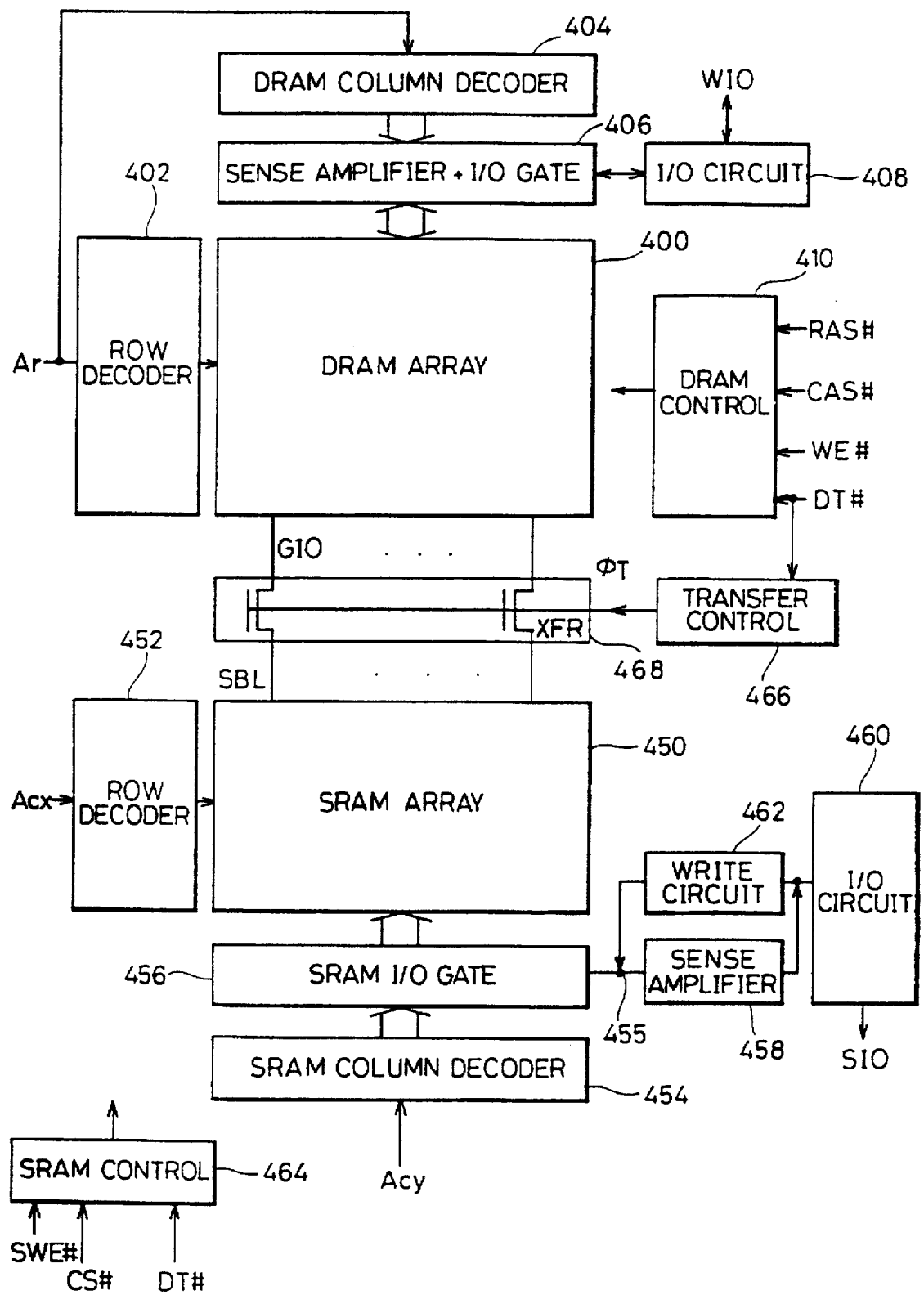
FIG. 23 shows a whole structure of a semiconductor memory device of a third embodiment of the invention.
Figure 26:
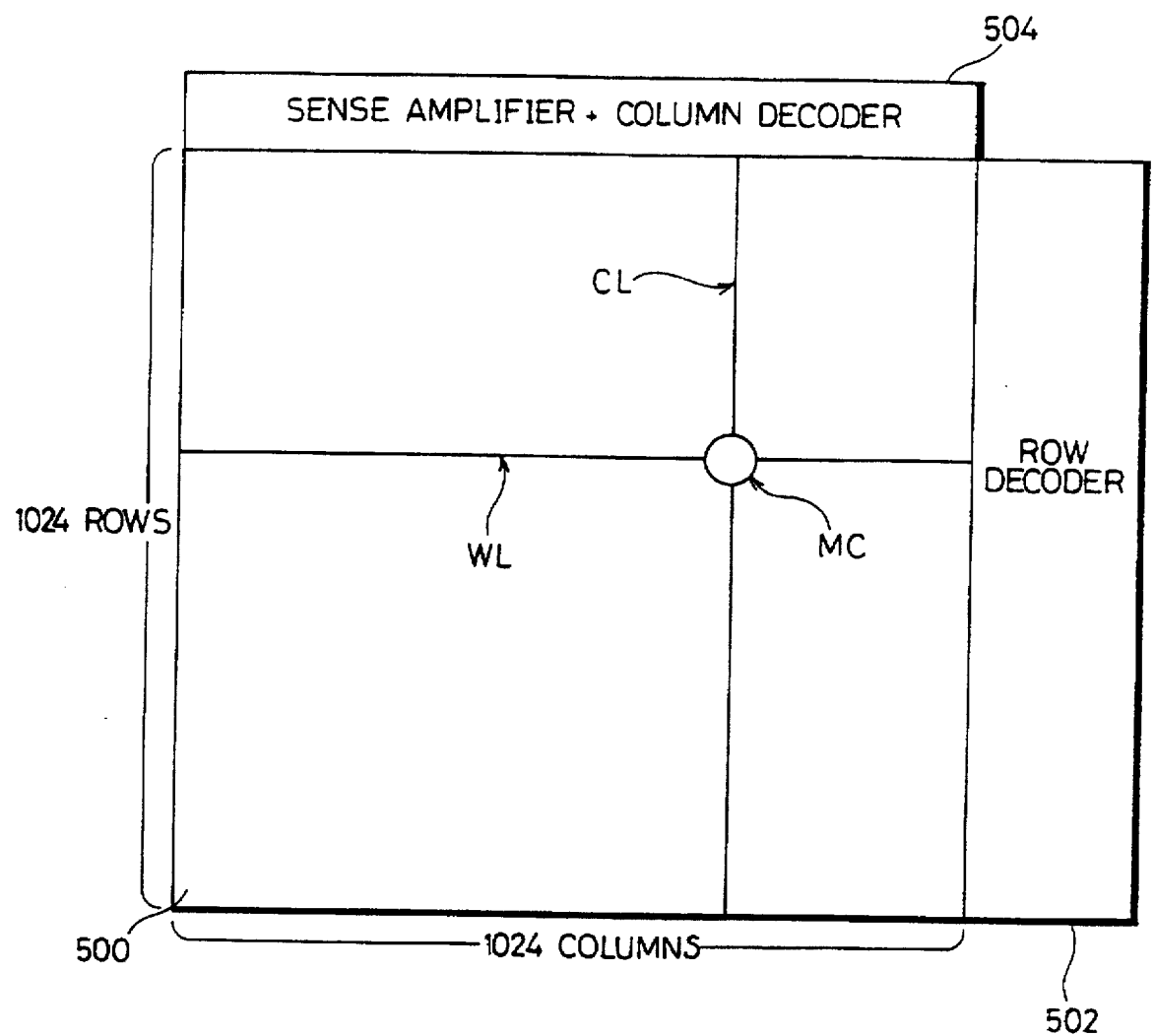
FIG. 26 shows an array arrangement in a semiconductor memory device in the prior art.
Figure 27:
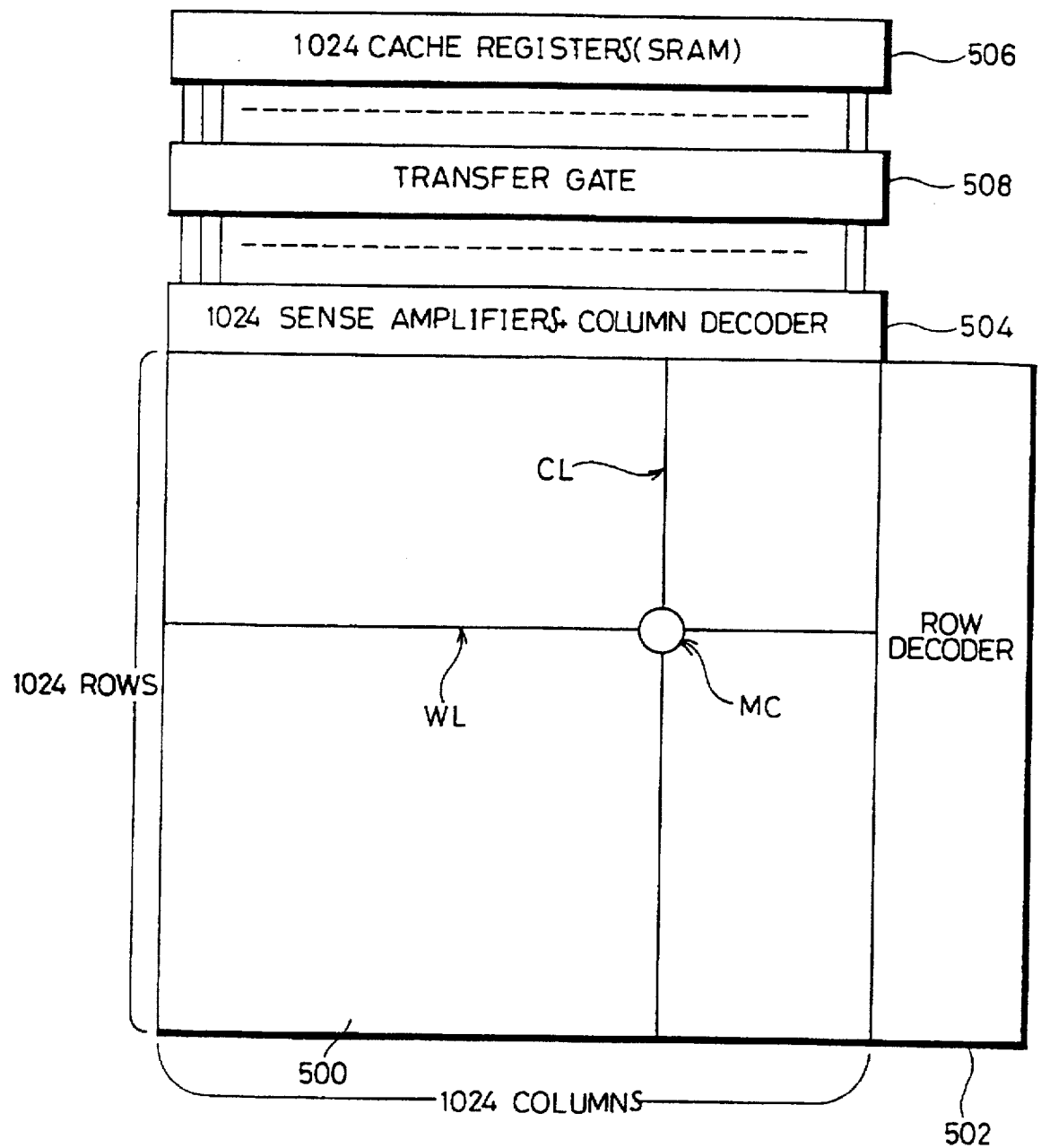
FIG. 27 shows an array arrangement in a semiconductor memory device containing a cache in the prior art.
Figure 28:
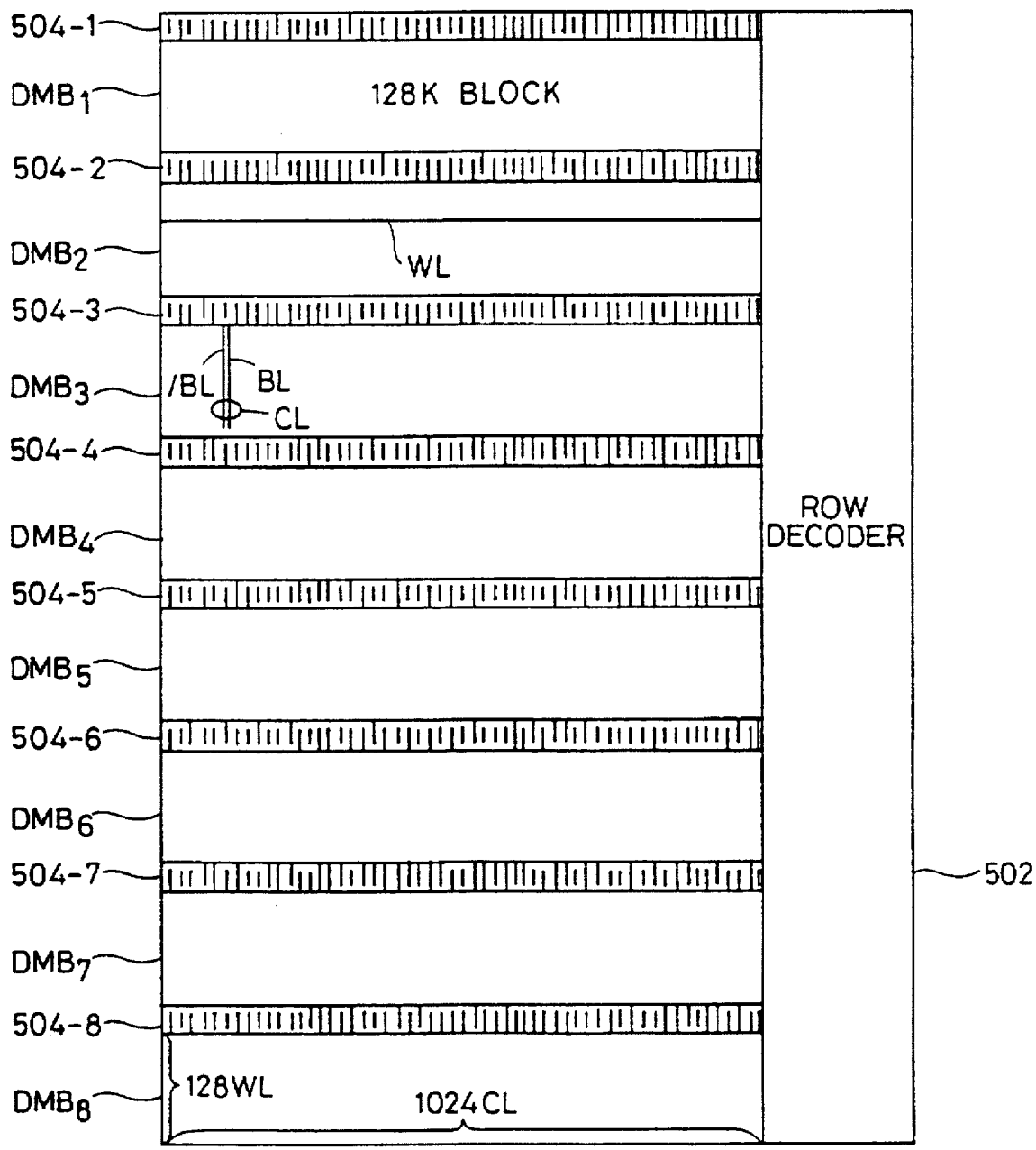
FIG. 28 shows a layout of memory cell arrays in the semiconductor memory device in the prior art.
Figure 29:
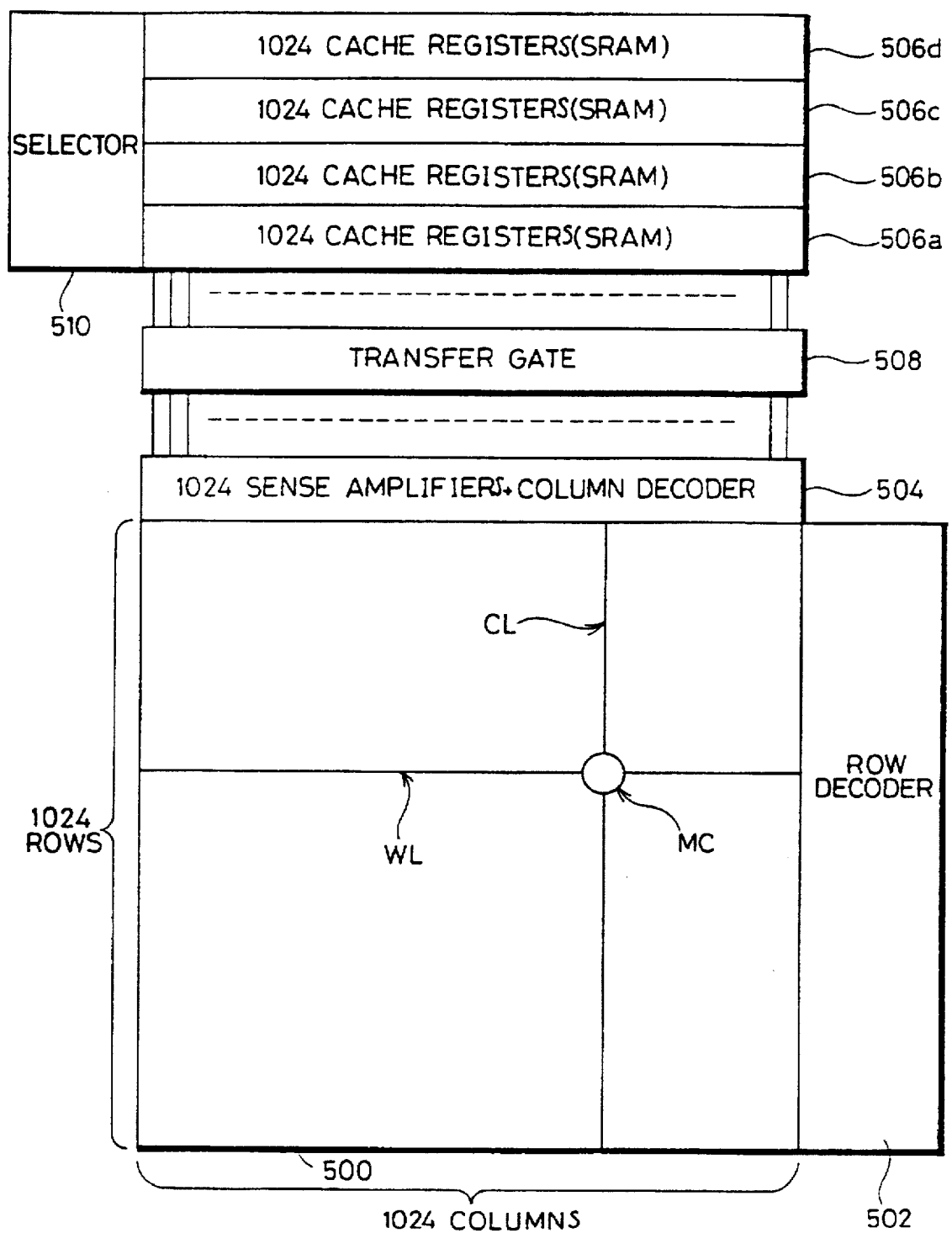
FIG. 29 shows another example of the structure of semiconductor memory device internally provided with a cache in the prior art.

FIG. 23 shows a whole structure of the semiconductor memory device of the third embodiment of the invention. The semiconductor memory device shown in FIG. 23 is provided with different ports (DRAM and SRAM ports) for accessing the DRAM array 400 and an SRAM 450, respectively. The DRAM array 400 and the SRAM array 450 are accessed independently from each other.

Referring to FIG. 23, the semiconductor memory device includes a row decoder 402 which decodes an externally applied address signal Ar to select a row in the DRAM array 400, a DRAM column decoder 404 which decodes the address signal Ar to select a column in the DRAM array 400, sense amplifiers sensing and amplifying the potentials of respective bit line pairs in the DRAM array 400, and I/O gates for connecting a selected column in the DRAM array 400 to an I/O circuit 408 in response to the column selecting signal from the DRAM column decoder 404. The I/O gates and the sense amplifiers are represented by a block 406. Input and output of DRAM data WIO is performed through the I/O circuit 408. The DRAM port can be accessed in units of arbitrary number of bits. The DRAM port includes a DRAM control circuit 410 which generates various control signals required for the operations of DRAM in response to a row address strobe instructing signal RAS#, column address strobe instructing signal CAS#, write enable instructing signal WE# and transfer instructing signal DT#.

The SRAM port includes a row decoder 452 which decodes an address signal Acx to select the row in the SRAM array 450, an SRAM column decoder 454 which decodes an address signal Acy to generate a signal for selecting a column in the SRAM array 450, and an SRAM I/O gate 456 which connects the selected column in the SRAM array 450 to an SRAM internal data line 455 in response to the column selecting signal from the SRAM column decoder 454.

The SRAM port further includes a sense amplifier 458 which amplifies data appearing on the SRAM data line 455, a write circuit 462 which amplifies write data sent from the I/O circuit 460 and transmits internal write data onto the SRAM internal data line 455, and an SRAM control circuit 464 which generates control signals required for operations of the SRAM port in accordance with the data transfer instructing signal DT#, SRAM access instructing signal CS# and SRAM write enable signal SWE#.

The DRAM array 400 and SRAM array 450 have the same structures as those of the semiconductor memory device shown in FIG. 1 or 5.

The semiconductor memory device further includes a transfer control circuit 466 which generates a data transfer instructing signal $\phi T$ in accordance with the write instructing signal WE# and the data transfer instructing signal DT#, and a transfer circuit 468 which is responsive to the transfer instructing signal $\phi T$ to connect the global I/O line pairs GIO extending from the DRAM array 400 and the SRAM bit line pairs SBL extending from the SRAM array 450 to each other. The transfer circuit 468 includes switching transistors (or transmission gates) XFR connecting the global I/O lines and the SRAM bit lines to each other. The transfer circuit 468 operates merely to connect the global I/O line pairs and the SRAM bit line pairs SBL to each other in response to the transfer instructing signal $\phi T$.

In the structure shown in FIG. 23, the SRAM sense amplifiers 458 are provided in the data lines 455, but the SRAM array 450 is further provided with SRAM sense amplifiers for each SRAM bit line pair SBL. Also in the DRAM array 400, DRAM sense amplifiers are provided for the DRAM bit line pairs DBL. If there is a difference in the drive power between the DRAM sense amplifier and the SRAM sense amplifier, the data can be transferred in one direction from the DRAM array 400 to the SRAM array 450, or vice versa.

Now, the operation will be briefly described below. The DRAM port and the SRAM port are independent from each other. Therefore, similarly to the conventional DRAM and SRAM, the DRAM port can be accessed by the signals RAS#, CAS# and WE#, and the SRAM port can be accessed by the signals CS# and SWE#. The DRAM data WIO and the SRAM data SIO can be processed independently from each other. According to the structure including the dependently operable DRAM and SRAM ports, data is input and output through the SRAM port in the case where data processing at a high speed is required, e.g., for the image processing, and CPU can access the DRAM port for manipulating data. In parallel to the display of data of SRAM array on an image displaying device (e.g., CRT), the data stored in the DRAM array can be processed. Conversely, CPU can perform intended data processing through the DRAM port in parallel with the operation of writing a video signal, e.g., from a video camera into the SRAM array.

It is necessary to transmit the video data from the SRAM array to the DRAM array or vice versa for manipulating the data. In this case, the data transfer is executed by the data transfer instructing signal DT#. The combination of the states of control signals is similar to that used in the semiconductor memory device shown in FIG. 1. When the control signal DT# attains the active state, the I/O gate (selected for the bit decoder connection shown in FIG. 4A) in the block 406 attains the inoperative state in the DRAM array, and also in the SRAM port, the SRAM I/O gate 456 attains the inoperative state. Thereby, the external access is prohibited in the data transferring operation. The transfer instructing signal øT is generated at the rising edge of the transfer instructing signal DT#, and each switching transistor XFR becomes conductive. In this case, the data is transferred only in one direction depending on the difference in the drive power between the DRAM sense amplifier and the SRAM sense amplifier. Therefore, the transfer control circuit 466 merely generates the data transfer instructing signal in accordance with the transfer instructing signal DT#. Of course, data can be transferred birectionally as in the arrangement of FIG. 1 or 5 or as in a video RAM.

The transfer instructing signal DT# may additionally have a function as the output enable signal OE, and such a structure may be utilized that the data transfer is instructed in accordance with the timing relationship between the signals RAS#, CAS# and DT# and the timing relationship between the CS# and DT#.

FIGS. 24A-24D schematically show the data transfer operation in the semiconductor memory device shown in FIG. 23. The data transfer operation from the DRAM array to the SRAM array will be briefly described with reference to FIG. 24.

In FIG. 24A, one row is selected in the DRAM array. One data block D1 in the selected row is selected in the DRAM array, and data of the data block D1 is connected to the global I/O line pair GIO. Meanwhile, the row is selected in the SRAM array 450.

In FIGS. 24B and 24C, the transfer circuit becomes conductive, and the data block D1 in the DRAM array is transmitted to the SRAM array. After the data block D1 in the DRAM array is deselected, a new data block D2 is selected. Meanwhile, in the SRAM array, the word line for the data block D1 is deselected after the receipt of data block D1, and a new word line is selected. Then, the transfer circuit becomes conductive, and the new data block D2 is transmitted from the DRAM array to the SRAM array.

Referring to FIG. 24D, the new data block D3 is transmitted similarly from the DRAM array to the SRAM array.

In the DRAM array, the data blocks are selected in the high speed mode, and the transfer circuit becomes conductive every time the data block is selected, whereby the data can be transferred from the DRAM array to the SRAM array without providing a data buffer.

FIGS. 25A-25D schematically show the operation of transferring data from the SRAM array to the DRAM array. The data transfer operation will be briefly described with reference to FIGS. 25A-25D. In FIG. 25A, the word line is selected in the SRAM array. In the DRAM array, one of the rows is selected, and the block having a predetermined block size is selected and is connected to the global I/O line.

In FIG. 25B, the transfer circuit becomes conductive, and the data block D1 connected to the selected row in the SRAM array is transmitted to the selected block in the DRAM array.

In FIG. 25C, the column for receiving the next data block is selected in the DRAM array while maintaining the selected row, and similarly, the data block D2 in the SRAM array related to the newly selected SRAM word line is transferred to the DRAM array.

In FIG. 25D, another block in the same row is selected in the DRAM array in accordance with the high speed mode. In the SRAM array, another word line is selected, and the corresponding data block D3 is transferred to the DRAM array through the transfer circuit.

The structure described above is allowed in the case where the drive power of the sense amplifier in the SRAM array is larger than the drive power of the sense amplifier in the DRAM array. Thereby, the data can be transferred from the SRAM array to the DRAM array only by rendering the transfer circuit conductive without providing a buffer circuit. The sense amplifier (for each bit line pair) in the SRAM array may be activated and deactivated in accordance with the data transfer directions, allowing bidirectional data transfer.

According to the structure described above, data can be transferred at a high speed in the dual port RAM structure used for an image processing and others, and the data can be input and output at a high speed through the SRAM port, so that required data blocks can be input and output at a high speed complying with the requirements of the image processing and others.

In addition to the dual port RAM structure shown in FIG. 23, the single port RAM structure (see FIGS. 1 and 5) can transfer a large amount of data at a high speed between the SRAM array and DRAM array, and thus can execute the image data processing and others at a high speed while accessing only the SRAM array. Therefore, the semiconductor memory devices of the embodiments 1 and 2 described before can be used not only for the cache system but also for the image processing purpose.

Further in the embodiments 1, 2 and 3 described above, data is transferred between the DRAM array and SRAM array. In this case, the DRAM array and an EEPROM (electrically writable and erasable memory) may be used, and the data may be transferred between the DRAM array and EEPROM array utilizing the high speed mode of the DRAM array, whereby the data stored in the DRAM array can be saved in the EEPROM array, so that a nonvolatile RAM having a superior data holding performance can be achieved.

EPILOGUE

According to the invention, as described hereinbefore, since data is transferred using the high speed mode of the DRAM, a large amount of data can be transferred at a high speed.

According to the invention of the first aspect, the data transfer between the first memory cell array and the second memory cell array can be performed in such a manner that a row in the first memory cell array is maintained in the selected state and the data can be transferred between the data blocks connected to the selected row and multiple rows in the second memory cell array, so that the data blocks of the arbitrary size can be transferred between the first memory cell array and the second memory cell array without increasing the area occupied by the data transfer circuit.

According to the invention of the second aspect, since the amount of data, which is transferred in the data transfer operation at the time of cache-miss between the high speed memory and the memory of a large storage capacity, is controlled externally, the cache block size of an arbitrary size can be easily achieved without changing the internal structures.

Further, according to the invention of the second aspect, a large amount of data can be transferred from the large storage capacity memory to the high speed memory, and the high speed memory can be always accessed, whereby the memory system capable of processing data at a high speed even in the image processing application can be easily constructed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a first memory cell array including a plurality of first memory cells arranged in a matrix of rows and columns;
   a second memory cell array including a plurality of second memory cells arranged in a matrix of rows and columns;
   first row selecting means for selecting a row in said first memory cell array, said a row selected by said first selecting means including a plurality of data blocks each having first memory cells arranged in multiple columns;
   first column selecting means for selecting a data block in said first memory cell array, said first column selecting means including means for sequentially selecting data blocks in said a row selected by said first row selecting means in a first operation mode;
   second row selecting means for selecting a row in said second memory cell array, said second row selecting means including means for sequentially selecting different rows in said first operation mode; and
   bidirectional data transferring means for transferring data from said first memory cell array to said second memory cell array and from said second memory cell array to said first memory cell array, said bidirectional data transferring means transferring data between the data block included in said a row selected by said first row selecting means and said first column selecting means and said a row selected by said second row selecting means, and including means for sequentially transferring data between the data blocks in said first memory cell array and the different rows in said second memory cell array in said first operation mode.

2. A semiconductor memory device including a memory of a large storage capacity to be accessed at a time of cache-miss, and a high speed memory to be accessed at a time of a cache-hit, said memory of a large storage capacity including a plurality of memory cells arranged in a matrix of rows and columns with each row including a plurality of data blocks each having plural memory cells arranged in multiple columns, said semiconductor memory device comprising:
   bidirectional data transferring means for transferring data from said first memory cell array to said second memory cell array and from said second memory cell array to said first memory cell array, said bidirectional data transferring means transferring data between said memory of the large storage capacity and said high speed memory at a time of said cache-miss; and
   control means for activating said data transferring means at the time of said cache-miss, said control means including means for determining an amount of data to be transferred by said data transferring means in one cache miss cycle in accordance with an externally applied signal, wherein
   said amount of data to be transferred by said data transferring means in once cache miss cycle is greater than one data block and less than all the data blocks on a selected row.

3. A semiconductor memory device, comprising:
   a first memory array including a plurality of first memory cells arranged in rows and columns;
   a second memory array including a plurality of second memory cells arranged in rows and columns;
   first row selecting means responsive to a first address for selecting a row of first memory cells on said first memory array;
   latch means provided for respective columns of said first memory array for amplifying and latching data on associated columns read out from first memory cells on the selected row;
   block selecting means responsive to a second address for selecting a block of columns of said first memory array;
   second selecting means responsive to a third address applied independently of said first address for selecting a block of second memory cells in said second memory array;
   bidirectional transfer means for transferring data from said first memory cell array to said second memory cell array and from said second memory cell array to said first memory cell array, said bidirectional transfer means transferring data between the selected block of columns of said first memory array and the selected block of second memory cells in said second memory array on the units of block; and
   control means responsive to a transfer instructing signal for controlling an operation of transfer of data through said transfer means to allow successive data transfer between different blocks of columns of said first memory array and different blocks of said second memory array while said a row of first memory cells of said first memory array is selected and said latch means is active.

4. A method of operating a semiconductor memory device including a first memory array having a plurality of first memory cells arranged in a matrix of rows and columns and a second memory array having a plurality of second memory cells arranged in a matrix of rows and columns, and having bidirectional data transferring means for transferring data from said first memory cell array to said second memory cell array and from said second memory cell array to said first memory cell array, comprising the steps of:
   (a) selecting a row of first memory cells in said first memory array in response to a first address;

(b) selecting a block of columns of said first memory array in response to a second address;

(c) selecting a block of second memory cells in said second memory array in response to a third address;

(d) transferring data from the block of columns of said first memory array to the block of second memory cells or from the block of second memory cells to the block of columns of said first memory array via said bidirectional data transferring means in response to a transfer instructing signal; and (e) repeating said steps (b), (c) and (d) while maintaining said row of first memory cells in a selected state.

5. The method according to claim 4, wherein said step (c) includes a step of selecting a row of second memory cells as said block.

6. The method according to claim 4, wherein said step (e) is completed when a transfer completion instructing signal is externally applied.

7. A semiconductor memory device, comprising:

a first memory array having a dynamic type memory cells arranged in a matrix of rows and columns;

a second memory array having a static type memory cells arranged in a matrix of rows and columns;

bidirectional data transfer means for transferring data from said first memory cell array to said second memory cell array and from said second memory cell array to said first memory cell array, said bidirectional data transfer means transferring data between a selected block of columns of dynamic type memory cells and a selected block of static type memory cells; and control means for controlling an operation of data transfer through said data transfer means, said control means including means for determining an amount of data to be transferred in accordance with an externally applied signal.

8. The device according to claim 7, wherein said control means includes means for repeatedly activating said data transfer means to allow data transfer between different selected blocks of dynamic type memory cells and different selected of second memory cells until said externally applied signal instructs completion of transfer of data.

9. The device according to claim 7, wherein said block of static type memory cells comprises a row of static type memory cells in said second memory array.

10. The device according to claim 8, wherein said different selected blocks of dynamic type memory cells are arranged on a same common row in said first memory array.

11. The device according to claim 7, wherein the columns of the first memory array comprise a first plurality of bit lines, and the columns of the second memory array comprise a second plurality of bit lines, different from said first plurality.

12. The semiconductor memory device according to claim 1, wherein said first operation mode is entered in response to an one-time activated data transfer instruction signal.

13. The semiconductor memory device according to claim 3, wherein said control means allows said data transfer in a period of one data transfer cycle entered in response to a one-time activation of said transfer instructing signal.

14. The semiconductor memory device according to claim 13, wherein said control means allows transfer of data blocks greater than one block and less than all blocks of said row of said first memory array.

15. The method according to claim 4, wherein said step (e) of repeating is performed in response to an one-time activation of said data transfer instructing signal.

16. The method according to claim 4, wherein said step (e) of repeating includes the step of performing the data transfer of different blocks of said row of said first memory array and blocks of different rows of said second memory array.

17. The semiconductor memory device according to claim 7, wherein said means for determining of said control means determines the amount of data to be transferred in accordance with a one-time activation of said externally applied signal instructing the data transfer.

18. The semiconductor memory device according to claim 16, wherein said data transfer is performed on blocks greater than one block and less than all blocks on a row of the dynamic type memory cells of mid first memory array.

* * * * *